(12) United States Patent
Oshio

(10) Patent No.: US 7,507,354 B2
(45) Date of Patent: *Mar. 24, 2009

(54) PHOSPHOR COMPOSITION AND METHOD FOR PRODUCING THE SAME, AND LIGHT-EMITTING DEVICE USING THE SAME

(75) Inventor: Shozo Oshio, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/891,386

(22) Filed: Aug. 10, 2007

(65) Prior Publication Data

US 2008/0128654 A1 Jun. 5, 2008

Related U.S. Application Data

(63) Continuation of application No. 11/568,149, filed as application No. PCT/JP2005/008395 on Apr. 26, 2005.

(30) Foreign Application Priority Data

| Apr. 27, 2004 | (JP) | ............................ 2004-131770 |
| Jun. 21, 2004 | (JP) | ............................ 2004-182797 |
| Jun. 30, 2004 | (JP) | ............................ 2004-194196 |
| Aug. 30, 2004 | (JP) | ............................ 2004-250739 |
| Dec. 15, 2004 | (JP) | ............................ 2004-363534 |

(51) Int. Cl.
- *H01L 33/00* (2006.01)
- *C09K 11/59* (2006.01)
- *C09K 11/64* (2006.01)
- *C09K 11/55* (2006.01)

(52) U.S. Cl. .............................. 252/301.4 F; 313/503; 313/467; 313/486; 313/582; 313/584; 257/98; 428/690; 428/917

(58) Field of Classification Search ............ 252/301.4 F; 313/503, 467, 486, 582, 584; 257/98; 428/690, 428/917

See application file for complete search history.

(56) References Cited

U.S. PATENT DOCUMENTS 5,998,925 A 12/1999 Shimizu et al.

(Continued)

FOREIGN PATENT DOCUMENTS

EP 1 630 220 3/2006

(Continued)

OTHER PUBLICATIONS

Sakuma, et al., "Warm-white light-emitting diode with yellowish orange SiAlON ceramic phosphor" Optics Letters, vol. 29, No. 17, pp. 2001-2003, Sep. 1, 2004.

(Continued)

*Primary Examiner*—C. Melissa Koslow
(74) *Attorney, Agent, or Firm*—Hamre, Schumann, Mueller & Larson, P.C.

(57) ABSTRACT

A phosphor composition that contains a phosphor host having as a main component a composition represented by a composition formula: $MAlSiN_3$, where "M" is Sr or Sr in combination with at least one element selected from the group consisting of Mg, Ca, Ba, and Zn, in which Sr is a main component. The phosphor composition is activated by replacing a part of the M in the phosphor host composition with $Eu^{2+}$. This enables a light-emitting device emitting white light and satisfying both a high color rendering property and a high luminous flux to be provided.

10 Claims, 34 Drawing Sheets

U.S. PATENT DOCUMENTS

| | | | |
|---|---|---|---|
| 6,717,353 | B1 | 4/2004 | Mueller et al. |
| 7,023,019 | B2 | 4/2006 | Maeda et al. |
| 7,250,715 | B2 | 7/2007 | Mueller et al. |
| 7,391,060 | B2 | 6/2008 | Oshio |
| 2002/0105269 | A1 | 8/2002 | Ellens et al. |
| 2003/0006469 | A1 | 1/2003 | Ellens et al. |
| 2003/0030038 | A1 | 2/2003 | Mitomo et al. |
| 2003/0030368 | A1 | 2/2003 | Ellens et al. |
| 2003/0052595 | A1 | 3/2003 | Ellens et al. |
| 2003/0094893 | A1 | 5/2003 | Ellens et al. |
| 2003/0146690 | A1 | 8/2003 | Ellens et al. |
| 2004/0090174 | A1 | 5/2004 | Tasch et al. |
| 2004/0124758 | A1 | 7/2004 | Danielson et al. |
| 2004/0135504 | A1 | 7/2004 | Tamaki et al. |
| 2004/0245532 | A1 | 12/2004 | Maeda et al. |
| 2005/0104503 | A1 | 5/2005 | Ellens et al. |
| 2005/0189863 | A1 * | 9/2005 | Nagatomi et al. ........... 313/486 |
| 2006/0038477 | A1 | 2/2006 | Tamaki et al. |
| 2006/0103291 | A1 | 5/2006 | Ellens et al. |
| 2006/0124947 | A1 | 6/2006 | Mueller et al. |
| 2007/0007494 | A1 * | 1/2007 | Hirosaki et al. ....... 252/301.4 R |
| 2007/0259206 | A1 | 11/2007 | Oshio |
| 2008/0089825 | A1 | 4/2008 | Tamaki et al. |

FOREIGN PATENT DOCUMENTS

| | | |
|---|---|---|
| EP | 1 696 016 | 8/2006 |
| JP | 10-172459 | 6/1998 |
| JP | 2003-110150 | 4/2003 |
| JP | 2003-277746 | 10/2003 |
| JP | 2005-235934 | 9/2005 |
| JP | 2005-255895 | 9/2005 |
| JP | 2006-8721 | 1/2006 |
| JP | 2006-16413 | 1/2006 |
| JP | 2006-19419 | 1/2006 |
| KR | 1998-046311 | 9/1998 |
| KR | 2003-7742 | 1/2003 |
| WO | 01/39574 | 6/2001 |
| WO | 01/40403 | 6/2001 |
| WO | 03/080763 | 10/2003 |
| WO | WO 03/080763 A1 * | 10/2003 |
| WO | 2004/029177 | 4/2004 |
| WO | 2005/022030 | 3/2005 |
| WO | 2007/131195 | 11/2007 |

OTHER PUBLICATIONS

Hirosaki, et al., "Characterization and properties of green-emitting β-SiAION: $Eu^{2+}$ powder phosphors for white light-emitting diodes", Applied Physics Letters, vol. 86, pp. 211905-1-211905-3, 2005.

Xie, et al., "Strong Green Emission from α-SiAION Activated by Divalent Ytterbium under Blue Light Irradiation", J. Phys. Chem. B 2005, 109, 9490-9494.

Sakuma, et al., "White Light-Emitting Diode Lamps Using Oxynitride and Nitride Phosphor Materials" IEICE Trans. Electron., vol. E88-C, No. 11, 2057-2064, Nov. 2005.

Uheda, et al., "Luminescence Properties of a Red Phosphor, $CaAlSiN_3:Eu^{2+}$, for White Light Emitting Diodes", Electromechanical and Solid-state Letters, vol. 9, No. 4, pp. H22-H25, 2006.

Xie, et al., "$Eu^{2+}$-doped Ca-α-SiAION: A yellow phosphor for white light-emitting diodes", Applied Physics Letters, vol. 84, No. 26, Jun. 28, 2004, pp. 5404-5406.

Xie, et al., "Photoluminescence of Cerium-Doped α-SiAION Materials", J. Am. Ceram Soc., vol. 87, No. 7, 2004, pp. 1368-1370.

Xie, et al., "Preparation of Ca-α-Sialon Ceramics with compositions along the $Si_3N_4$-$1/2Ca_3N_2$: 3 AlN Line", Zeitschrift Fur Metallkunde, vol. 92, No. 8, Aug. 2001, pp. 931-936.

Fang, et al., First-principles calculations of the stability and local structure of α-sialon ceramics on the line $Si_3N_4$-$1/2Ca_3N_2$3AlN.

Lee, et al., "Photoluminescence and Electroluminescence Characteristics of $CaSiN_2$: Eu Phosphor", Proceedings of SPIE-the International Society for Optical Engineering, vol. 3241, 1997, pp. 75-83.

Ohkubo et al., "Absolute Fluorescent Quantum Efficiency of NBS Phosphor Standard Samples", J. Illum. Engng. Inst. Jpn., vol. 83, No. 2, 1999, pp. 87-93.

Uheda, et al., "Temperature dependence of the red phosphor, $CaSiN_2:Eu^{2+}$", Abstracts of $71^{st}$ Meetings of the Japan Society of Electrochemistry, p. 75, 2004.

Uheda, et al., "The Crystal Structure and Photoluminescence Properties of a New Red Phosphor, Calcium Aluminum Silicon Nitride Doped with Divalent Europium", Abs. 2073, $206^{th}$ Meeting, 2004.

The $65^{th}$ Fall Meeting (2004) of the Japan Society of Applied Physics Conference Proceedings (Sep. 2004 at Tohoku Gakuin University).

* cited by examiner

US 7,507,354 B2

PHOSPHOR COMPOSITION AND METHOD FOR PRODUCING THE SAME, AND LIGHT-EMITTING DEVICE USING THE SAME

CROSS REFERENCE TO RELATED APPLICATIONS

This application is a Continuation of application Ser. No. 11/568,149, filed Oct. 20, 2006, which is a U.S. National Stage application of International Application No. PCT/JP2005/008395, filed Apr. 26, 2005, which applications are incorporated herein by reference.

TECHNICAL FIELD

The present invention relates to a novel phosphor composition applicable to various kinds of light-emitting devices such as a white light-emitting diode (hereinafter, referred to as a "white LED"). In particular, the present invention relates to a phosphor composition that is excited with near-ultraviolet light, violet light, or blue light to emit light in a warm color such as orange or red and a method for producing the phosphor composition, and a light-emitting device using the phosphor composition.

BACKGROUND ART

Conventionally, for example, the following nitride phosphors have been known. These nitride phosphors can be excited with ultraviolet light—near-ultraviolet light—violet light—blue light, and emit visible light in a warm color having an emission peak in a wavelength range of 580 nm to less than 660 nm. Therefore, these nitride phosphors also have been known to be suitable for a light-emitting device such as a white LED light source.

(1) $M_2Si_5N_8:Eu^{2+}$ (see JP 2003-515665 A)
(2) $MSi_7N_{10}:Eu^{2+}$ (see JP 2003-515665 A)
(3) $M_2Si_5N_8:Ce^{3+}$ (see JP 2002-322474 A)
(4) $Ca_{1.5}Al_3Si_9N_{16}:Ce^{3+}$ (see JP 2003-203504 A)
(5) $Ca_{1.5}Al_3Si_9N_{16}:Eu^{2+}$ (see JP 2003-124527 A)
(6) $CaAl_2Si_{10}N_{16}:Eu^{2+}$ (see JP 2003-124527 A)
(7) $Sr_{1.5}Al_3Si_{19}N_{16}:Eu^{2+}$ (see JP 2003-124527 A)
(8) $MSi_3N_5:Eu^{2+}$ (see JP 2003-206481 A)
(9) $M_2Si_4N_7:Eu^{2+}$ (see JP 2003-206481 A)
(10) $CaSi_6AlON_9:Eu^{2+}$ (see JP 2003-206481 A)
(11) $Sr_2Si_4AlON_7:Eu^{2+}$ (see JP 2003-206481 A)
(12) $CaSiN_2:Eu^{2+}$ (see S. S. Lee, S. Lim, S. S. Sun and J. F. Wager, Proceedings of SPIE—the International Society for Optical Engineering, Vol. 3241 (1997), pp. 75-83)

In the above phosphors, "M" represents at least one alkaline-earth metal element (Ng, Ca, Sr, Ba), or zinc (Zn).

Conventionally, such nitride phosphors have been produced mainly by the following production method: a nitride of the element "M" or metal, and a nitride of silicon and/or a nitride of aluminum are used as materials for a phosphor host, and they are allowed to react with a compound containing an element that forms a luminescent center ion in a nitriding gas atmosphere. Furthermore, a conventional light-emitting device has been configured using such a nitride phosphor.

However, because the request for the above-mentioned light-emitting device is being diversified year after year, there is a demand for a novel phosphor different from the above-mentioned conventional nitride phosphor. In particular, there is a great demand for a light-emitting device containing a large amount of the above-mentioned light-emitting component in a warm color, above all, a red light-emitting component, and there is a strong demand for the development of such a light-emitting device. However, actually, only a small number of phosphor ingredients are available, so that there is a need for developing a novel phosphor ingredient and a novel light-emitting device containing a large amount of light-emitting component in a warm color.

Furthermore, according to the conventional method for producing a nitride phosphor, it is difficult to obtain and produce a high-purity material, and a nitride phosphor is produced using, as a main material, a nitride of alkaline-earth metal, alkaline-earth metal, or the like, which is difficult to handle in the atmosphere due to its chemical instability. Therefore, it is difficult to mass-produce a high-purity phosphor, reducing the production yield, which increases the cost of a phosphor.

Furthermore, in the conventional light-emitting device, there is only a small number of kinds of applicable phosphor ingredients. Therefore, there is no room for selecting a material, and a manufacturer that supplies a phosphor is limited. Consequently, a light-emitting device becomes expensive. Furthermore, there is a small number of kinds of inexpensive light-emitting devices with a high emission intensity of a light-emitting component in a warm color (in particular, red) and with a large special color rendering index R9.

The present invention has been achieved in order to solve the above-mentioned problems, and its object is to provide a novel phosphor composition capable of emitting light in a warm color, in particular, a phosphor composition emitting red light. Another object of the present invention is to provide a method for producing a phosphor composition that can be produced at a low cost, suitable for mass-production of the nitride phosphor composition according to the present invention. Still another object of the present invention is to provide an inexpensive light-emitting device with a high emission intensity of a light-emitting component in a warm color (in particular, red) and with a large special color rendering index R9.

Regarding the technique of measuring the internal quantum efficiency and the external quantum efficiency of a phosphor according to the present invention, a technique capable of conducting measurement with high precision already has been established. Regarding a part of phosphors for a fluorescent lamp, absolute values of the internal quantum efficiency and the external quantum efficiency under the irradiation of light (excitation with ultraviolet light of 254 nm) with a particular excitation wavelength are known (e.g., see "Publication of Illuminating Engineering Institute of Japan" by Kazuaki Ohkubo et al., 1999, Vol. 83, No. 2, p. 87).

DISCLOSURE OF INVENTION

The present invention is directed to a phosphor composition containing a phosphor host having as a main component a composition represented by a composition formula: $aM_3N_2 \cdot bAlN_2 \cdot cSi_3N_4$, where the "M" is at least one element selected from the group consisting of Mg, Ca, Sr, Ba, and Zn, and "a", "b", and "c" are numerical values respectively satisfying $0.2 \leq a/(a+b) \leq 0.95$, $0.05 \leq b/(b+c) \leq 0.8$, and $0.4 \leq c/(c+a) \leq 0.95$.

Furthermore, the present invention is directed to a light-emitting device configured using the above-mentioned phosphor composition as a light-emitting source.

Furthermore, the present invention is directed to a method for producing the above-mentioned phosphor composition including allowing a material, which contains a compound capable of generating an oxide of at least one element selected from the group consisting of Mg, Ca, Sr, Ba, and Zn by heating, a silicon compound, an aluminum compound, a compound containing an element forming a luminescent center ion, and carbon, to react in a nitriding gas atmosphere.

Furthermore, the present invention is directed to a light-emitting device including a phosphor layer containing a nitride phosphor and a light-emitting element, the light-emitting element having an emission peak in a wavelength range of 360 nm to less than 500 nm, the nitride phosphor being excited with light emitted by the light-emitting element to emit light, and the light-emitting device containing at least light-emitting component light emitted by the nitride phosphor as output light. The nitride phosphor is activated with $Eu^{2+}$ and is represented by a composition formula: $(M_{1-x}Eu_x)AlSiN_3$, and the "M" is at least one element selected from the group consisting of Mg, Ca, Sr, Ba, and Zn, and the "x" is a numerical value satisfying $0.005 \leqq x \leqq 0.3$.

Furthermore, the present invention is directed to a light-emitting device including a phosphor layer containing a phosphor and a light-emitting element, the light-emitting element having an emission peak in a wavelength range of 360 nm to less than 500 nm, the phosphor being excited with light emitted by the light-emitting element to emit light, and the light-emitting device containing at least light-emitting component light emitted by the phosphor as output light. The phosphor is activated with $Eu^{2+}$ and contains a nitride phosphor or an oxynitride phosphor having an emission peak in a wavelength range of 600 nm to less than 660 nm, and an alkaline-earth metal orthosilicate phosphor activated with $Eu^{2+}$ and having an emission peak in a wavelength range of 500 nm to less than 600 nm. An internal quantum efficiency of the phosphor is at least 80% under the excitation with light emitted by the light-emitting element.

BEST MODE FOR CARRYING OUT THE INVENTION

Figure 1:
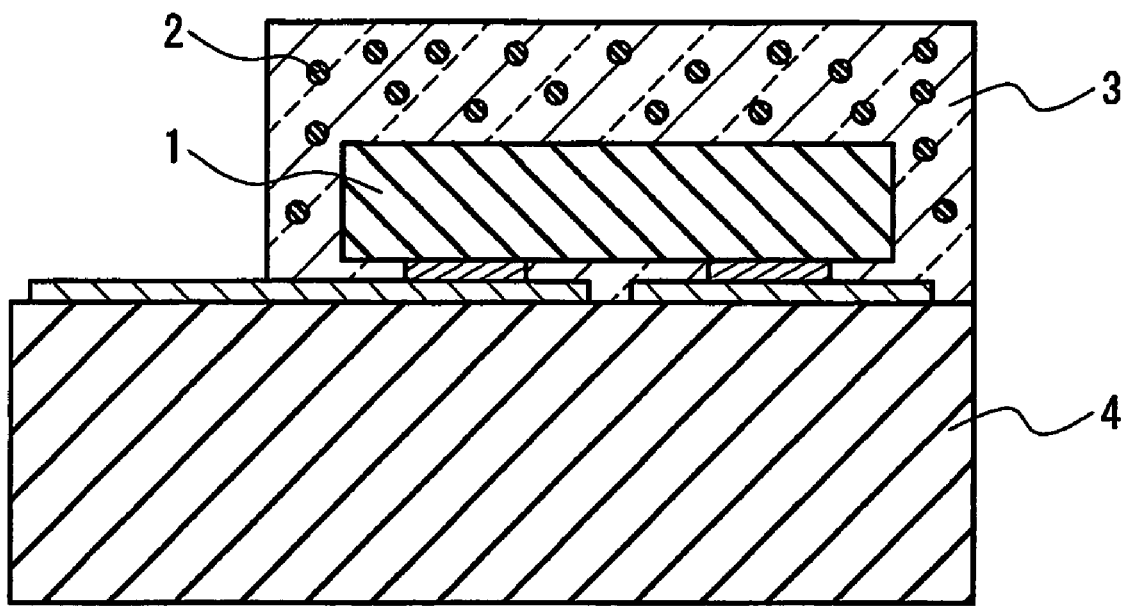
FIG. 1 is a cross-sectional view of a semiconductor light-emitting device in an embodiment of the present invention.

Hereinafter, the present invention will be described by way of embodiments.

Embodiment 1

First, an embodiment of a phosphor composition of the present invention will be described. An example of the phosphor composition of the present invention contains a phosphor host and a luminescent center ion, and contains, as a main component of the phosphor host, a composition represented by a composition formula: $aM_3N_2 \cdot bAlN \cdot cSi_3N_4$, where "M" is at least one element selected from the group consisting of Mg, Ca, Sr, Ba, and Zn, and "a", "b", and "c" are numerical values respectively satisfying $0.2 \leq a/(a+b) \leq 0.95$, $0.05 \leq b/(b+c) \leq 0.8$, $0.4 \leq c/(c+a) \leq 0.95$. When such a composition is used as the phosphor host, for example, in the case where an $Eu^{2+}$ ion are added as a luminescent center, the phosphor composition becomes a phosphor that is excited with ultraviolet light, near-ultraviolet light, violet light, or blue light to emit light in a warm color such as orange or red.

Herein, containing a composition as a main component refers to containing a composition in an amount exceeding 50% by weight, preferably at least 75% by weight, and more preferably at least 85% by weight.

The above-mentioned "a", "b", and "c", which are preferable in terms of the emission efficiency and the color tone of emitted light, are numerical values satisfying $0.2 \leq a/(a+b) \leq 0.6$, $0.3 \leq b/(b+c) \leq 0.8$, $0.4 \leq c/(c+a) \leq 0.8$, more preferably $0.2 \leq a/(a+b) \leq 0.3$, $0.6 \leq b/(+c) \leq 0.8$, $0.4 \leq c/(c+a) \leq 0.6$.

The above-mentioned phosphor host may be a composition represented by a composition formula: $MAlSiN_3$.

Another example of the phosphor host of the present invention does not contain a composition represented by a composition formula: $M_2Si_5N_8$, $MSi_7N_{10}$, $M_{1.5}Al_3Si_9N_{16}$, $MAl_2Si_{10}N_{16}$, $MSi_3N_5$, $M_2Si_4N_7$, $MSi_6AlON_9$, $M_2Si_4AlON_7$, or $MSiN_2$, and is generated by firing a mixed material, in which at least one nitride selected from a nitride of alkaline-earth metal and a nitride of zinc, europium oxide, silicon nitride, and a nitride of aluminum are mixed in a molar ratio of $2(1-x):3x:2:6$ ($2 \leq x \leq 0.1$), in nitrogen-hydrogen mixed gas at 1600° C. for 2 hours.

The element "M", which is preferable in terms of the emission efficiency and the color tone of emitted light, is at least one element selected from Ca and Sr, and the main component of the element "M" preferably is Ca or Sr for the purpose of obtaining a phosphor emitting red light with satisfactory purity. The element "M" also may be configured as a mixture of at least two elements among the above-mentioned group of elements.

Setting the main component of the element "M" to be Ca or Sr refers to setting a large majority, preferably, at least 80 atomic % of the element "M" to be Ca or Sr. Furthermore, the composition preferable in terms of the material management and production is the one in which all the elements "M" are set to be one element among the above-mentioned group of elements, for example, all the elements "M" are set to be Ca or Sr.

Furthermore, it is preferable that the composition represented by the above-mentioned composition formula: $MAlSiN_3$ contains a compound represented by the above-mentioned chemical formula: $MAlSiN_3$, and it is more preferable that the composition contains the above-mentioned compound as a main component. Although it is preferable that the phosphor composition of the present embodiment does not contain impurity, the phosphor composition may contain, for example, at least one of a metal impurity element and a gasifiable impurity element in an amount corresponding to less than 10 atomic % with respect to at least one of the elements "M", Al, Si, and N. Furthermore, in the case where the composition is a compound represented by the above-mentioned chemical formula: $MAlSiN_3$, even if there is an excess or deficiency in Al, Si, or N in the above-mentioned chemical formula: $MAlSiN_3$ in a range not exceeding 10 atomic %, the phosphor host only needs to contain, as a main component, a compound represented by the chemical formula: $MAlSiN_3$. More specifically, for the purpose of slightly improving the emission performance of a phosphor, a trace amount or small amount of impurity can be added, or a composition slightly shifted from a stoichiometric composition can be used.

For example, in order to slightly improve the emission performance, in the phosphor composition of the present embodiment, a part of Si also can be replaced by at least one element such as Ge or Ti capable of taking a quadrivalent state, and a part of Al also can be replaced by at least one element such as B, Ga, In, Sc, Y, Fe, Cr, Ti, Zr, Hf, V, Nb, or Ta capable of taking a trivalent state. Herein, "a part" refers to that the atomic number with respect to Si or Al is less than 30 atomic %, for example.

The substantial composition range of the above-mentioned composition is presented by $MAl_{1\pm0.3}Si_{1\pm0.3}N_{3(1\pm0.3)}O_{0-0.3}$, preferably $MAl_{1\pm0.1}Si_{1\pm0.1}N_{3(1\pm0.1)}O_{0-0.1}$.

Furthermore, it is preferable that the above-mentioned composition is represented by, in particular, a composition formula or a chemical formula: $SrAlSiN_3$ or $CaAlSiN_3$. For example, the composition may have a plurality of alkaline-earth metal elements, such as $(Sr, Ca)AlSiN_3$, $(Sr, Mg)AlSiN_3$, $(Ca, Mg)AlSiN_3$, or $(Sr, Ca, Ba)AlSiN_3$. In the above composition formula, O (oxygen) is an impurity element that enters a phosphor composition in the course of production thereof.

A phosphor composition is configured by adding at least one of ions to be a luminescent center Luminescent center ion) to the crystal lattice of a compound constituting the phosphor host. When a luminescent center ion is added to the phosphor host, a phosphor emitting fluorescence is obtained.

As the luminescent center ion, a metal ion can be appropriately selected from various kinds of rare-earth ions and transition metal ions. Specific examples of the luminescent center ion include trivalent rare-earth metal ions such as $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, and $Yb^{3+}$; divalent rare-earth metal ions such as $Sm^{2+}$, $Eu^{2+}$, and $Yb^{2+}$; divalent rare-earth metal ions such as $Mn^{2+}$, trivalent transition metal ions such as $Cr^{3+}$ and $Fe^{3+}$; and quadrivalent transition metal ions such as $Mn^{4+}$.

In the phosphor composition of the present embodiment, it is preferable, in terms of the emission efficiency, that the luminescent center ion is at least one ion selected from $Ce^{3+}$ and $Eu^{2+}$. Furthermore, when a phosphor contains such an ion, the phosphor becomes preferable for a white LED. When the luminescent center ion is $Eu^{2+}$, a phosphor emitting light in a warm color can be obtained, which is preferable for a light-emitting device, in particular, an illumination device. When the luminescent center ion is $Ce^{3+}$, is, a phosphor emitting blue-green light can be obtained, which is preferable for a light-emitting device with a high color rendering property, in particular, an illumination device.

In the phosphor composition of the present embodiment, it is preferable, in terms of the emission color, that the luminescent center ion is at least one ion selected from the group consisting of $Ce^{3+}$, $Eu^{2+}$, $Eu^{3+}$, and $Tb^{3+}$. When the luminescent center ion is $Ce^{3+}$, a phosphor with a high efficiency emitting at least blue-green light can be obtained. When the luminescent center ion is $Eu^{2+}$, a phosphor with a high efficiency emitting orange to red light can be obtained. When the luminescent center ion is $Eu^{3+}$, a phosphor with a high efficiency emitting red light can be obtained. When the luminescent center ion is $Tb^{8+}$, a phosphor with a high efficiency emitting green light can be obtained. Any of the phosphors emit any light of red, green, or blue with a high color purity to be three primary colors, or orange that is highly demanded, so that a phosphor preferable for a light-emitting device is obtained.

The preferable addition amount of the luminescent center ion varies depending upon the kind of the luminescent center ion. For example, in the case where the luminescent center ion is $Eu^{2+}$ or $Ce^{3+}$, the preferable addition amount of the luminescent center ion is 0.1 atomic % to 30 atomic %, preferably 0.5 atomic % to 10 atomic % with respect to the above-mentioned element "M". When the addition amount is larger or smaller than the above range, a phosphor is not obtained that satisfies both the satisfactory emission color and the high luminance. Basically, it is preferable that the luminescent center ion is added so as to replace a part of a lattice position of the element "M". However, the luminescent center ion also may be added so as to replace a part of any lattice position of Al and Si.

The phosphor composition of the present embodiment also can be a phosphor with a plurality of luminescent center ions coactivated. Examples of a phosphor with luminescent center ions coactivated include a phosphor with a $Ce^{3+}$ ion and an $Eu^{2+}$ ion coactivated, a phosphor with an $Eu^{2+}$ ion and a $Dy^{3+}$ ion coactivated, a phosphor with an $Eu^{2+}$ ion and a $Nd^{3+}$ ion coactivated, a phosphor with a $Ce^{3+}$ ion and a $Mn^{2+}$ ion coactivated, and a phosphor with an $Eu^{2+}$ ion and a $Mn^{2+}$ ion coactivated. Thus, a phosphor with the shapes of an excitation spectrum and an emission spectrum regulated may be obtained, using a phenomenon in which energy shifts from one luminescent center ion to another ion, and a long-persistence phosphor with long persistence may be obtained, using an excitation phenomenon caused by heat.

Phosphors preferable for a light-emitting device according to the present invention will be described below. Such phosphors can be obtained by varying the numerical values of the above-mentioned "a", "b", and "c", the elements occupying the element "M", and the kind and addition amount of the luminescent center ion.

(1) A phosphor emitting light in a warm color, in particular, red light having an emission peak in a wavelength range of 580 nm to less than 660 nm, preferably 610 nm to 650 nm in terms of the color purity and spectral luminous efficacy required for a light-emitting device.

(2) A phosphor capable of being excited with the irradiation of near-ultraviolet light or ultraviolet light having an emission peak in a wavelength range of 350 nm to less than 420 nm, preferably 380 nm to less than 410 nm in terms of the excitation characteristics required for a light-emitting device.

(3) A phosphor capable of being excited with the irradiation of blue light having an emission peak in a wavelength range of 420 nm to less than 500 nm, preferably 440 nm to less than 480 nm in terms of the excitation characteristics required for a light-emitting device.

(4) A phosphor capable of being excited with the irradiation of green light having an emission peak in a wavelength range of 500 nm to less than 560 nm.

There is no particular limit on the property of the phosphor composition of the present embodiment. The phosphor composition may be a single crystal bulk, a ceramics molding, a thin film having a thickness of several nm to several μm, a thick film having a thickness of several 10 μm to several 100 μm, or powder. For the purpose of applying the phosphor composition to a light-emitting device, the phosphor composition preferably is powder, more preferably powder with a center particle diameter ($D_{50}$) of 0.1 μm to 30 μm, and most preferably powder with a center particle diameter ($D_{50}$) of 0.5 μm to 20 μm. There is no particular lit to the shape of a particle of the phosphor composition, and the particle may be any of a spherical shape, a plate shape, a bar shape, and the like.

The phosphor composition of the present embodiment that can be produced as described above is capable of being excited with at least ultraviolet light—near-ultraviolet light—violet light—blue light—green light—yellow light—orange light of 250 nm to 600 nm, and at least becomes a phosphor emitting blue-green, orange, or red light. A phosphor emitting red light having an emission peak in a wavelength range of 610 nm to 650 nm also can be obtained. The shapes of the excitation spectrum and the emission spectrum of a phosphor that contains an $Eu^{2+}$ ion as a luminescent center and emits red light are relatively similar to those of the conventional phosphor activated with $Eu^{2+}$ containing, as a material for a base, $Sr_2Si_5N_8$ nitridosilicate.

Next, a method for producing a phosphor composition of the present embodiment will be described.

Production Method 1 of the Present Invention

The phosphor composition of the present embodiment can be produced, for example, by the production method described below.

First; as a material for forming a phosphor host, a nitride of alkaline-earth metal M ($M_3N_2$) or a nitride of zinc ($Zn_3N_2$), silicon nitride ($Si_3N_4$), and aluminum nitride (AlN) are prepared. The nitride of alkaline-earth metal and the nitride of zinc are not those which are usually used as ceramic materials, but are those which are difficult to obtain and expensive, and are difficult to handle in the atmosphere since they easily react with water vapor in the atmosphere.

Furthermore, as a material for adding a luminescent center ion, various kinds of rare-earth metals, transition metals, or compounds thereof are used. Such elements include lanthanide and transition metal with an atomic number of 58 to 60, or 62 to 71, in particular, Ce, Pr, Eu, Tb, and Mn. Examples of a compound containing such elements include an oxides, a nitride, a hydroxide, a carbonate, an oxalate, a nitrate, a sulfate, a halide, and a phosphate of the above-mentioned lanthanide and transition metal. Specific examples include cerium carbonate, europium oxide, europium nitride, metallic terbium, and manganese carbonate.

Next, these phosphor ingredients are weighed and mixed so that the atomic ratio of the respective atoms becomes $a(M_{1-x}Lc_x)_3N_2 \cdot bAlN \cdot cSi_3N_4$, whereby a mixed material is obtained. Herein, "M" is at least one element selected from the group consisting of Mg, Ca, Sr, Ba, and Zn; "a", "b", and "c" are numerical values satisfying $0.2 \leq a/(a+b) \leq 0.95$, $0.05 \leq b/(b+c) \leq 0.8$, and $0.4 \leq c/(c+a) \leq 0.95$; Lc represents an element to be a luminescent center ion; "x" represents a numerical value satisfying $0 \leq x \leq 0.3$, preferably $0.001 \leq x \leq 0.2$, and more preferably $0.005 \leq x \leq 0.1$. For example, the atomic ratio is assumed to be $M_{1-x}Lc_xAlSiN_3$.

Then, the mixed material is fired in any atmosphere of a vacuum atmosphere, a neutral atmosphere (inactive gas, nitrogen gas, etc.), and a reducing atmosphere (CO, nitrogen-hydrogen mixed gas, etc.).

As the above-mentioned atmosphere, a normal-pressure atmosphere is preferable for the reason that simple facility can be used. However, any of a high-pressure atmosphere, a compressed atmosphere, a reduced-pressure atmosphere, and a vacuum atmosphere may be used. The preferable reaction atmosphere for the purpose of enhancing the performance of a phosphor is a high-pressure atmosphere mainly containing nitrogen gas of, for example, 2 to 100 atm pressure, preferably 5 to 20 atm pressure in view of the handling of the atmosphere. With such a high-pressure atmosphere, the decomposition of a nitride phosphor composition, which occurs during firing at high temperature, can be prevented or suppressed, and the shift of the composition of a phosphor composition is suppressed, whereby a phosphor composition with high exhibition performance can be produced.

Furthermore, the preferable atmosphere for the purpose of generating a large amount of ions such as $Ce^{3+}$, $Eu^{2+}$, $Tb^{3+}$, or $Mn^{2+}$, as a luminescent center ion, is a reducing atmosphere. The firing temperature is, for example, 1,300° C. to 2,000° C., preferably 1,600° C. to 2,000° C. and more preferably 1,700° C. to 1,900° C. for the purpose of enhancing the performance of a phosphor. On the other hand, for the purpose of mass-production, the firing temperature is preferably 1,400° C. to 1,800° C., more preferably 1,600° C. to 1,700° C. The ring time is, for example, 30 minutes to 100 hours, preferably 2 to 8 hours in view of the productivity. Fixing may be performed in different atmospheres, or may be performed several times in the same atmosphere. The fired body obtained by such firing becomes a phosphor composition.

The phosphor composition of the present embodiment is not limited to those that are produced by the above production method. The phosphor composition of the present embodiment also can be produced by a production method using, for example, a vapor phase reaction or a liquid phase reaction, as well as the above-described solid phase reaction.

It is difficult to obtain a nitride such as $Si_3N_4$ or AlN with a high purity, although not comparable to the case of a nitride of alkaline-earth metal. In most cases, the above-mentioned $Si_3N_4$ or AlN is partially oxidized in the atmosphere to contain $SiO_2$ or $Al_2O_3$ and slightly decrease the purity thereof. For this reason, the phosphor composition of the present embodiment may be the one substantially having a composition with the above-mentioned desired atomic ratio, and in the above-mentioned composition formula: $MAlSiN_3$, a part of $Si_3N_4$ or AlN may be oxidized to some degree to contain a composition modified to $SiO_2$ or $Al_2O_3$.

Production Method 2 of the Present Invention

The phosphor composition of the present embodiment can be produced, for example, by the production method described below.

The production method 2 of the present invention is a method for producing a phosphor composition containing, as a main component of a phosphor host, a composition represented by the above-mentioned composition formula; $aM_3N_2 \cdot bAlN \cdot cSi_3N_4$, in particular, $MAlSiN_3$. The method includes allowing a material, which contains a compound capable of generating an oxide of at least one element "M" selected from the group consisting of Mg, Ca, Sr, Ba, and Zn by heating, a silicon compound, an aluminum compound, a compound containing an element forming a luminescent center ion, and carbon, to react in a nitriding gas atmosphere.

According to an example of the production method 2 of the present invention, while an alkaline-earth metal compound or a zinc compound capable of generating a metal oxide MO (where "M" is Mg, Ca, Sr, Ba, or Zn) by heating, preferably an alkaline-earth metal compound capable of generating CaO or SrO by heating, is reduced and nitrided by the reaction with carbon in a nitriding gas atmosphere, the alkaline-earth metal compound or the zinc compound is reacted with a silicon compound, an aluminum compound, and a compound containing an element forming a luminescent center ion.

The production method 2 of the present invention is a method for producing the above-mentioned $a(M_{1-x}Lc_x)_3N_2 \cdot bAlN \cdot cSi_3N_4$, in particular, a $M_{1-x}Lc_xAlSiN_3$ phosphor, which may be called a reducing and nitriding method, and in particular a production method suitable for industrial production of a powder-shaped phosphor composition.

Hereinafter, the production method 2 of the present invention will be described in detail.

First, as a material for forming a phosphor host, a compound capable of generating an oxide of the above-mentioned element 'W' by heating, a silicon compound, and an aluminum compound are prepared. The compound (described later) capable of generating an oxide of the above-mentioned element "M" by heating may be the one which is usually used as a ceramics material. Such a material is easily obtained and inexpensive, and is stable in the atmosphere, so that it is easy to handle in the atmosphere.

Furthermore, as a material for adding a luminescent center ion, the above-mentioned various kinds of rare-earth metals, transition metal, or compounds thereof are prepared. In addition, as a reducing agent, carbon is prepared.

Next, these phosphor ingredients and the reducing agent are weighed and mixed so that the atomic ratio of the respective metal atoms becomes, for example, $a(M_{1-x}Lc_x)_3N_2 \cdot bAlN \cdot cSi_3N_4$, carbon monoxide gas (CO) is generated by the reaction with carbon (reducing agent), and oxygen in the phosphor ingredient is removed completely, whereby a mixed material is obtained. Herein, Lc represents a metal element to be a luminescent center ion, and "x" represents a numerical value satisfying $0<x<0.3$, preferably $0.001 \leq x \leq 0.2$, and more preferably $0.005 \leq x \leq 0.1$.

Then, the mixed material is reacted by firing in a nitriding gas atmosphere. Herein, the nitriding gas refers to gas capable of effecting a nitriding reaction.

Furthermore, the preferable atmosphere for the purpose of generating a large amount of ions such as $Ce^{3+}$, $Eu^{2+}$, $Tb^{3+}$, or $Mn^{2+}$, as a luminescent center ion, is a reducing atmosphere. The mixed material is fired, for example, in a nitrogen-hydrogen mixed atmosphere. The firing temperature is, for example, 1,300° C. to 2,000° C., and preferably 1,600° C. to 2,000° C. and more preferably 1,700° C. to 1,900° C. for the purpose of enhancing the performance of a phosphor. On the other hand, for the purpose of mass-production, the firing temperature is preferably 1,400° C. to 1,800° C., more preferably 1,600° C. to 1,700° C. The firing time is, for example, 30 minutes to 100 hours, preferably 2 to 8 hours in view of the productivity. Firing may be performed in different atmospheres, or may be performed several times in the same atmosphere. The fired body obtained by such ring becomes a phosphor composition.

The compound capable of generating an oxide MO of the above-mentioned element "M" by heating is not particularly limited. However, in terms of the ease of availability of a high-purity compound, the ease of handling in the atmosphere, cost, and the like, the compound is preferably at least one alkaline-earth metal compound or zinc compound selected from the group consisting of a carbonate, an oxalate, a nitrate, a sulfate, an acetate, an oxide, a peroxide, and a hydroxide of alkaline-earth metal or zinc, more preferably a carbonate, an oxalate, an oxide, or a hydroxide of alkaline-earth metal, and most preferably a carbonate of alkaline-earth metal.

There is no particular limit to the shape of the alkaline-earth metal compound, and a powder shape, a lump shape, or the like may be selected appropriately. The preferable shape for the purpose of obtaining a powder-shaped phosphor is powder.

There is no particular limit to the silicon compound as long as it is capable of forming the phosphor composition of the present embodiment by the above-mentioned reaction. The silicon compound is preferably silicon nitride ($Si_3N_4$) or silicon diimide ($Si(NH)_2$), more preferably silicon nitride for the same reason as that in the case of the alkaline-earth metal compound or the reason that a phosphor with high performance can be produced.

There is no particular limit to the shape of the silicon compound, and a powder shape, a lump shape, or the like can be selected appropriately. The preferable shape for the purpose of obtaining a powder-shaped phosphor is powder.

In the production method 2 of the present invention, a supply source of silicon may be elemental silicon. In this case, silicon is allowed to react with nitrogen or the like in a nitriding gas atmosphere to form a nitrogen compound of silicon (silicon nitride, etc.), and the nitrogen compound is allowed to react with the above-mentioned alkaline-earth metal nitride, aluminum compound, and the like. For this reason, according to the production method 2 of the present invention, elemental silicon also is included as the silicon compound.

There is no particular limit to the aluminum compound as long as it is capable of forming the phosphor composition of the present embodiment by the above-mentioned reaction. The aluminum compound is preferably aluminum nitride (AlN) for the same reason as that in the case of the above-mentioned silicon compound.

There is no particular limit to the shape of the aluminum compound, and a powder shape, a lump shape, or the like can be selected appropriately. The preferable shape of the aluminum compound for the purpose of obtaining a powder-shaped phosphor is powder.

In the production method 2 of the present invention, a supply source of aluminum may be elemental metal. In this case, aluminum is allowed to react with nitrogen or the like in a nitriding gas atmosphere to form a nitrogen compound of aluminum (aluminum nitride, etc.), and the nitrogen compound is allowed to react with the above-mentioned alkaline-earth metal nitride, silicon compound, and the like. For this reason, according to the production method 2 of the present invention, metal aluminum is included as the aluminum compound.

There is no particular limit to the shape of the above-mentioned carbon. The preferable shape is solid-state carbon, and carbon black, high-purity carbon powder, carbon lump, or the like can be used. Among them, graphite is particularly preferable. However, amorphous carbon (coals, coke, charcoal, gas carbon, etc.) may be used. In addition, for example, carbon hydride, such as natural gas, methane ($CH_4$), propane ($C_3H_8$), or propane ($C_4H_{10}$), which is carburizing gas, may be used as a carbon supply source. In the case of using a carbonaceous firing container and heating element in a vacuum atmosphere or a neutral atmosphere such as an inactive gas atmosphere, a part of carbon may be evaporated. However, such evaporated carbon can be used as a reducing agent in principle.

There is no particular limit to the size and shape of the above-mentioned solid-state carbon. For the reason of ease of availability, fine powder, powder, or particles with a longest diameter or longest side of 10 nm to 1 cm is preferable. Other solid-state carbons may be used. Solid-state carbon in various shapes such as a powder shape, a particle shape, a lump shape, a plate shape, and a bar shape can be used. The purity of the solid-state carbon is not particularly limited, either. For the purpose of obtaining a nitride phosphor of high quality, the purity of the solid-state carbon is preferably as high as possible. For example, it is preferable to use high-purity carbon with a purity of at least 99%, preferably at least 99.9%.

The addition amount of the solid-state carbon is set to be a reaction ratio stoichiometrically required for removing oxygen contained in the phosphor ingredient. Preferably, in order to remove the oxygen completely, the addition amount of the solid-state carbon is set to be a reaction ratio slightly larger than the stoichiometrically required reaction ratio. Regarding a specific numerical value, it is desirable to excessively add the solid-state carbon in a range not exceeding 30 atomic % of the stoichiometrically required reaction ratio.

The solid-state carbon to be reacted may be in a form that also functions as a heating element (carbon heater) or also functions as a firing container (carbon crucible, etc.) The above carbon used as a reducing agent may be mixed with a phosphor ingredient, or may be merely brought into contact with the phosphor ingredient.

Furthermore, there is no particular limit to the nitriding gas, as long as it is capable of nitriding the above-mentioned alkaline-earth metal compound or zinc compound reduced with carbon. In terms of the ease of availability, the ease of handling of high-purity gas, the cost, and the like, at least one gas selected from nitrogen gas and ammonia gas, more preferably nitrogen gas, is used. For the purpose of increasing the reducing power of a firing atmosphere and enhancing the performance of a phosphor, or obtaining a phosphor with high performance, nitrogen-hydrogen mixed gas also can be used.

As the reaction atmosphere containing nitriding gas, a normal-pressure atmosphere is preferable for the reason that a simple facility can be used. However, any of a high-pressure atmosphere, a compressed atmosphere, a reduced-pressure atmosphere, and a vacuum atmosphere may be used. The preferable reaction atmosphere for the purpose of enhancing the performance of a phosphor is a high-pressure atmosphere mainly containing nitrogen gas of, for example, 2 to 100 atm pressure, preferably 5 to 20 atm pressure in view of the handling of the atmosphere. With such a high-pressure atmosphere, the decomposition of a nitride phosphor composition, which occurs during firing at high temperature, can be prevented or suppressed, and the shift of the composition of a phosphor is suppressed, whereby a phosphor composition with high exhibition performance can be produced. For the purpose of accelerating the decarbonization of a reacted product (fired product), a small or trace amount of water vapor may be contained in the above reaction atmosphere.

Furthermore, in order to enhance the reactivity between the above-mentioned compound materials, a flux may be added to be reacted. As the flux, an alkaline metal compound ($Na_2CO_3$, NaCl, LiF), or a halogen compound ($SrF_2$, $CaCl_2$, etc.) can be selected appropriately.

The most significant features of the production method 2 of the present invention are as follows:

(1) As the material for the phosphor composition of the present embodiment, a nitride of alkaline-earth metal or zinc, or alkaline-earth metal or zinc metal is not substantially used;

(2) A compound is used instead, which is capable of generating a metal oxide (the above-mentioned MO) by heating;

(3). An oxygen component contained in these compounds is removed by the reaction with carbon, preferably solid-state carbon;

(4) The alkaline-earth metal compound is nitrided by the reaction with nitriding gas; and (5) During the above reaction (4), a silicon compound is allowed to react with an aluminum compound to produce the phosphor composition of the present embodiment.

In the production method 2 of the present invention, the preferable reaction temperature is 1,300° C. to 2,000° C., and the preferable reaction temperature for the purpose of enhancing the performance of a phosphor is 1,600° C. to 2,000° C. and more preferably 1,700° C. to 1,900° C. On the other hand, for the purpose of mass-production, the preferable reaction temperature is 1,400° C. to 1,800° C., more preferably 1,600° C. to 1,700° C. The reaction also may be divided to several times. Thus, the compound capable of generating a metal oxide by heating becomes a metal oxide MO, and the metal oxide MO further is reacted with carbon to be reduced while generating carbon monoxide or carbon dioxide. Furthermore, the reduced metal oxide is reacted with another compound such as the silicon compound and aluminum compound, and gas while being nitrided with nitriding gas to form a nitride. Thus, the nitride phosphor composition of the present embodiment is generated.

At a temperature lower than the above-mentioned temperature range, the above-mentioned reaction and reduction become insufficient, which makes it difficult to obtain a nitride phosphor composition of high quality. At a temperature higher than the above-mentioned temperature range, a nitride phosphor composition is decomposed or fuses, which makes it difficult to obtain a phosphor composition with a desired composition and a desired shape (powder shape, molding shape, etc.). Furthermore, at a temperature higher than the above-mentioned temperature range, there is no choice but to use an expensive heating element and a heat insulating material with high insulation for production facility, which increases a facility cost, resulting in the difficulty in providing a phosphor composition at a low cost.

According to the production method 2 of the present invention, it is not necessary to use a nitride of alkaline-earth metal or zinc, which is difficult to obtain with high purity and difficult to handle in the atmosphere, as a main material for a phosphor. The production method 2 of the present invention is characterized by allowing a material containing a compound capable of generating an oxide of the above-mentioned element "M" by heating, a silicon compound, an aluminum compound, and carbon to react with a compound containing an element forming a luminescent center ion in a nitriding gas atmosphere. These materials are relatively inexpensive and easy to obtain, and are easy to handle in the atmosphere. Therefore, these materials are suitable for mass-production, and enable the phosphor of the present embodiment to be produced at a low cost. Simultaneously, if the phosphor composition of Embodiment 1 produced by the production method 2 of the present invention is used, a light-emitting device can be provided at a lower cost.

As the supplemental description, the production method 2 of the present invention also is applicable to the production method 1 of the present invention described above. For example, when carbon as a reducing agent is added to at least one selected from a nitride ($M_3N_2$) of alkaline-earth metal and a nitride ($Zn_3N_2$) of zinc, silicon nitride ($Si_3N_4$), and aluminum nitride (AlN), used as materials for forming a phosphor host, and the resultant mixture is fired, impurity oxygen can be removed as carbon monoxide gas (CO) during firing, and oxygen can be prevented or suppressed from being mixed with a phosphor. Therefore, a nitride phosphor composition with high purity can be produced.

More specifically, in a method for producing a nitride phosphor composition using at least one nitride selected from a nitride of alkaline earth metal and a nitride of zinc as at least one of the phosphor ingredients, a method for producing a phosphor composition characterized in that carbon is added to a phosphor ingredient to be fired can be replaced with a method for producing a phosphor composition of another embodiment. The above-mentioned nitride phosphor composition refers to a phosphor composition containing nitrogen as a gasifiable element constituting a phosphor host, such as a nitride phosphor composition or an oxynitride phosphor composition, in particular, a phosphor composition containing nitrogen as a main gasifiable component element.

Even if some nitride compound such as $Si_3N_4$, $M_2Si_5N_8$, $MSiN_2$, or $MSi_7N_{10}$ is mixed with a material for the phosphor composition containing a composition represented by the above-mentioned $MAlSiN_3$ as a main component of a phosphor host, followed by firing, a phosphor composition exhibiting emission characteristics similar to those of the above-mentioned phosphor composition is obtained. Thus, the phosphor composition of the present embodiment also may be a phosphor composition containing, as a main component of a phosphor host, a nitride represented by any of a composition formula of $MAlSiN_3.aSi_3N_4$, $MAlSiN_3.aM_2Si_5N_8$, $MAlSiN_3.aMSiN_2$, and $MAlSiN_3.aMSi_7N_{10}$. Herein, "M" is at least one element selected from the group consisting of Mg, Ca, Sr, Ba, and Zn, and "a" is a numerical value satisfying $0 \leq a \leq 2$, preferably $0 \leq a \leq 1$. Examples of such a phosphor composition include those in which a luminescent center ion is added to a composition such as $2MAlSiN_3.Si_3N_4$, $4MAlSiN_3.3Si_3N_4$, $MAlSiN_3.Si_3N_4$, $MAlSiN_3.2Si_3N_4$, $2MAlSiN_3.M_2Si_5N_8$, $MAlSiN_3.M_2Si_5N_8$, $MAlSiN_3.2M_2Si_5N_8$, $2MAlSiN_3.MSiN_2$, $MAlSiN_3.MSiN_2$, $MAlSiN_3.2MSiN_2$, $2MAlSiN_3.MSi_7N_{10}$, $MAlSiN_3.MSi_7N_{10}$, or $MAlSiN_3.2MSi_7N_{10}$.

Embodiment 2

Next, an embodiment of a light-emitting device of the present invention will be described. There is no particular limit to the embodiment of an exemplary light-emitting device of the present invention, as long as the phosphor composition of Embodiment 1 is used as a light-emitting source. For example, as an excitation source for a phosphor, at least one electromagnetic wave selected from an X-ray, an electron beam, ultraviolet light, near-ultraviolet light, visible light (light of violet, blue, green, or the like), near-infrared light, infrared light, and the like can be used. The phosphor of Embodiment 1 is allowed to emit light by applying an electric field or injecting an electron thereto, whereby the phosphor may be used as a light-emitting source.

Examples of the light-emitting device of the present embodiment include those known by the following names: (1) fluorescent lamp, (2) plasma display panel, (3) inorganic electroluminescence panel, (4) field emission display, (5) cathode-ray tube, and (6) white LED light source.

More specific examples of the light-emitting device of the present embodiment include a white LED, various kinds of display devices configured using a white LED (e.g., an LED information display terminal, an LED traffic light, an LED lamp for an automobile (a stop lamp, a turn signal light, a headlight, etc.)), various kinds of illumination devices configured using a white LED (an LED indoor-outdoor illumination lamp, an interior LED lamp, an LED emergency lamp, a LED light source, an LED decorative lamp), various kinds of display devices not using a white LED (a cathode-ray tube, an inorganic electroluminescence panel, a plasma display panel, etc.), and various kinds of illumination devices (a fluorescent lamp, etc.) not using a white LED.

In another aspect, the light-emitting device of the present embodiment is, for example, any of a white light-emitting element, various kinds of light sources, an illumination device, a display device, and the like, obtained by combining an injection-type electroluminescence element emitting near-ultraviolet light or blue light, (a light-emitting diode, a laser diode, an organic electroluminescence element, etc.) with at least the phosphor composition of Embodiment 1. A display device, an illumination device, a light source, and the like configured using at least one white light-emitting element also are included in the above-mentioned light-emitting device.

The light-emitting device of the present embodiment is configured using, as a light-emitting source, a nitride phosphor composition emitting light in a warm color having an emission peak in a wavelength range of preferably 580 nm to 660 nm, more preferably 610 nm to 650 nm, wherein, as the nitride phosphor composition, the phosphor composition of Embodiment 1 is used.

Furthermore, the light-emitting device of the present embodiment is configured, for example, by combining an emission source for emitting primary light of 360 nm to less than 560 nm, and a phosphor composition for absorbing the primary light emitted by the emission source and converting the primary light into visible light having a wavelength larger than that of the primary light, wherein, as the phosphor composition, the phosphor composition of Embodiment 1 (more preferably a phosphor composition emitting light in a warm color) is used. More specifically, the light-emitting device of the present embodiment is configured by combining an emission source for emitting light having an emission peak in any wavelength range of 360 nm to less than 420 nm, 420 nm to less than 500 nm, and 500 nm to less than 560 nm, with a phosphor composition for absorbing primary light emitted by the emission source and converting the primary light into visible light having a wavelength larger than that of the primary light, wherein, as the phosphor composition, the phosphor composition of Embodiment 1 is used.

The light-emitting device of the present embodiment also can use an injection-type electroluminescence element as the emission source. The injection-type electroluminescence element refers to a photoelectric transducer configured so as to convert electric energy into light energy to obtain light emission by providing an electric power to inject a current to a fluorescent material. Specific examples thereof are as described above.

The light-emitting device of the present embodiment is configured using, as a light-emitting source, a novel phosphor that is capable of extending the range of choices of phosphor ingredients. Therefore, the light-emitting device of the present embodiment can be configured at a low cost even without using a conventional expensive phosphor having a high scarcity value. Furthermore, the light-emitting device of the present embodiment is configured using, as a light-emitting source, a phosphor emitting light in a warm color, in particular, red light. Therefore, in the light-emitting device, the intensity of a light-emitting component in a warm color is high, and the special color rendering index R9 has a large numerical value.

Hereinafter, the light-emitting device of the present embodiment will be described with reference to the drawings. There is no particular limit to the light-emitting device of the present embodiment, as long as the phosphor composition of Embodiment 1 is used as a light-emitting source. Furthermore, in a preferable embodiment, the phosphor composition of Embodiment 1 and a light-emitting element are used as a light-emitting source, and the phosphor composition is combined with the light-emitting element so that the phosphor composition covers the light-emitting element.

Figure 2:
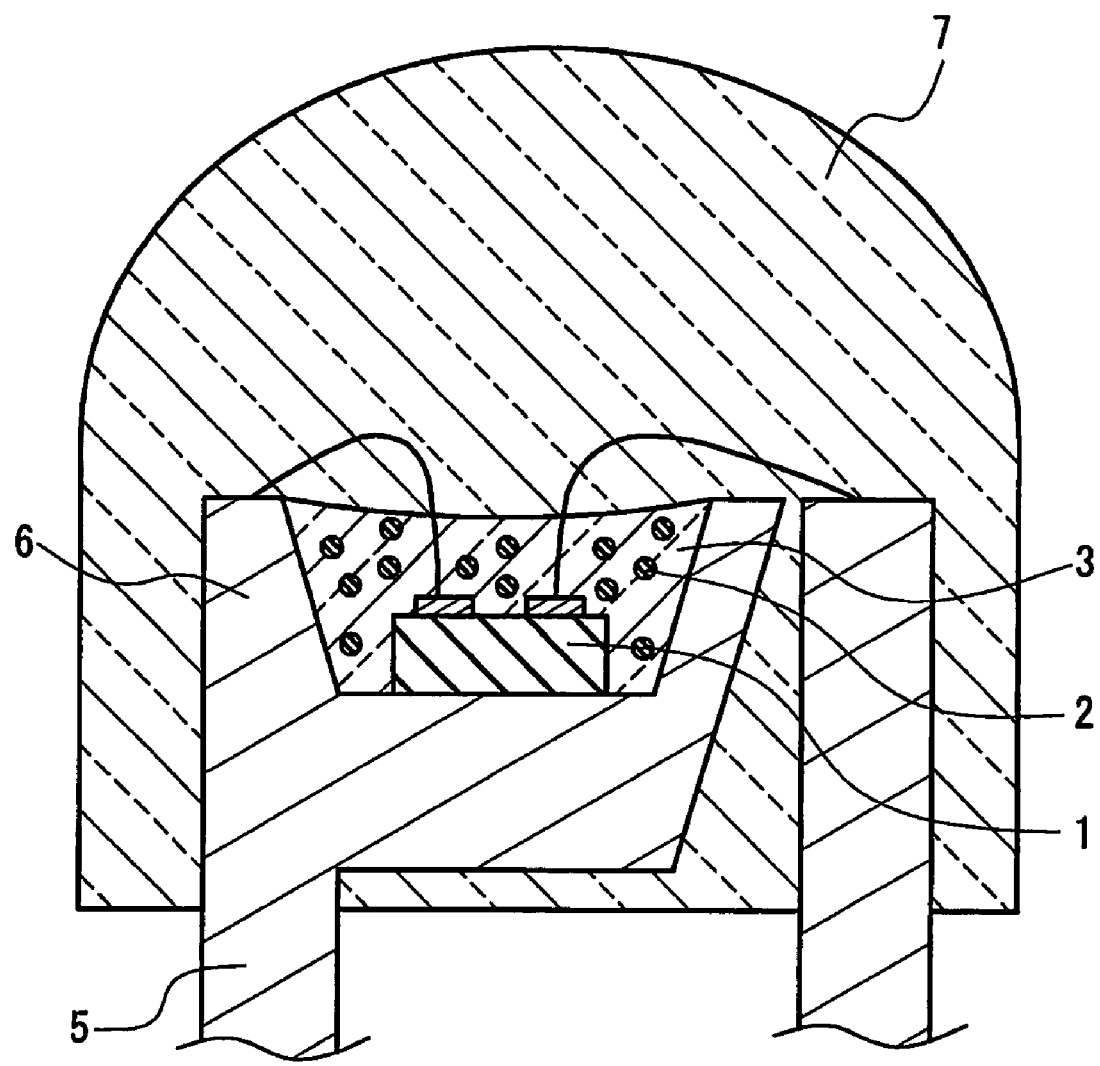
FIG. 2 is a cross-sectional view of a semiconductor light-emitting device in an embodiment of the present invention.
Figure 3:
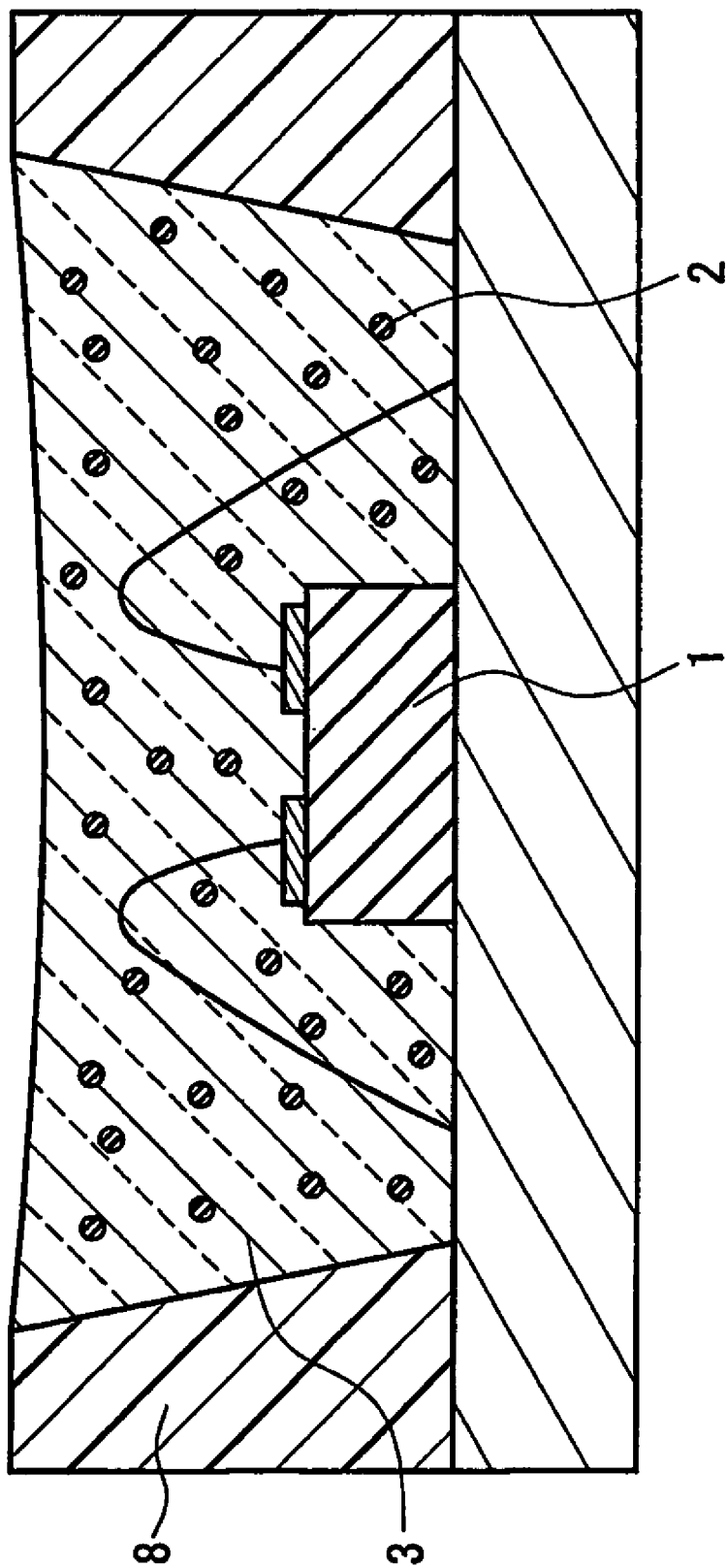
FIG. 3 is a cross-sectional view of a semiconductor light-emitting device in an embodiment of the present invention.

FIGS. 1, 2, and 3 are cross-sectional views of semiconductor light-emitting devices that are typical embodiments of a light-emitting device including a combination of the phosphor composition of Embodiment 1 and a light-emitting element.

FIG. 1 shows a semiconductor light-emitting device having a configuration in which at least one light-emitting element 1 is mounted on a submount element 4, and the light-emitting element 1 is sealed in a package of a base material (e.g., transparent resin, low-melting glass) that also functions as a phosphor layer 3 containing at least the phosphor composition 2 of Embodiment 1. FIG. 2 shows a semiconductor light-emitting device having a configuration in which at least one light-emitting element 1 is mounted on a cup 6 provided at a mount lead of a lead frame 5, a phosphor layer 3 formed of a base material containing at least the phosphor composition 2 of Embodiment 1 is provided in the cup 6, and the entire body is sealed with a sealant 7 made of resin or the like. FIG. 3 shows a semiconductor light-emitting device of a chip type having a configuration in which at least one light-emitting element 1 is placed in a housing 8, and the phosphor layer 3 formed of a base material containing at least the phosphor composition 2 of embodiment 1 is provided in the housing 8

In FIGS. 1 to 3, the light-emitting element 1 is a photoelectric transducer that converts electric energy into light. Specific examples of the light-emitting element 1 include a light-emitting diode, a laser diode, a surface-emitting laser diode, an inorganic electroluminescence element, an organic electroluminescence element, and the like. In particular, the light-emitting diode or the surface-emitting laser diode is preferable in terms of the high output of the semiconductor light-emitting device. The wavelength of light emitted by the light-emitting element 1 is not particularly limited, and may be in a range (e.g., 250 to 550 nm) capable of exciting the phosphor composition of Embodiment 1. However, in order to produce a semiconductor light-emitting device with high light-emitting performance, in which the phosphor composition of Embodiment 1 is excited at a high efficiency and which emits white light, the light-emitting element 1 is set so as to have an emission peak in a wavelength range of more than 340 nm to 500 nm, preferably more than 350 nm to 420 nm, or more than 420 nm to 500 nm, more preferably more than 360 nm to 410 nm, or more than 440 nm to 480 nm i.e., in a near-ultraviolet, violet, or blue wavelength range).

Furthermore, in FIGS. 1 to 3, the phosphor layer 3 contains at least the phosphor composition 2 of Embodiment 1. The phosphor layer 3 is configured, for example, by dispersing at least the phosphor composition 2 of Embodiment 1 in a transparent base material such as transparent resin (epoxy resin, silicone resin, etc.), low-melting glass, or the like. The content of the phosphor composition 2 in the transparent base material is preferably 5 to 80% by weight, more preferably 10 to 60% by weight, for example, in the case of the above-mentioned transparent resin. The phosphor composition 2 of Embodiment 1 present in the phosphor layer 3 is a light conversion material that absorbs a part or an entirety of light emitted from the light-emitting element 1 to convert it into yellow to dark red light. Therefore, the phosphor composition 2 is excited by the light-emitting element 1, and the semiconductor light-emitting device emits light containing at least light-emitting component light emitted by the phosphor composition 2.

Accordingly, with the light-emitting device described above having, for example, the following combined configuration, white light is obtained owing to the color mixture of light emitted by the light-emitting element 1 and light emitted by the phosphor layer 3, and hence a semiconductor light-emitting element emitting white light, which is highly demanded, can be obtained.

(1) A combined configuration of a light-emitting element emitting any light of near-ultraviolet light (wavelength: 300 nm to less than 380 nm, preferably 350 nm to less than 380 nm in terms of the output) and violet light (wavelength: 380 nm to less than 420 nm, preferably 395 nm to less than 415 nm in terms of the output), a blue phosphor, a green phosphor, and the red phosphor composition of Embodiment 1.

(2) A combined configuration of a light-emitting element emitting any light of near-ultraviolet light and violet light, a blue phosphor, a green phosphor, a yellow phosphor, and the red phosphor composition of Embodiment 1.

(3) A combined configuration of a light-emitting element emitting any light of near-ultraviolet light and violet light, a blue phosphor, a yellow phosphor, and the red phosphor composition of Embodiment 1.

(4) A combined configuration of a light-emitting element emitting blue light (wavelength: 420 nm to less than 490 nm, preferably 450 nm to less than 480 nm in terms of the output), a green phosphor, a yellow phosphor, and the red phosphor composition of Embodiment 1.

(5) A combined configuration of a light-emitting element emitting blue light, a yellow phosphor, and the red phosphor composition of Embodiment 1.

(6) A combined configuration of a light-emitting element emitting blue light, a green phosphor, and the red phosphor composition of Embodiment 1.

(7) A combined configuration of a light-emitting element emitting blue-green light (wavelength: 490 nm to less than 510 nm) and the red phosphor composition of Embodiment 1.

The phosphor composition of Embodiment 1 emitting red light can be excited with green light with a wavelength of 510 nm to less than 560 nm or yellow light with a wavelength of 560 nm to less than 590 nm. Therefore, a semiconductor light-emitting device also can be produced that has a configuration in which a light-emitting element emitting any of the above-mentioned green light and yellow light is combined with the red phosphor composition of Embodiment 1.

Furthermore, since the phosphor composition of Embodiment 1 can emit yellow light, the yellow phosphor composition of Embodiment 1 also can be used as the yellow phosphor. Furthermore, in this case, a red phosphor other than the phosphor composition of Embodiment 1 may be used as the red phosphor composition. Furthermore, even when a light-emitting element emitting blue light is combined with the yellow phosphor composition of Embodiment 1, white light can be obtained.

The above-mentioned blue phosphor, green phosphor, yellow phosphor, and red phosphor other than the phosphor composition of Embodiment 1 can be widely selected from an aluminate phosphor activated with $Eu^{2+}$, a halophosphate phosphor activated with $Eu^{2+}$, a phosphate phosphor activated with $Eu^{2+}$, a silicate phosphor activated with $Eu^{2+}$, a garnet phosphor activated with $Ce^{3+}$ (in particular, YAG (yttrium-aluminum-garnet): Ce phosphor), a silicate phosphor activated with $Tb^{3+}$, a thiogallate phosphor activated with $Eu^{2+}$, a nitride phosphor activated with $Eu^{2+}$ (in particular, a SIALON phosphor), an alkaline-earth metal sulfide phosphor activated with $Eu^{2+}$, an oxysulfide phosphor activated with $Eu^{3+}$, and the like. More specifically, a $(Ba, Sr)MgAl_{10}O_7:Eu^{2+}$ blue phosphor, a $(Sr, Ca, Ba, Mg)_{10}(PO_4)_6Cl_2:Eu^{2+}$ blue phosphor, a $(Ba, Sr)_2SiO_4:Eu^{2+}$ green phosphor, a $BaMgAl_{10}O_{17}:Eu^{2+}$, $Mn^{2+}$ green phosphor, a $Y_3(Al, Ga)_5O_{12}:Ce^{3+}$ green phosphor, a $Y_3Al_5O_{12}:Ce^{3+}$ green phosphor, a $BaY_2SiAl_4O_{12}:Ce^{3+}$ green phosphor, a $Ca_3Sc_2Si_3O_{12}:Ce^{3+}$ green phosphor, a $Y_2SiO_5:Ce^{3+}$, $Tb^{3+}$ green phosphor, a $BaSiN_2:Eu^{2+}$ green phosphor, a $SrGa_2S_4:Eu^{2+}$ green phosphor, a $(Y, Gd)_3Al_5O_{12}:Ce^{3+}$ yellow phosphor, a $Y_3Al_5O_{12}:Ce^{3+}$, $Pr^{3+}$ yellow phosphor, a $(Sr, Ba)_2SiO_4:Eu^{2+}$ yellow phosphor, a $CaGa_2S_4:Eu^{2+}$ yellow phosphor, a $0.75\ CaO.2.25\ AlN.3.25\ Si_3N_4:Eu^{2+}$ yellow phosphor, a $CaS:Eu^{2+}$ red phosphor, a $SrS:Eu^{2+}$ red phosphor, a $La_2O_2S:Eu^{3+}$ red phosphor, a $Y_2O_2S:Eu^{3+}$ red phosphor, or the like can be used.

Conventionally, a white LED with a high luminous flux and a high color rendering property has been known, which uses a blue LED as an excitation source of a phosphor, and contains, for example, an $Sr_2Si_5N_8:Eu^{2+}$ nitride red phosphor, and the above-mentioned YAG:Ce yellow phosphor or green phosphor in a phosphor layer. The phosphor composition of Embodiment 1 exhibits emission characteristics similar to those of the above-mentioned $Sr_2Si_5N_8:Eu^{2+}$ nitride red phosphor. Therefore, a light-emitting device, which uses a blue LED as an excitation source of a phosphor, and includes a combination of the red phosphor composition of Embodiment 1 and the above-mentioned YAG:Ce phosphor, also becomes a white LED emitting white light with a high luminous flux and a high color rendering property equal to those of the conventional light-emitting device.

The semiconductor light-emitting device in the present embodiment can be excited with near-ultraviolet light to blue light, and is configured using the phosphor composition of Embodiment 1, which is easily produced, has a high emission intensity, is stable chemically, and contains a large amount of red light-emitting component. Therefore, the semiconductor light-emitting device in the present embodiment is a light-emitting device that has a higher emission intensity of a red light-emitting component, is more excellent in reliability, and can be produced at a lower cost, compared with the conventional light-emitting device.

Embodiment 3

Figure 4:
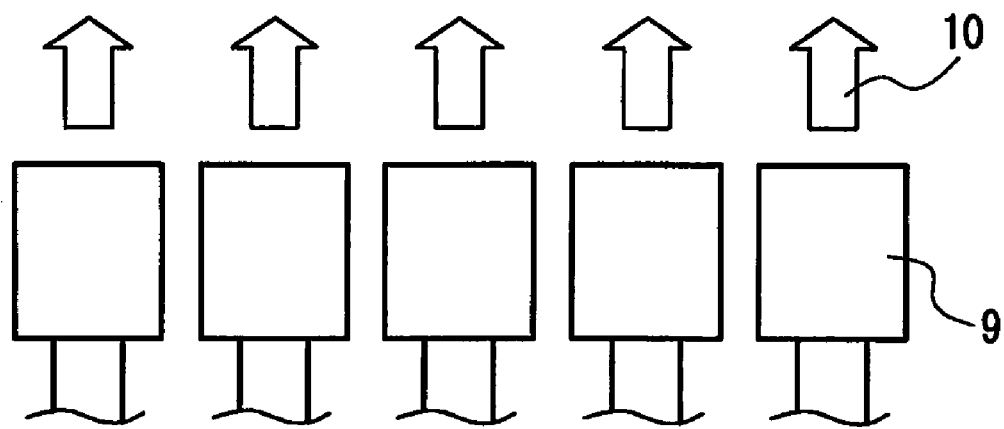
FIG. 4 is a schematic view showing a configuration of an illumination•display device in the embodiment of the present invention.
Figure 5:
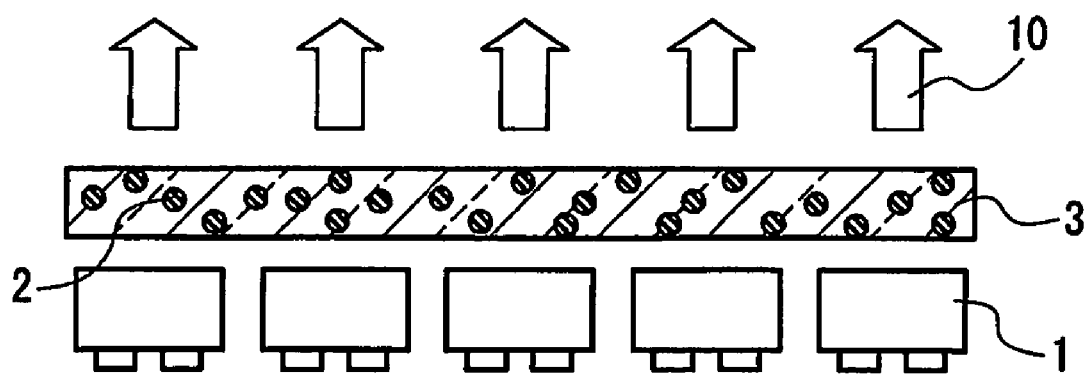
FIG. 5 is a schematic view showing a configuration of an illumination•display device in the embodiment of the present invention.

FIGS. 4 and 5 respectively show a schematic view of a configuration of an illumination•display device that is an example of the light-emitting device of the present invention. FIG. 4 shows an illumination•display device configured using at least one semiconductor light-emitting device 9 that is an example of the above-mentioned light-emitting device in which the phosphor composition of Embodiment 1 is combined with the light-emitting element. FIG. 5 shows an illumination•display device including a combination of at least one light-emitting element 1 and the phosphor layer 3 containing at least the phosphor composition 2 of Embodiment 1. As the light-emitting element 1 and the phosphor layer 3, the ones similar to those of the semiconductor light-emitting device of Embodiment 2 can be used. Furthermore, the functions and effects of the illumination•display device with such a configuration also are similar to those of the semiconductor light-emitting device of Embodiment 2. In FIGS. 4 and 5, reference numeral 10 denotes output light.

Figure 6:
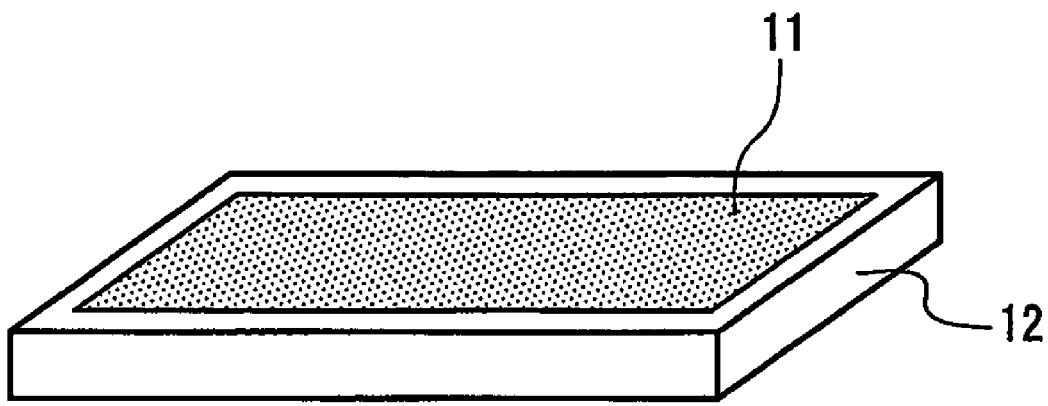
FIG. 6 is a perspective view of an illumination module in the embodiment of the present invention.
Figure 7:
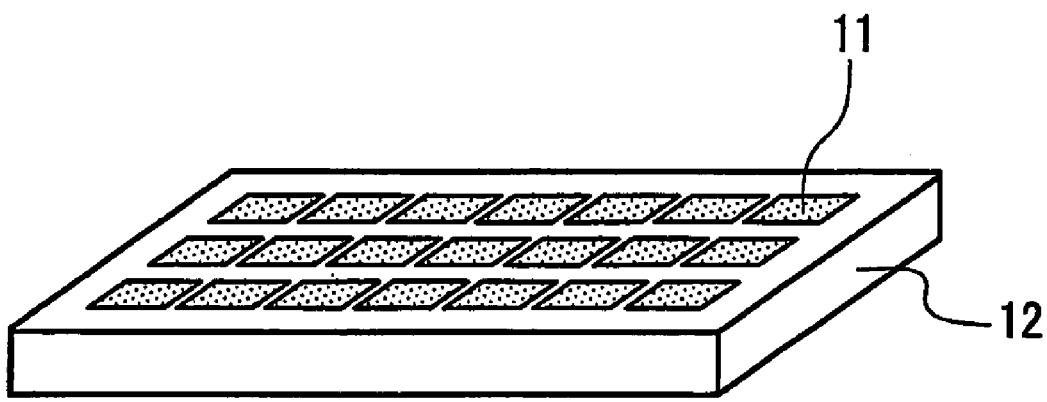
FIG. 7 is a perspective view of an illumination module in the embodiment of the present invention.
Figure 8:
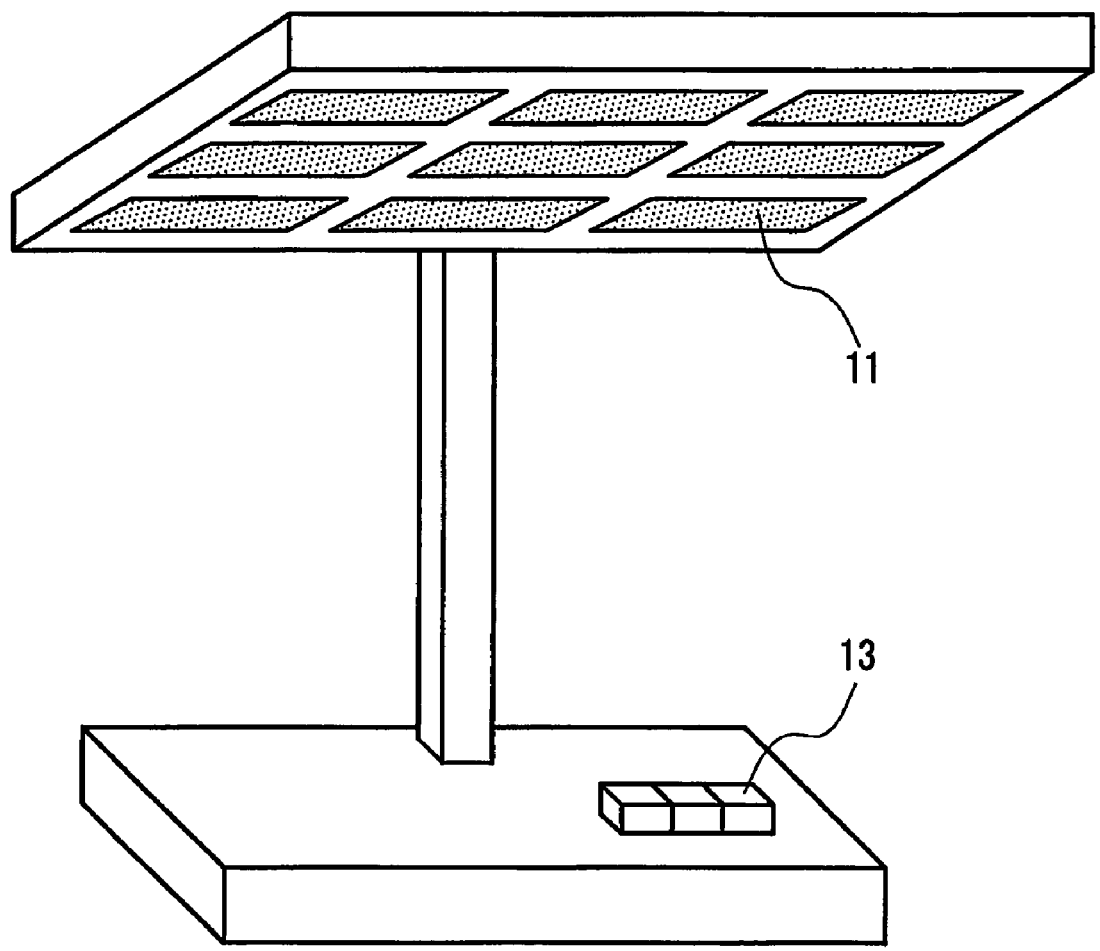
FIG. 8 is a perspective view of an illumination device in the embodiment of the present invention.
Figure 9:
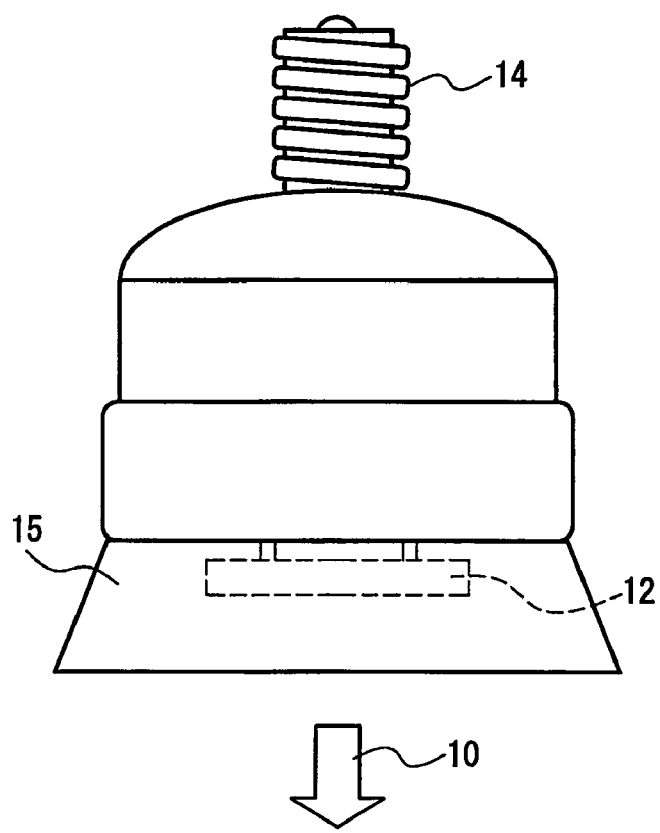
FIG. 9 is a side view of an illumination device in the embodiment of the present invention.
Figure 10:
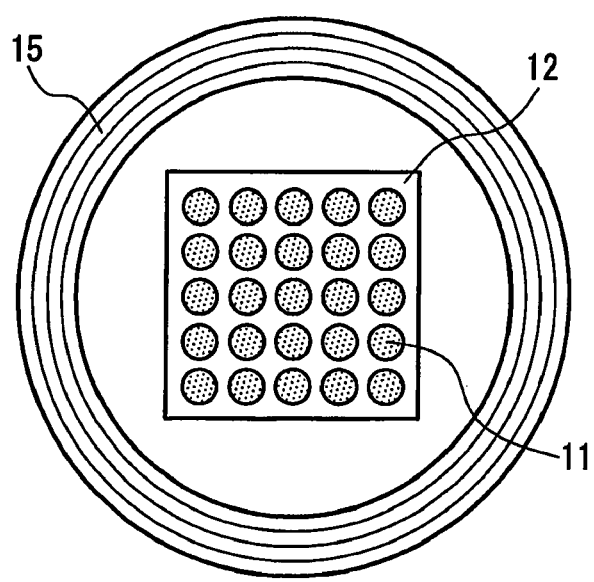
FIG. 10 is a bottom view of the illumination device shown in FIG. 9.
Figure 11:
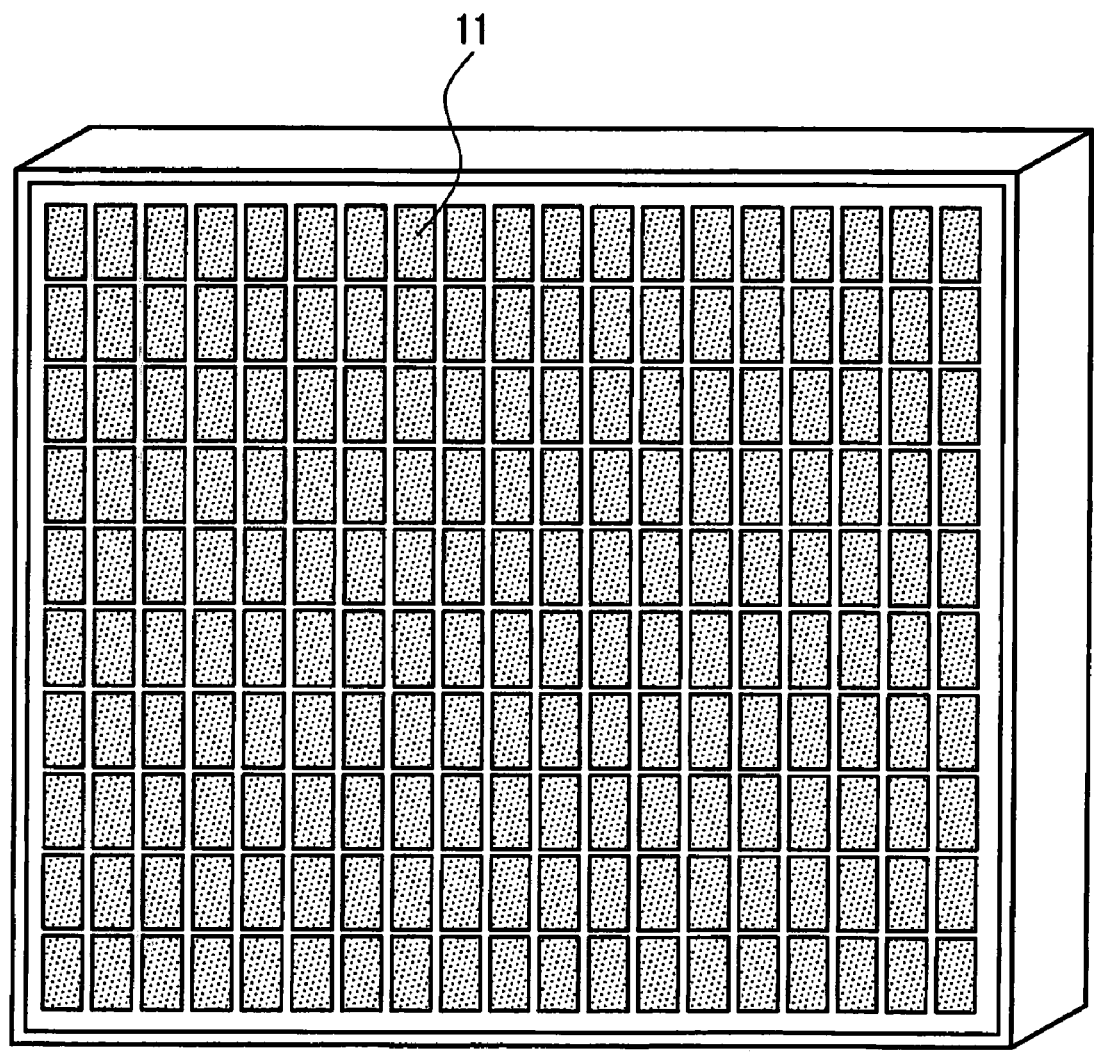
FIG. 11 is a perspective view of an image display device in the embodiment of the present invention.
Figure 12:
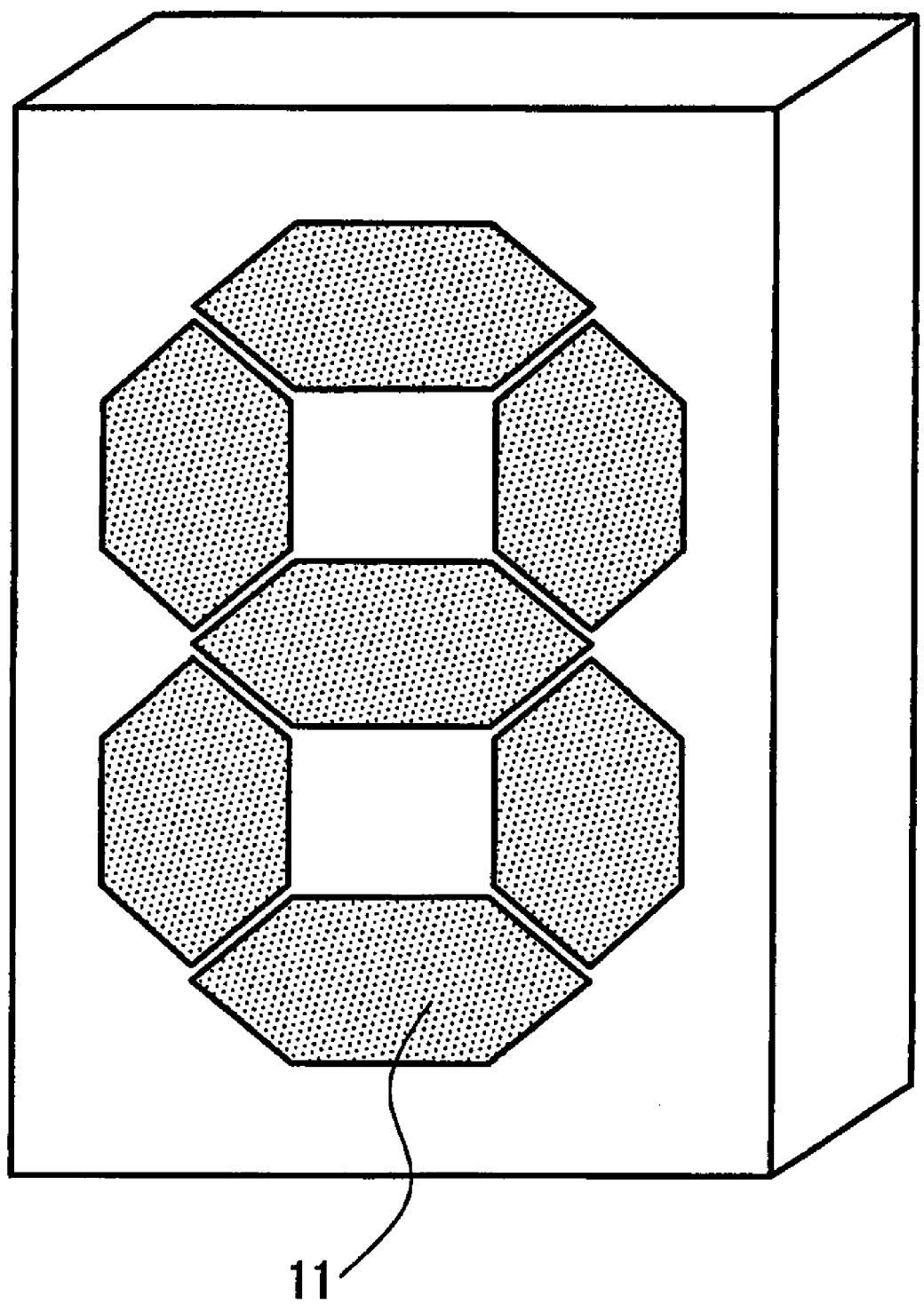
FIG. 12 is a perspective view of a number display device in the embodiment of the present invention.

FIGS. 6 to 12 respectively show a specific example of an illumination device with the illumination•display device of the present embodiment incorporated thereto, schematically shown in FIGS. 4 and 5. FIG. 6 shows a perspective view of an illumination module 12 having an integrated light-emitting portion 11. FIG. 7 shows a perspective view of the illumination module 12 having a plurality of light-emitting portions 11. FIG. 8 is a perspective view of a table lamp type illumination device having the light-emitting portions 11 and being capable of controlling ON-OFF and light amount with a switch 13. FIG. 9 is a side view of an illumination device as a light source configured using a screw cap 14, a reflective plate 15, and an illumination module 12 having a plurality of light-emitting portions 11. FIG. 10 is a bottom view of the illumination device shown in FIG. 9. FIG. 11 is a perspective view of a plate type image display device provided with the light-emitting portions 11. FIG. 12 is a perspective view a segmented number display device provided with the light-emitting portions 11.

The illumination•display device in the present embodiment is configured using the phosphor composition of Embodiment 1 which is produced easily, has a high emission intensity, is chemically stable, and contains a large amount of a red light-emitting component, or the semiconductor light-emitting device of Embodiment 2 which has a high emission intensity of a red light-emitting component, is excellent in reliability, and can be produced at a low cost. Therefore, the illumination•display device in the present embodiment has a higher emission intensity of a red light-emitting component, is more excellent in reliability, and can be produced at a lower cost, compared with the conventional illumination•display device.

Embodiment 4

Figure 13:
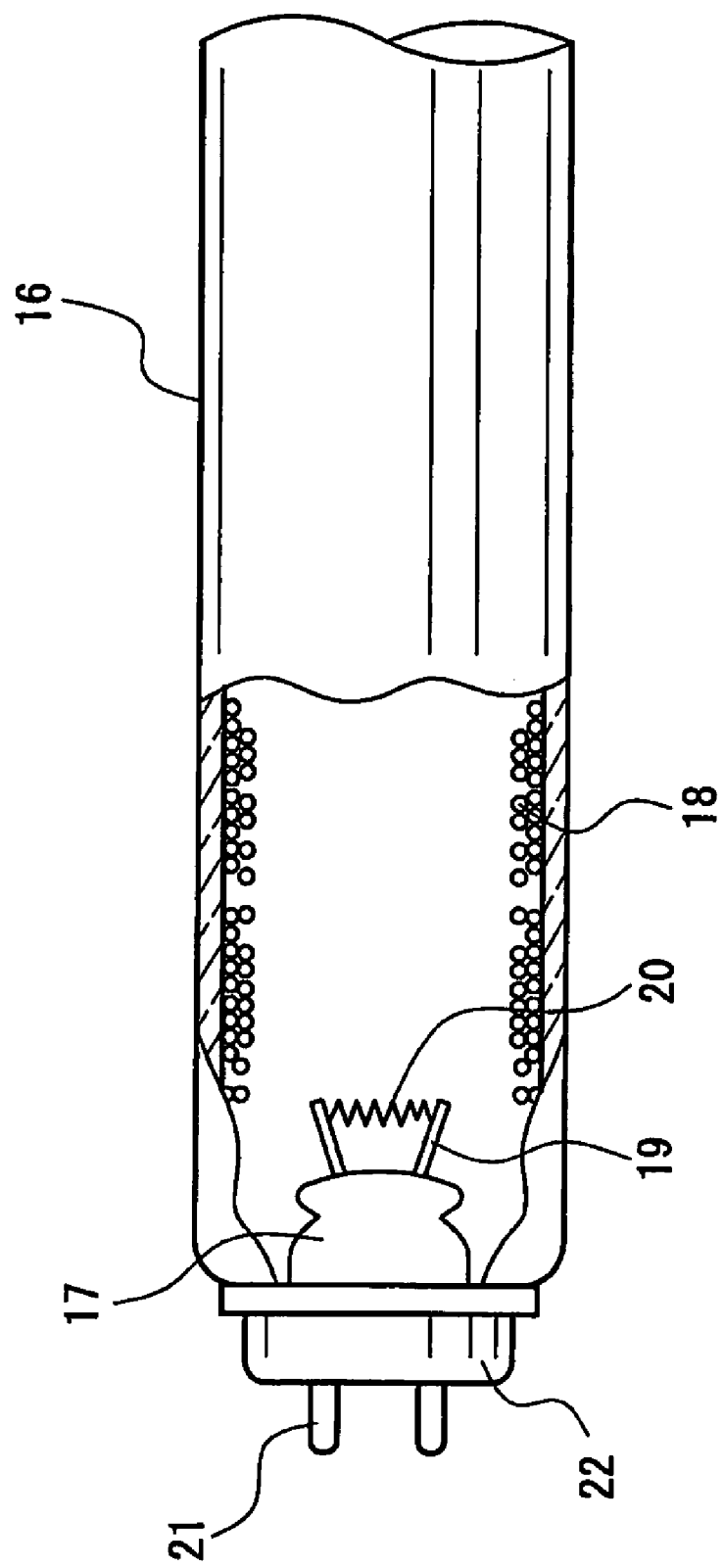
FIG. 13 is a partial cut-away view of an end portion of a fluorescent lamp in the embodiment of the present invention.

FIG. 13 is a partially cut-away view of an end portion of a fluorescent lamp that is an exemplary light-emitting device using the phosphor composition of Embodiment 1. In FIG. 13, a glass tube 16 is sealed at both end portions with stems 17, and noble gas such as neon, argon, or krypton and mercury are sealed in the glass tube 16. The inner surface of the glass tube 16 is coated with the phosphor composition 18 of Embodiment 1. A filament electrode 20 is attached to the stem 17 with two leads 19. A cap 22 provided with an electrode terminal 21 is attached to the respective end portions of the glass tube 16, whereby the electrode terminal 21 is connected to the leads 19.

There is no particular limit to the shape, size, and wattage of the fluorescent lamp of the present embodiment, and the color and color rendering property of light emitted by the fluorescent lamp, and the like. The shape of the fluorescent lamp of the present embodiment is not limited to a straight tube as in the present embodiment. Examples of the shape of the fluorescent lamp include a round shape, a double annular shape, a twin shape, a compact shape, a U-shape, and a bulb shape, and a narrow tube for a liquid crystal backlight and the like also is included. Examples of the size include 4-type to 110-type. The wattage may be selected appropriately in accordance with the application from a range of several watts to hundreds of watts. Examples of light color include daylight color, neutral white color, white color, and warm white color.

The fluorescent lamp in the present embodiment is configured using the phosphor composition of Embodiment 1 which is produced easily, has a high emission intensity, and contains a large amount of red light-emitting component. Therefore, the fluorescent lamp in the present embodiment has a higher emission intensity of a red light-emitting component and can be produced at a lower cost, compared with the conventional fluorescent lamp.

Embodiment 5

Figure 14:
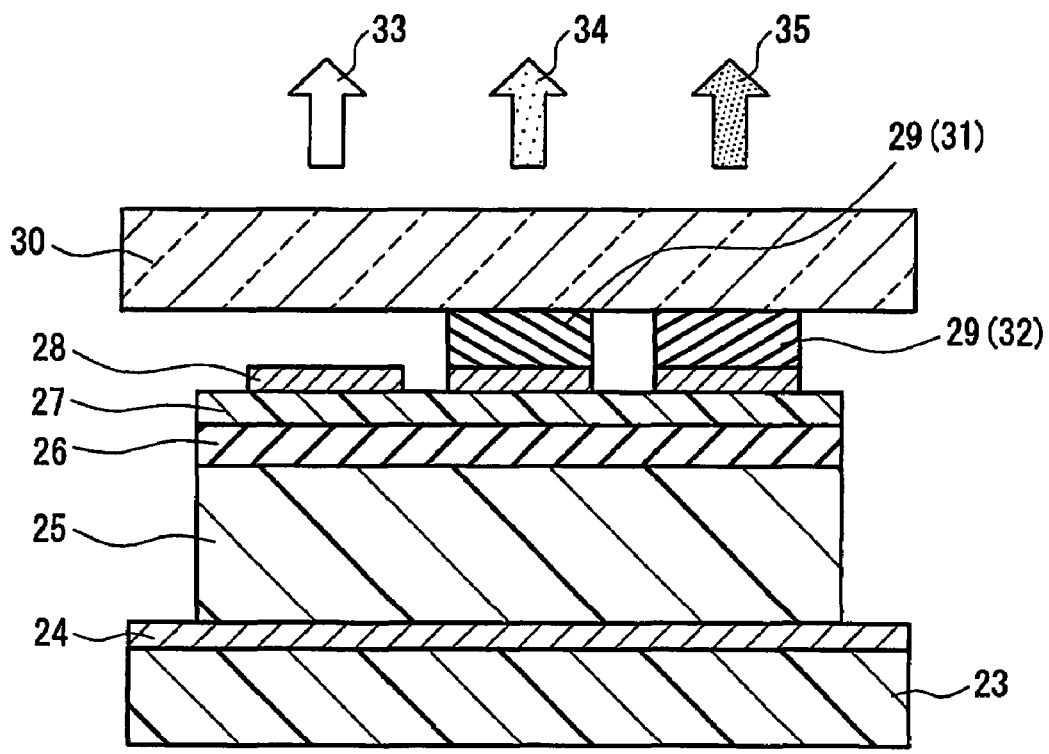
FIG. 14 is a cross-sectional view of an EL panel in the embodiment of the present invention.

FIG. 14 is a cross-sectional view of a double insulating configuration thin film electroluminescence panel, which is an exemplary light-emitting device using the phosphor composition of Embodiment 1. In FIG. 14, a back substrate 23 holds a thin film EL panel, and formed of metal, glass, ceramics, or the like. A lower electrode 24 applies an AC voltage of about 100 to 300 V to a laminated configuration of a thick film dielectric 25/thin film phosphor 26/thin film dielectric 27, and is a metal electrode or an In—Sn—O transparent electrode formed by a procedure such as a printing technique. The thick film dielectric 25 functions as film formation substrate of the thin film phosphor 26, and also limits the amount of charge flowing through the thin film phosphor 26 during the application of the AC voltage. For example, the thick film dielectric 25 is made of a ceramic material such as $BaTiO_3$ with a thickness of 10 μm to several cm. Furthermore, the thin film phosphor 26 is made of an electroluminescence material that emits fluorescence with high luminance when charge flows through the phosphor layer. The thin film phosphor 26 is, for example, a thioaluminate phosphor (blue light-emitting $BaAl_2S_4:Eu^{2+}$, blue light-emitting $(Ba, Mg)Al_2S_4:Eu^{2+}$, etc.), a thiogallate phosphor (blue light-emitting $CaGa_2S_4:Ce^{3+}$, etc.), or the like formed into a film by a thin film technique such as an electron beam vapor evaporation, or sputtering. The thin film dielectric 27 limits the amount of charge flowing through the thin film phosphor 26, and prevents the thin film phosphor 26 from reacting with water vapor in the atmosphere to be degraded. The thin film dielectric 27 is, for example, a translucent dielectric such as silicon oxide or aluminum oxide, formed into a film by a thin film technique such as chemical vapor deposition or sputtering. An upper electrode 28 is paired with the lower electrode 24, and applies an AC voltage of about 100 to 300 V to the laminated configuration of the thick film dielectric 25/thin film phosphor 26/thin film dielectric 27. The upper electrode 28 is, for example, a transparent electrode made of In—Sn—O or the like formed on the upper surface of the thin film dielectric 27 by a thin film technique such as vacuum deposition or sputtering. A light wavelength converting layer 29 converts light (e.g., blue light) emitted by the thin film phosphor 26 and passing through the thin film dielectric 27 and the upper electrode 28 into, for example, green light, yellow light, or red light. The light wavelength converting layer 29 also can be provided in a plurality of kinds. A surface glass 30 protects the double insulating configuration thin film EL panel thus configured.

When an AC voltage of about 100 to 300 V is applied between the lower electrode 24 and the upper electrode 28 of the thin film EL panel, a voltage of about 100 to 300 V is applied to a laminated configuration of the thick film dielectric 25/thin film phosphor 26/thin film dielectric 27, and charge flows through the thin film phosphor 26, whereby the thin film phosphor 26 emits light. This emitted light excites the light wavelength converting layer 29 through the thin film dielectric 27 and the upper electrode 28 having translucency to have its wavelength converted. The light with its wavelength converted passes through the surface glass 30 and is output from the panel to be observed from outside of the panel.

In the embodiment of the light-emitting device using the phosphor composition of Embodiment 1, at least one light wavelength converting layer 29 is configured using the phosphor composition of Embodiment 1, in particular, the phosphor composition emitting red light. Furthermore, in a preferred embodiment, the thin film phosphor 26 is set to be a thin film blue phosphor emitting blue light, and the light wavelength converting layer 29 is composed of a wavelength converting layer 31 for converting light into green light, made of a blue excitation green light-emitting material (e.g., a $SrGa_2S_4:Eu^{2+}$ phosphor), and a wavelength converting layer 32 having the phosphor composition of Embodiment 1 emitting red light, which functions as a wavelength converting layer for converting light into red light. Furthermore, as shown in FIG. 14, a part of blue light emitted by the thin film blue phosphor is output from the panel without exciting the light wavelength converting layer 29. Furthermore, the electrode configuration is set to be a lattice shape that can be driven in a matrix.

When the light-emitting device is designed so as to emit blue light 33 emitted by the thin film phosphor 26, green light 34 with its wavelength converted by the light wavelength converting layer 29 (31), and red light 35 with its wavelength converted by the light wavelength converting layer 29 (32), the light-emitting device emits light of three primary colors (blue, green, and red). Furthermore, the lighting of respective pixels emitting light of blue, green, and red can be controlled independently, so that a display device capable of performing a full-color display can be provided.

In a preferred embodiment of the light-emitting device using the phosphor composition of Embodiment 1, a part of the light wavelength converting layer 29 is configured using the red phosphor composition of Embodiment 1 that is produced easily and stable chemically, and is excited with blue light to emit red light having satisfactory color purity. Thus, a highly reliable light-emitting device having red pixels exhibiting satisfactory red emission characteristics can be provided.

As described above, the present invention can provide a novel phosphor composition capable of emitting light in a warm color (in particular, red light), containing as a main component of a phosphor host, the above-mentioned composition represented by a composition formula: $aM_3N_2 \cdot bAlN \cdot cSiN_4$. The present invention also can provide a method for producing a nitride phosphor composition of the present invention, which is suitable for mass-production and can be produced at a low cost. Furthermore, according to the present invention, by using a novel nitride phosphor composition with a high efficiency, a light-emitting device also can be provided, which has a high emission intensity of a light-emitting component in a warm color (in particular, red) and is inexpensive, and is novel in terms of the configuration of materials to be used.

Hereinafter, the present invention will be described specifically by way of examples.

EXAMPLE 1

As the nitride phosphor composition of the present invention, a phosphor composition substantially represented by $Sr_{0.98}Eu_{0.02}AlSiN_3$ was produced as follows.

In the present example, the following compounds were used as phosphor ingredients.

(1) Strontium nitride powder ($Sr_3N_2$: purity 99.5%): 25.00 g (2) Europium oxide powder ($Eu_2O_3$: purity 99.9%): 0.93 g (3) Silicon nitride powder ($Si_3N_4$: purity 99%): 13.00 g (4) Aluminum nitride powder (AlN: purity 99.9%): 10.78 g These phosphor ingredients were weighed in a nitrogen atmosphere using a glove box, and then mixed thoroughly with a mortar. Thereafter, the mixed powder was placed in an alumina crucible. The alumina crucible was placed at a predetermined position in an atmospheric furnace, and heated in nitrogen-hydrogen mixed gas (97% nitrogen and 3% hydrogen) at 1600° C. for 2 hours. For simplicity, the aftertreatments such as pulverizing, classification, and washing are omitted.

Hereinafter, the characteristics of the fired product (SrAlSiN$_3$:Eu$^{2+}$ phosphor composition) obtained by the above-mentioned production method will be described.

Figure 15:
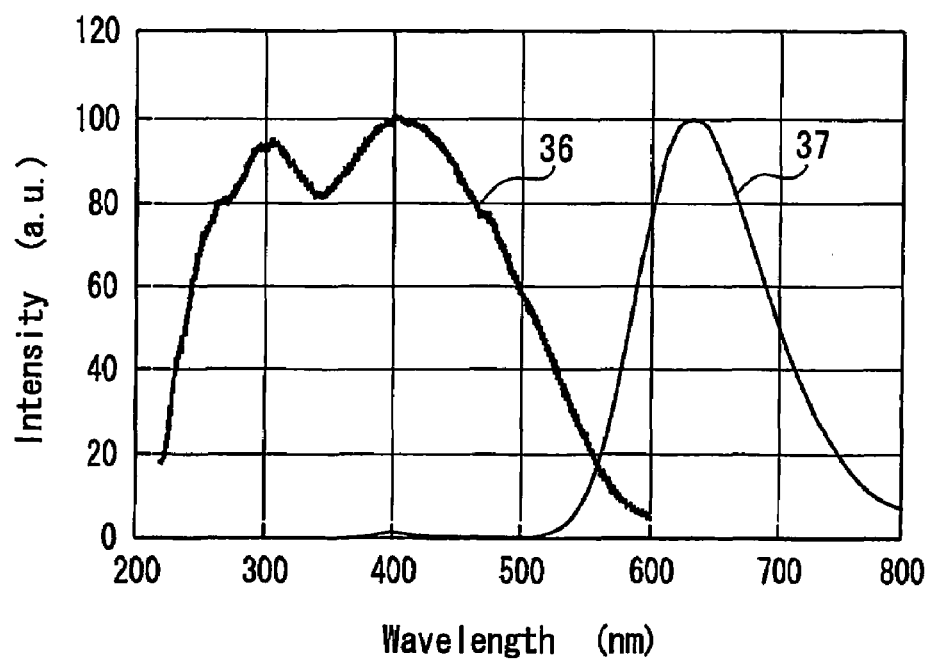
FIG. 15 is a diagram showing an emission spectrum and an excitation spectrum of a phosphor composition in Example 1 of the present invention.

The body color of the above-mentioned phosphor composition was vibrant orange. FIG. 15 shows an emission spectrum (254 nm excitation) 37 and an excitation spectrum 36 of the phosphor composition of the present example obtained by the above-mentioned production method. FIG. 15 shows that the above-mentioned fired product is a red phosphor having an emission peak in the vicinity of a wavelength of 635 nm, which is excited with light in a large wavelength range of 220 nm to 600 nm (i.e., ultraviolet light—near-ultraviolet light—violet light—blue light—green light—yellow light—orange light). The chromaticity (x, y) of emitted light in a CIE chromaticity coordinate was x=0.612 and y=0.379.

Constituent metal elements of the above-mentioned fired product were evaluated by semiquantitative analysis using a fluorescent X-ray analysis method. Consequently, the fired product was found to be a compound mainly containing Sir, Eu, Al, and Si.

These results suggest that a composition represented by (Sr$_{0.98}$Eu$_{0.02}$)AlSiN$_3$ was produced and an SrAlSiN$_3$:Eu$^{2+}$ phosphor was produced by the production method of the present example.

Figure 16:
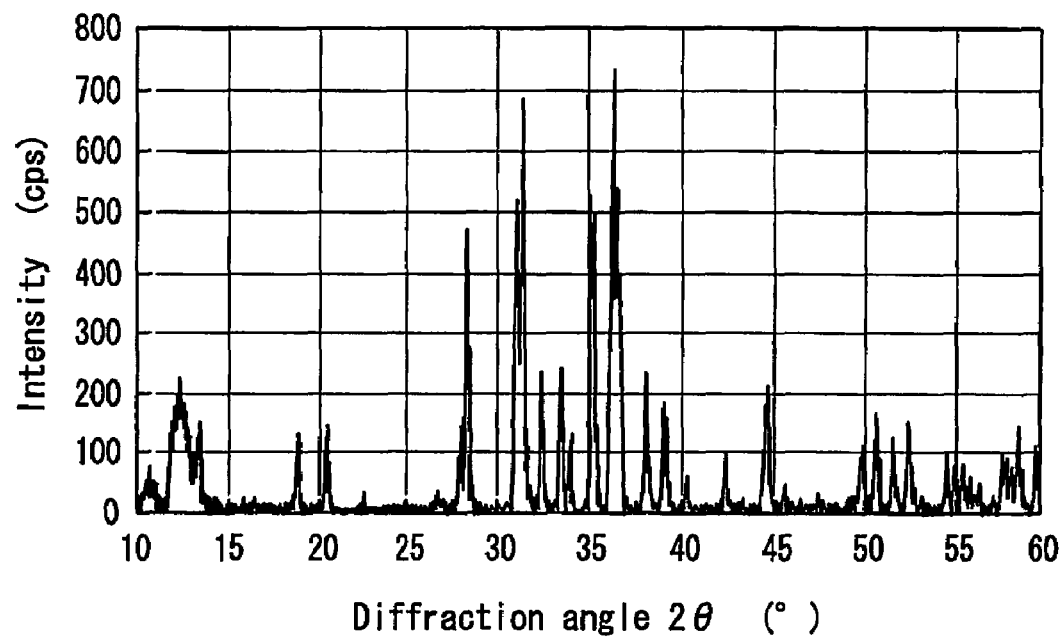
FIG. 16 is a diagram showing an X-ray diffraction pattern of the phosphor composition in Example 1 of the present invention.

For reference, FIG. 16 shows an X-ray diffraction pattern of the phosphor composition of the present example. As shown in FIG. 16, it is understood that the phosphor composition of the present example is at least a crystalline phosphor in which a plurality of strong diffraction peaks, different from the diffraction peak of a phosphor ingredient such as an alkaline-earth metal oxide, silicon nitride, or aluminum nitride, or the diffraction peak of a conventionally known Sr$_2$Si$_5$N$_8$ compound, are recognized in the vicinity of a diffraction angle (2θ) of 28° to 37° in the diffraction pattern evaluation by the X-ray diffraction method under normal pressure and temperature using a Cu—Kα ray.

In the present example, it is considered based on the following Chemical Reaction Formula 1 that a compound represented by a chemical formula: (Sr$_{0.98}$Eu$_{0.02}$)AlSiN$_3$, or a composition represented by a composition formula: (Sr$_{0.98}$Eu$_{0.02}$)AlSiN$_3$ or a composition formula dose thereto was generated.

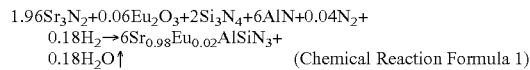

Thus; according to the production method of the present invention, although Sr$_3$N$_2$ that is unstable chemically, difficult to handle in the atmosphere, and expensive was used, a SrAlSiN$_3$:Eu$^{2+}$ phosphor was produced.

In the present example, the case of the nitride phosphor composition containing Eu$^{2+}$ ions as a luminescent center ion has been described. A phosphor composition containing a luminescent center ion (e.g., Ce$^{3+}$ ions) other than Eu$^{2+}$ ions also can be produced by the same production method.

EXAMPLE 2

As the nitride phosphor composition of the present invention, a phosphor composition substantially represented by Sr$_{0.98}$Eu$_{0.02}$AlSiN$_3$ was produced by a production method different from that of Example 1 as follows.

In the present example, the following compounds were used as phosphor ingredients.

(1) Strontium carbonate powder (SrCO$_3$: purity 99.9%): 2.894 g (2) Europium oxide powder (Eu$_2$O$_3$: purity 99.9%): 0.070 g (3) Silicon nitride powder (Si$_3$N$_4$: purity 99%): 0.988 g (4) Aluminum nitride powder (AlN: purity 99.9%): 0.820 g Furthermore, as the reducing agent (added reducing agent) of the above-mentioned strontium carbonate and europium oxide, the following solid-state carbon was used.

(5) Carbon (graphite) powder (C: purity 99.9%): 0.240 g

First, these phosphor ingredients and the added reducing agent were mixed thoroughly with an automatic mortar. Thereafter, the mixed powder was placed in an alumina crucible. The alumina crucible was placed at a predetermined position in an atmospheric furnace, and heated in nitrogen-hydrogen mixed gas (97% nitrogen and 3% hydrogen) at 1600° C. for 2 hours. For simplicity, the aftertreatments such as pulverizing, classification, and washing are omitted.

Hereinafter, the characteristics of the fired product (SrAlSiN$_3$:Eu$^{2+}$ phosphor composition) obtained by the above-mentioned production method will be described.

Figure 17:
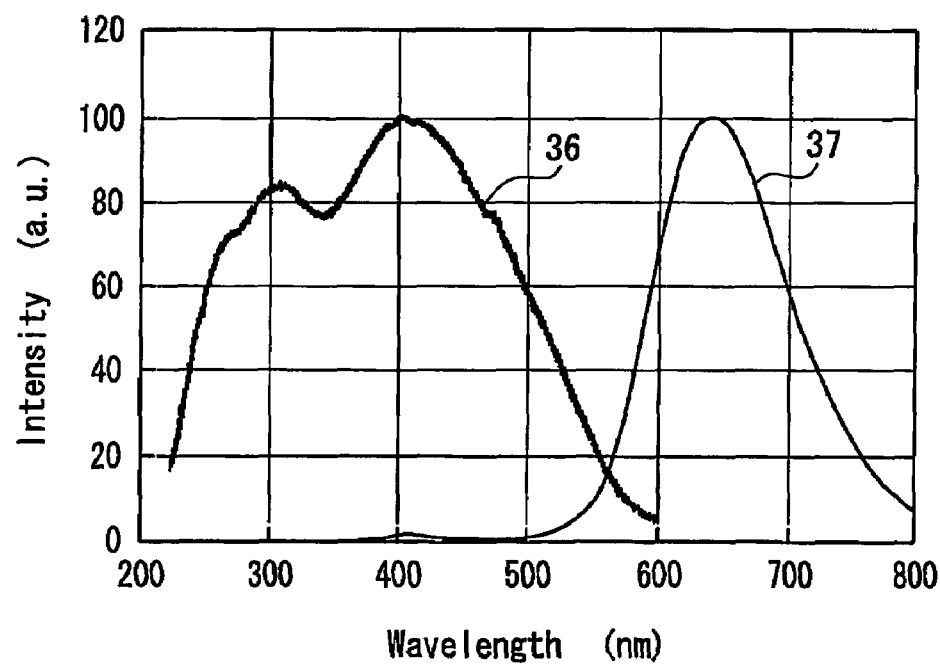
FIG. 17 is a diagram showing an emission spectrum and an excitation spectrum of a phosphor composition in Example 2 of the present invention.

The body color of the above-mentioned phosphor composition was orange. FIG. 17 shows an emission spectrum (254 nm excitation) 37 and an excitation spectrum 36 of the phosphor composition of the present example obtained by the above-mentioned production method. FIG. 17 shows that the above-mentioned fired product is a red phosphor having an emission peak in the vicinity of a wavelength of 640 nm, which is excited with light in a large wavelength range of 220 nm to 600 nm i.e., ultraviolet light—near-ultraviolet light—violet light—blue light—green light—yellow light—orange light.

Constituent metal elements of the above-mentioned fired product were evaluated by semiquantitative analysis using a fluorescent X-ray analysis method. Consequently, the fired product was found to be a compound mainly containing Sr, Eu, Al, and Si.

These results suggest that a composition represented by (Sr$_{0.98}$Eu$_{0.02}$)AlSiN$_3$ was produced and an SrAlSiN$_3$:Eu$^{2+}$ phosphor was produced by the production method of the present example.

Figure 18:
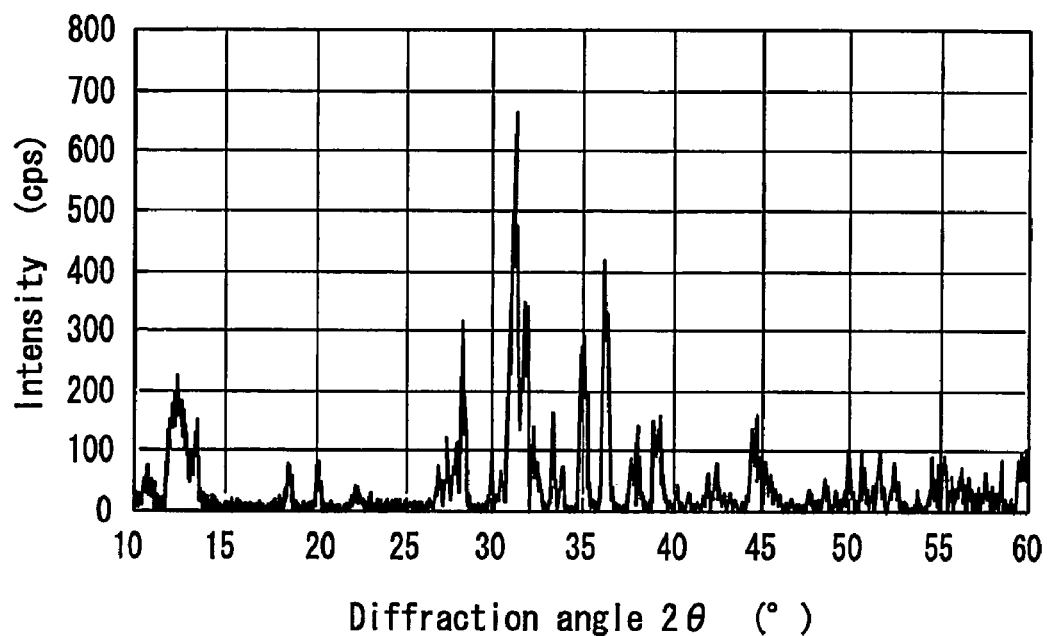
FIG. 18 is a diagram showing an X-ray diffraction pattern of the phosphor composition in Example 2 of the present invention.

For reference, FIG. 18 shows an X-ray diffraction pattern of the phosphor composition of the present example. As shown in FIG. 18, it is understood that the phosphor composition of the present example is at least a crystalline phosphor in which a plurality of strong diffraction peaks, different from the diffraction peak of a phosphor ingredient such as an alkaline-earth metal oxide, silicon nitride, or aluminum nitride, or the diffraction peak of a conventionally known Sr$_2$Si$_5$N$_8$ compound, are recognized in the vicinity of a diffraction angle (2θ) of 30° to 37° in the diffraction pattern evaluation by the X-ray diffraction method under normal pressure and temperature using a Cu—Kα ray.

In the present example, it is considered based on the following Chemical Reaction Formula 2 that SrO of an alkaline-earth metal oxide was reacted with nitrogen and silicon nitride while being substantially reduced by carbon together with EuO as a lanthanide oxide, whereby a compound represented by a chemical formula: (Sr$_{0.98}$Eu$_{0.02}$)AlSiN$_3$, or a composition represented by a composition formula: $(Sr_{0.98}Eu_{0.02})AlSiN_3$ or a composition formula dose thereto was generated.

$0.98SrCO_3+0.01Eu_2O_3+(1/3)Si_3N_4+AlN+C+(1/3)N_2+$
$0.01H_2 \rightarrow Sr_{0.98}Eu_{0.02}AlSiN_3+0.98CO_2\uparrow+CO\uparrow+$
$0.01H_2O\uparrow$ (Chemical Reaction Formula 2)

Thus, according to the production method of the present invention, a $SrAlSiN_3:Eu^{2+}$ phosphor was produced using strontium carbonate that is easy to handle and inexpensive as a supply source of alkaline-earth metal, without using Sr metal or $Sr_3N_2$ that is unstable chemically, difficult to handle in the atmosphere, and expensive.

Hereinafter, the characteristics of the $SrAlSiN_3:Eu^{2+}$ phosphor composition of Example 2 will be described in the case where the replacement ratio of Eu (=Eu replacement amount: Eu/(Sr+Eu)×100 (atomic %)) with respect to Sr is varied.

Figure 19:
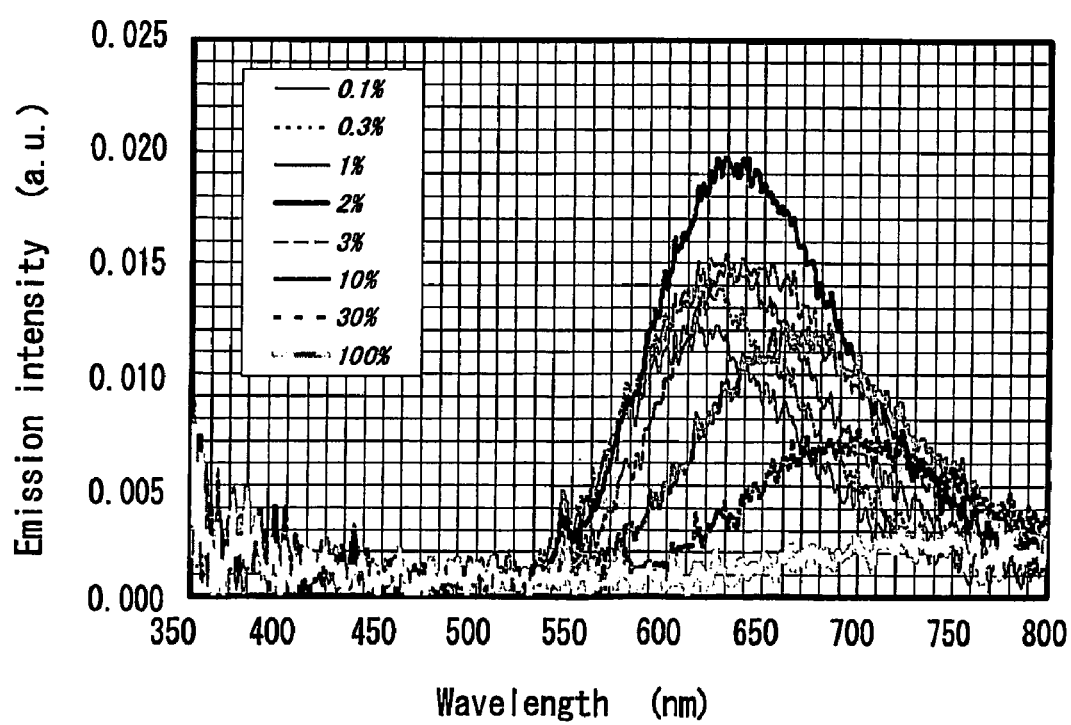
FIG. 19 is a diagram showing an emission spectrum of a phosphor composition related to Example 2 of the present invention.

FIG. 19 shows emission spectra of the $SrAlSiN_3:Eu^{2+}$ phosphor compositions having different Eu replacement amounts under the excitation with a UV-ray of 254 nm. As is understood from FIG. 19, the emission peak wavelength shifted gradually from about 615 nm (Eu replacement amount: 0.1 to 0.3 atomic %) to a long wavelength side, and varied within a range up to about 750 nm (Eu replacement amount: 100 atomic %), as the Eu replacement amount increased. Furthermore, as the Eu replacement amount increased, the emission peak intensity increased gradually, and decreased gradually after the Eu replacement amount exhibited a maximum value in the vicinity of 1 to 3 atomic %. Even when the composition was excited with ultraviolet light—near-ultraviolet light—violet light—blue light—green light in a wavelength range of 250 nm to 550 nm, there was hardly any change in a peak position of an emission spectrum.

Figure 20:
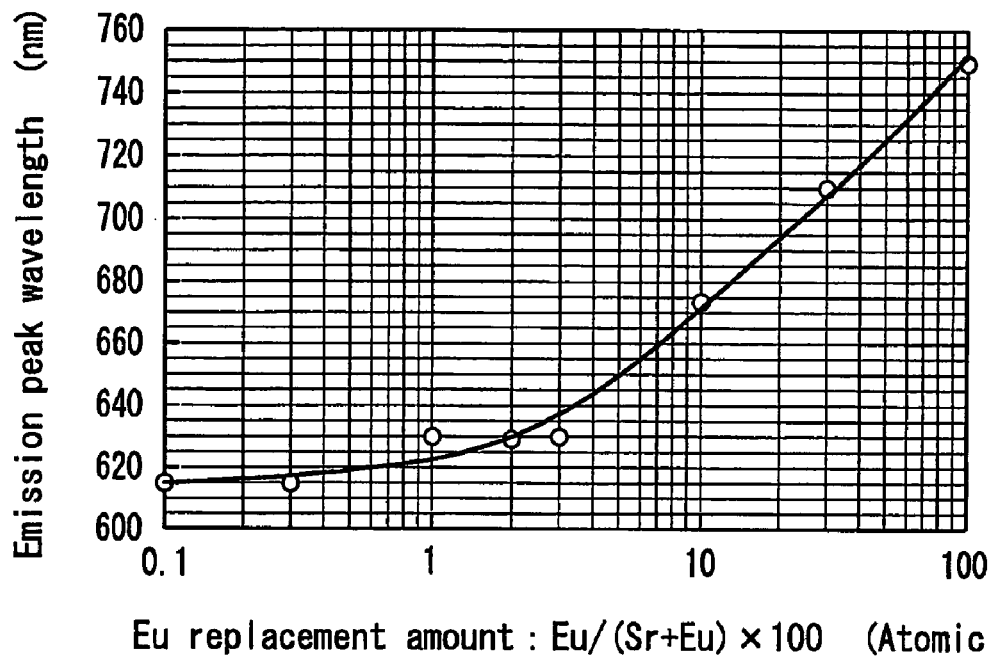
FIG. 20 is a diagram showing the relationship between an Eu replacement amount and an emission peak wavelength of the phosphor composition related to Example 2 of the present invention.
Figure 21:
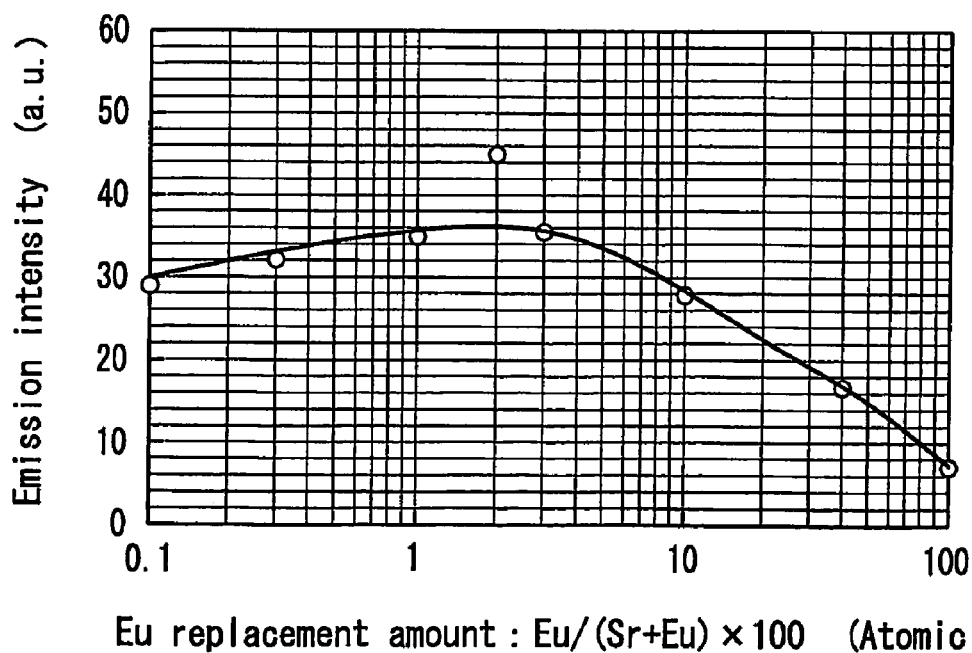
FIG. 21 is a diagram showing the relationship between an Eu replacement amount and an emission intensity of the phosphor composition related to Example 2 of the present invention.

FIG. 20 shows a summary of the relationship between the Eu replacement amount of the $SrAlSiN_3:Eu^{2+}$ phosphor composition with respect to an alkaline-earth metal element (Sr) and the emission peak wavelength thereof. Considering that the emission peak wavelength suitable for a light-emitting device is 610 nm to 660 nm, preferably 620 nm to 650 nm, it is understood from FIG. 20 that the Eu replacement amount preferable as a red phosphor for a light-emitting device is 0.1 atomic % to less than 7 atomic %:

Furthermore, FIG. 21 shows a summary of the relationship between the Eu replacement amount of the $SrAlSiN_3:Eu^{2+}$ phosphor composition with respect to an alkaline-earth metal element (Sr) and the emission peak height (emission intensity). Even in the case where the peak wavelength of an excitation light source is varied in a wavelength range of 250 nm to 550 nm, the same tendency is recognized. It is understood from FIG. 21 that the Eu replacement amount preferable in terms of the emission intensity is 0.3 atomic % to less than 6 atomic %, preferably 1 atomic % to less than 4 atomic %.

More specifically, it is understood from FIGS. 20 and 21 that the Eu replacement amount preferable as a red phosphor for a light-emitting device is 0.1 atomic % to 7 atomic %, preferably 1 atomic % to less than 4 atomic %.

In the present example, the case of the nitride phosphor composition containing $Eu^{2+}$ ions as a luminescent center ion has been described A phosphor composition containing a luminescent center ion other than $Eu^{2+}$ ions also can be produced by the same production method.

EXAMPLE 3

As the nitride phosphor composition of the present invention, a phosphor composition substantially represented by $Sr_{0.98}Ce_{0.02}AlSiN_3$ was produced as follows.

In the present example, the following compounds were used as phosphor ingredients.

(1) Strontium carbonate powder ($SrCO_3$: purity 99.9%): 2.894 g
(2) Cerium oxide powder ($CeO_2$: purity 99.99%): 0.069 g
(3) Silicon nitride powder ($Si_3N_4$: purity 99%): 0.988 g
(4) Aluminum nitride powder (AlN: purity 99.9%): 0.820 g Furthermore, as the reducing agent of the above-mentioned strontium carbonate and cerium oxide, the following solid-state carbon was used.

(5) Carbon (graphite) powder (C: purity 99.9%): 0.240 g

Using these phosphor ingredients, a phosphor composition was produced by the same procedure/condition as that of Example 2.

Hereinafter, the characteristics of the fired product ($SrAlSiN_3:Ce_{3+}$ phosphor composition) obtained by the above-mentioned production method will be described.

Figure 22:
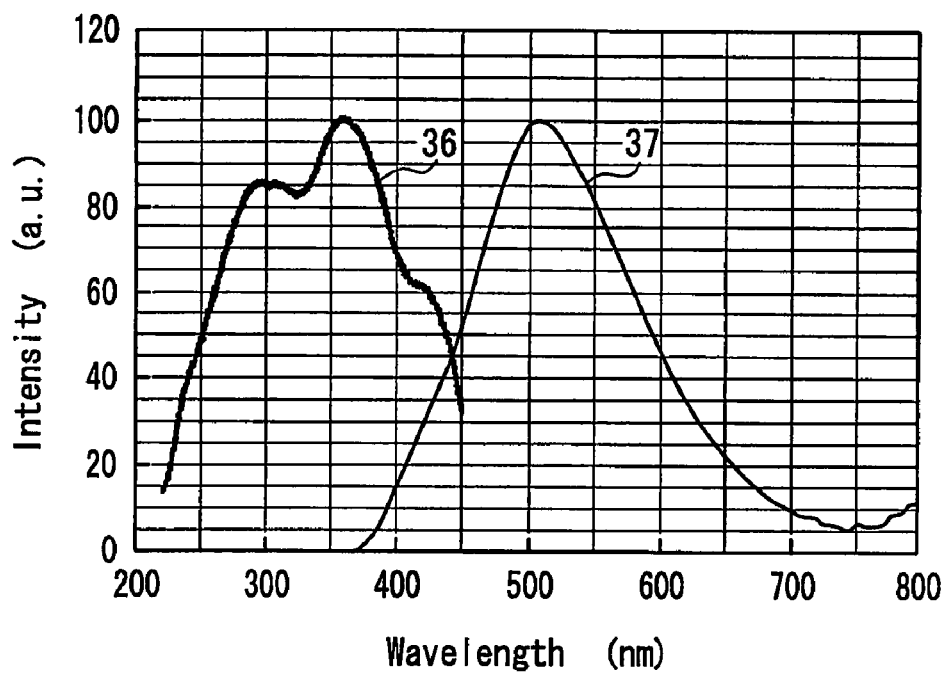
FIG. 22 is a diagram showing an emission spectrum and an excitation spectrum of a phosphor composition in Example 3 of the present invention.

The body color of the above-mentioned phosphor composition was white taking on blue-green. FIG. 22 shows an emission spectrum (254 nm excitation) 37 and an excitation spectrum 36 of the phosphor composition of the present example obtained by the above-mentioned production method. FIG. 22 shows that the above-mentioned fired product is a blue-green phosphor having an emission peak in the vicinity of a wavelength of 504 nm, which is excited with light in a large wavelength range of 220 nm to 450 nm (i.e., ultraviolet light—near-ultraviolet light—violet light—blue light).

These results suggest that a composition represented by $SrAlSiN_3:Ce^{3+}$ was produced by the production method of the present example.

Even in the present example, it is considered based on the same Chemical Reaction Formula as that of Example 2 that SrO of an alkaline-earth metal oxide was reacted with nitrogen and silicon nitride while being substantially reduced by carbon together with $CeO_2$ as a lanthanide oxide, whereby a composition represented by a composition formula close to $(Sr_{0.98}Ce_{0.02})AlSiN_3$ was generated.

Thus, according to the production method of the present example, a $SrAlSiN_3:Ce^{3+}$ phosphor was produced using strontium carbonate that is easy to handle and inexpensive as a supply source of alkaline-earth metal, without using Sr metal or $Sr_3N_2$ that is unstable chemically, difficult to handle in the atmosphere, and expensive.

EXAMPLE 4

As the nitride phosphor composition of the present invention, a phosphor composition substantially represented by $Ca_{0.98}Eu_{0.02}AlSiN_3$ was produced as follows.

In the present example, a phosphor composition was produced by the same production method and under the same firing condition as those of Example 2, except for using the following materials as phosphor ingredients and an added reducing agent (carbon powder).

(1) Calcium carbonate powder ($CaCO_3$: purity 99.9%): 1.962 g
(2) Europium oxide powder ($Eu_2O_8$: purity 99.9%): 0.070 g
(3) Silicon nitride powder ($Si_3N_4$: purity 99%): 0.988 g (4) Aluminum nitride powder (AlN: purity 99.9%): 0.820 g
(5) Carbon (graphite) powder (C: purity 99.9%): 0.240 g Hereinafter, the characteristics of the fired product (CaAlSiN$_3$:Eu$^{2+}$ phosphor composition) obtained by the above-mentioned production method will be described.

Figure 23:
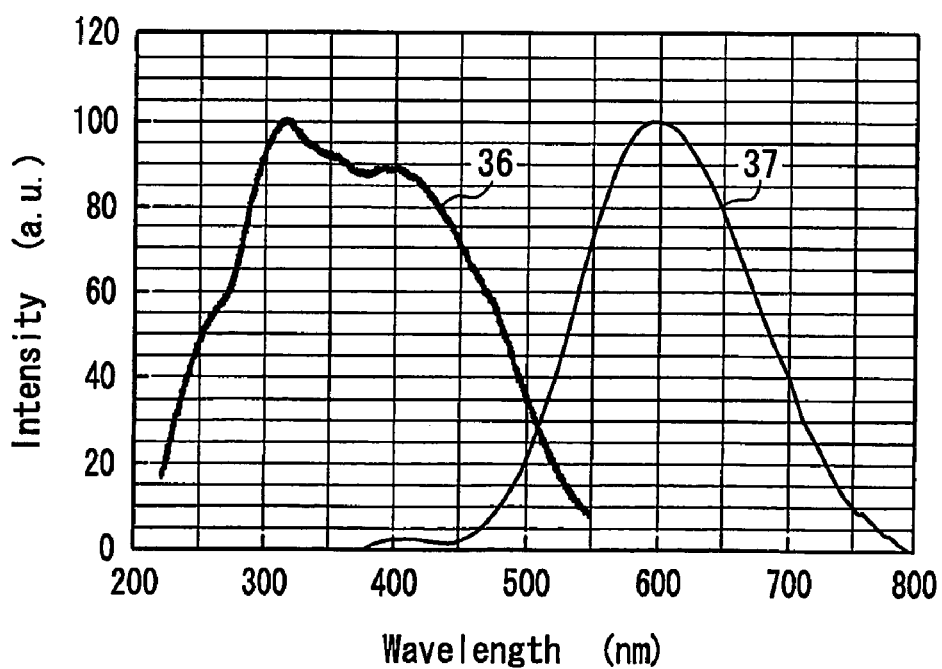
FIG. 23 is a diagram showing an emission spectrum and an excitation spectrum of a phosphor composition in Example 4 of the present invention.
Figure 24:
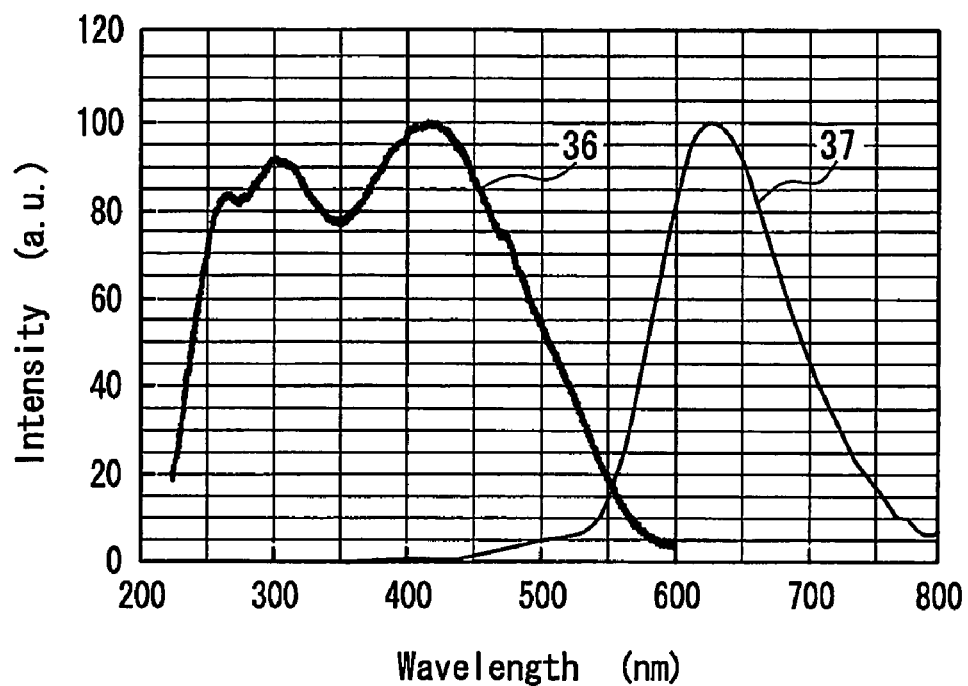
FIG. 24 is a diagram showing an emission spectrum and an excitation spectrum of a phosphor composition in Example 5 of the present invention.
Figure 25:
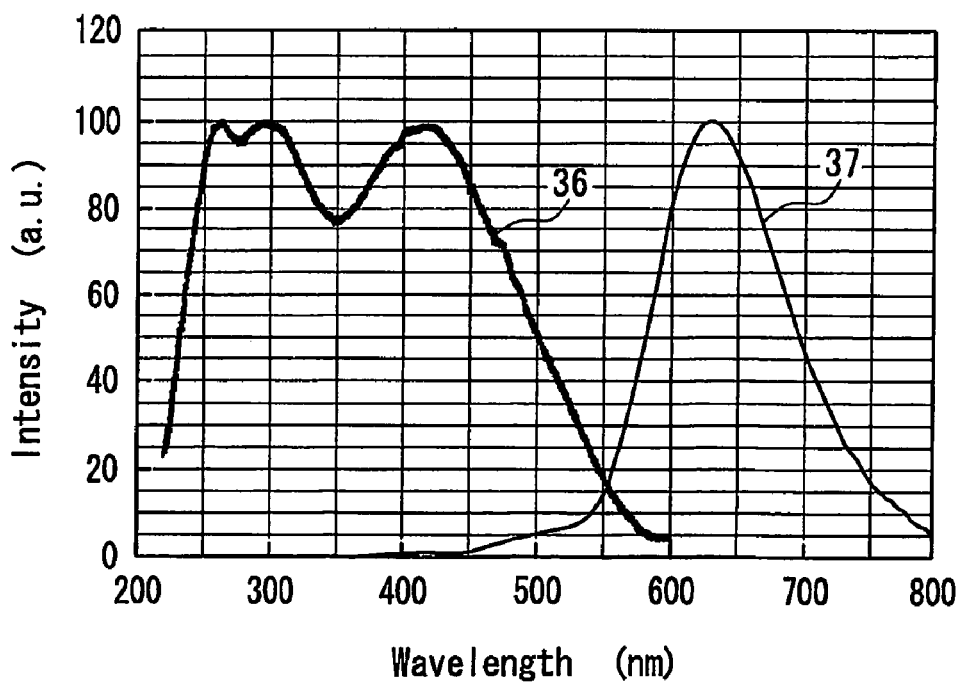
FIG. 25 is a diagram showing an emission spectrum and an excitation spectrum of a phosphor composition in Example 6 of the present invention.
Figure 26:
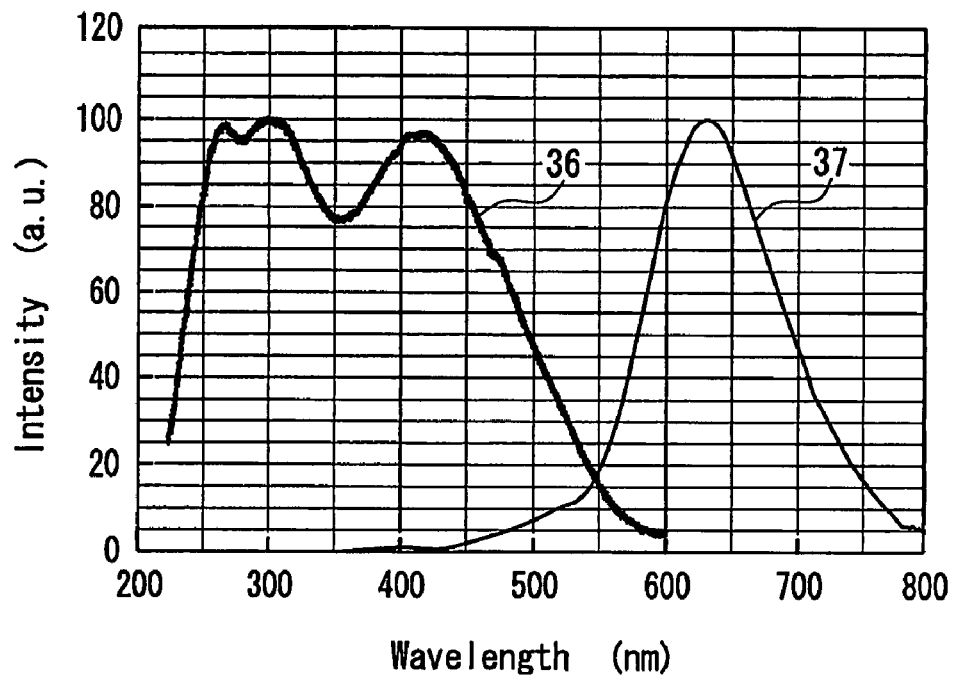
FIG. 26 is a diagram showing an emission spectrum and an excitation spectrum of a phosphor composition in Example 7 of the present invention.
Figure 27:
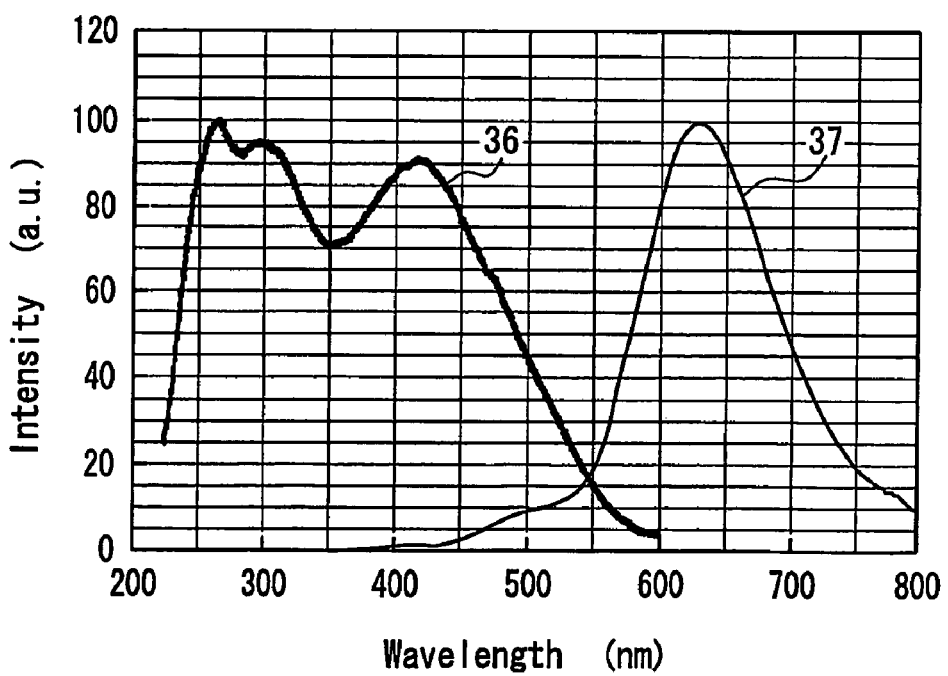
FIG. 27 is a diagram showing an emission spectrum and an excitation spectrum of a phosphor composition in Example 8 of the present invention.

The body color of the above-mentioned phosphor was orange. FIG. 23 shows an emission spectrum (254 nm excitation) 37 and an excitation spectrum 36 of the phosphor composition of the present example obtained by the above-mentioned production method. FIG. 23 shows that the above-mentioned fired product is a red-orange phosphor having an emission peak in the vicinity of a wavelength of 600 nm, which is excited with light in a large wavelength range of 220 nm to 550 nm (i.e., ultraviolet light—near-ultraviolet light—violet light—blue light—green light). The chromaticity (x, y) of emitted light in a CIE chromaticity coordinate was x=0.496 and y=0.471.

Constituent metal elements of the above-mentioned fired product were evaluated by semiquantitative analysis using a fluorescent X-ray analysis method. Consequently, the fired product was found to be a compound mainly containing Ca, Eu, Al, and Si.

These results suggest that a composition represented by (Ca$_{0.98}$Eu$_{0.02}$)AlSiN$_3$ was produced and a CaAlSiN$_3$:Eu$^{2+}$ phosphor was produced by the production method of the present example.

In the present example, it is considered based on the following Chemical Reaction Formula 3 that CaO of an alkaline-earth metal oxide was reacted with nitrogen and silicon nitride while being substantially reduced by carbon together with EuO as a lanthanide oxide, whereby a compound represented by a chemical formula: (Ca$_{0.98}$Eu$_{0.02}$)AlSiN$_3$, or a composition represented by a composition formula: (Ca$_{0.98}$Eu$_{0.02}$)AlSiN$_3$ or a composition formula dose thereto was generated.

0.98CaCO$_3$+0.01Eu$_2$O$_3$+(1/3)Si$_3$N$_4$+AlN+C+(1/3)
N$_2$+0.01H$_2$→Ca$_{0.98}$Eu$_{0.02}$AlSiN$_3$+0.98CO$_2$↑+
CO↑+0.01H$_2$O↑ (Chemical Reaction Formula 3)

Thus, according to the production method of the present example, a CaAlSiN$_3$:Eu$^{2+}$ phosphor was produced using calcium carbonate that is easy to handle and inexpensive as a supply source of alkaline-earth metal, without using Ca metal or Ca$_3$N$_2$ that is unstable chemically, difficult to handle in the atmosphere, and expensive.

In the present example, the case of the nitride phosphor composition containing Eu$^{2+}$ ions as a luminescent center ion has been described. A phosphor composition containing a luminescent center ion (e.g., Ce$^{3+}$ ions) other than Eu$^{2+}$ ions also can be produced by the same production method.

Furthermore, in the present example, the case of the production method using carbon powder as an added reducing agent has been described. A CaAlSiN$_3$:Eu$^{2+}$ phosphor can be produced similarly even by the same production method as that of Example 1, using, as phosphor ingredients, for example, a nitride of an alkaline-earth metal element, calcium, (Ca$_3$N$_2$), silicon nitride (Si$_3$N$_4$), aluminum nitride (AlN), and an Eu material (europium oxide (Eu$_2$O$_3$), europium nitride (EuN), metal Eu, etc.) without using an added reducing agent.

By appropriately selecting the addition amount of Eu$^{2+}$ and production condition, red light having an emission peak in a wavelength range of 610 nm to less than 650 nm also can be obtained from the CaAlSiN$_3$:Eu$^{2+}$ phosphor. The CaAlSiN$_3$:Eu$^{2+}$ phosphor may be a red phosphor.

EXAMPLES 5 TO 8

Hereinafter, as the phosphor compositions of Examples 5 to 8 according to the present invention, phosphor compositions each containing, as a main component of a phosphor host, a nitride substantially represented by SrAlSiN$_3$.a'Si$_3$N$_4$ were produced as follows.

As an example, a method for producing phosphor compositions with 2 atomic % of Sr replaced by Eu, respectively containing, as a phosphor host, compositions with the numerical value of a' being 0.5, 0.75, 1, and 2 (i.e., 2 SrAlSiN$_3$.Si$_3$N$_4$, 4 SrAlSiN$_3$.3Si$_3$N$_4$, SrAlSiN$_3$.Si$_3$N$_4$, and SrAlSiN$_3$.2 Si$_3$N$_4$), and the characteristics thereof will be described.

In the production of the above-mentioned compositions, the same phosphor ingredients and added reducing agent as those described in Example 2 have been used. The phosphor compositions were produced and evaluated by the same procedure and under the same condition as those in Example 2, except that the mixed ratios were set to be the weight ratios shown in Table 1.

TABLE 1

| | Composition formula | SrCO$_3$ | Eu$_2$O$_3$ | Si$_3$N$_4$ | AlN | C |
|---|---|---|---|---|---|---|
| Example 5 | 2(Sr$_{0.98}$Eu$_{0.02}$)AlSiN$_3$•Si$_3$N$_4$ | 5.787 g | 0.141 g | 4.942 g | 1.639 g | 0.480 g |
| Example 6 | 4(Sr$_{0.98}$Eu$_{0.02}$)AlSiN$_3$•3Si$_3$N$_4$ | 11.574 g | 0.282 g | 12.849 g | 3.279 g | 0.961 g |
| Example 7 | (Sr$_{0.98}$Eu$_{0.02}$)AlSiN$_3$•Si$_3$N$_4$ | 2.894 g | 0.070 g | 3.953 g | 0.820 g | 0.240 g |
| Example 8 | (Sr$_{0.98}$Eu$_{0.02}$)AlSiN$_3$•2Si$_3$N$_4$ | 2.894 g | 0.070 g | 6.919 g | 0.820 g | 0.240 g |

Hereinafter, the characteristics of the phosphor compositions thus obtained will be described.

The body colors of the phosphor compositions were all orange. As a representative example, FIGS. 24 to 27 show an emission spectrum (254 nm excitation) 37 and an excitation spectrum 36 of the phosphor compositions of Examples 5 to 8 obtained by the above-mentioned production method. FIGS. 24 to 27 show that the above-mentioned fired products are all red phosphors having an emission peak in the vicinity of a wavelength of 640 nm, which are excited with light in a large wavelength range of 220 nm to 600 nm (i.e., ultraviolet light—near-ultraviolet light—violet light—blue light—green light—yellow light—orange light).

Although detailed data is omitted, even in the phosphor composition in which Eu$^{2+}$ ions were added to the composition with Sr$_2$Si$_5$N$_8$, SrSiN$_2$, and SrSi$_7$N$_{10}$ excessively added to the above-mentioned SrAlSiN$_3$ (i.e., the nitride phosphor composition with Eu$^{2+}$ ions added thereto as an example of a luminescent center, containing, as a phosphor host, a composition substantially represented by SrAlSiN$_3$.a'Sr$_2$Si$_5$N$_8$, SrAlSiN$_3$.a'SrSiN$_2$, or the like), as well as the phosphor composition in which $Eu^{2+}$ ions were added to the composition with $Si_3N_4$ added excessively to $SrAlSiN_3$ as described in Examples 5 to 8, the same emission characteristics as those of the above-mentioned phosphor composition in which $Eu^{2+}$ ions were added to a composition with $Si_3N_4$ excessively added thereto, were recognized. The above-mentioned a' is a numerical value satisfying $0 \leq a' \leq 2$, preferably $0 \leq a' \leq 1$, specifically, a numerical value such as 0, 0.25, 0.33, 0.5, 0.67, 0.75, 1, 1.5, or 2. Therefore, a' also can be set to be a numerical value satisfying $0.25 \leq a' \leq 2$, preferably $0.25 \leq a' \leq 1$.

It has not been confirmed whether excess $Si_3N_4$, $Sr_2Si_5N_8$, $SrSiN_2$, and $SrSi_7N_{10}$ are present in these phosphor compositions together with the above-mentioned $SrAlSiN_3$, or contribute to the formation of novel compounds such as $Sr_2Al_2Si_5N_{10}$, $Sr_4Al_4Si_{13}N_{24}$, $SrAlSi_4N_7$, $SrAlSi_7N_{11}$, $Sr_4Al_2Si_7N_{14}$, $Sr_3AlSi_6N_{11}$, $Sr_5AlSi_{11}N_{19}$, $Sr_3Al_2Si_3N_8$, $Sr_2AlSi_2N_5$, $Sr_3AlSi_3N_7$, $Sr_3Al_2Si_9N_{16}$, $Sr_2AlSi_8N_{13}$, and $Sr_3AlSi_{15}N_{23}$ to allow these novel compounds to function as a phosphor host. It is necessary to investigate using various kinds of crystal structure analysis procedures, and both cases may be possible.

EXAMPLES 9 TO 25

As the phosphor compositions of Examples 9 to 25 of the present invention, phosphor compositions containing, as a main component of a phosphor host, a composition substantially represented by $aSr_3N_2.bAlN.cSi_3N_4$ were produced as follows.

As an example, Tables 2, 3, and 6 show phosphor compositions with 2 atomic % of Sr replaced by Eu with the numerical values of "a", "b", and "c" being those shown in Table 2, and the production method and characteristics thereof will be described. Although the phosphor compositions in Tables 2, 3, and 6 may be represented differently, they have the same composition ratios, respectively.

TABLE 2

| | a | b | c | Phosphor composition |
|---|---|---|---|---|
| Example 9 | 2 | 3 | 2 | $2(Sr_{0.98}Eu_{0.02})_3N_2 \cdot 3AlN \cdot 2Si_3N_4$ |
| Example 10 | 1 | 1 | 1 | $(Sr_{0.98}Eu_{0.02})_3N_2 \cdot AlN \cdot Si_3N_4$ |
| Example 11 | 4 | 3 | 4 | $4(Sr_{0.98}Eu_{0.02})_3N_2 \cdot 3AlN \cdot 4Si_3N_4$ |
| Example 12 | 1 | 2 | 1 | $(Sr_{0.98}Eu_{0.02})_3N_2 \cdot 2AlN \cdot Si_3N_4$ |
| Example 13 | 1 | 1 | 2 | $(Sr_{0.98}Eu_{0.02})_3N_2 \cdot AlN \cdot 2Si_3N_4$ |
| Example 14 | 5 | 3 | 11 | $5(Sr_{0.98}Eu_{0.02})_3N_2 \cdot 3AlN \cdot 11Si_3N_4$ |
| Example 15 | 7 | 3 | 16 | $7(Sr_{0.98}Eu_{0.02})_3N_2 \cdot 3AlN \cdot 16Si_3N_4$ |
| Example 16 | 4 | 6 | 7 | $4(Sr_{0.98}Eu_{0.02})_3N_2 \cdot 6AlN \cdot 7Si_3N_4$ |
| Example 17 | 2 | 3 | 8 | $2(Sr_{0.98}Eu_{0.02})_3N_2 \cdot 3AlN \cdot 8Si_3N_4$ |
| Example 18 | 1 | 1 | 5 | $(Sr_{0.98}Eu_{0.02})_3N_2 \cdot AlN \cdot 5Si_3N_4$ |
| Example 19 | 4 | 3 | 22 | $4(Sr_{0.98}Eu_{0.02})_3N_2 \cdot 3AlN \cdot 22Si_3N_4$ |
| Example 20 | 1 | 2 | 3 | $(Sr_{0.98}Eu_{0.02})_3N_2 \cdot 2AlN \cdot 3Si_3N_4$ |
| Example 21 | 1 | 3 | 10 | $(Sr_{0.98}Eu_{0.02})_3N_2 \cdot 3AlN \cdot 10Si_3N_4$ |
| Example 22 | 1 | 2 | 3 | $(Sr_{0.98}Eu_{0.02})_3N_2 \cdot 2AlN \cdot 3Si_3N_4$ |
| Example 23 | 5 | 6 | 14 | $5(Sr_{0.98}Eu_{0.02})_3N_2 \cdot 6AlN \cdot 14Si_3N_4$ |
| Example 24 | 7 | 6 | 19 | $7(Sr_{0.98}Eu_{0.02})_3N_2 \cdot 6AlN \cdot 19Si_3N_4$ |
| Example 25 | 9 | 6 | 24 | $9(Sr_{0.98}Eu_{0.02})_3N_2 \cdot 6AlN \cdot 24Si_3N_4$ |

TABLE 3

| | Phosphor composition |
|---|---|
| Example 9 | $(Sr_{0.98}Eu_{0.02})AlSiN_3 \cdot (Sr_{0.98}Eu_{0.02})SiN_2$ |
| Example 10 | $(Sr_{0.98}Eu_{0.02})AlSiN_3 \cdot 2(Sr_{0.98}Eu_{0.02})SiN_2$ |
| Example 11 | $(Sr_{0.98}Eu_{0.02})AlSiN_3 \cdot 3(Sr_{0.98}Eu_{0.02})SiN_2$ |
| Example 12 | $2(Sr_{0.98}Eu_{0.02})AlSiN_3 \cdot (Sr_{0.98}Eu_{0.02})SiN_2$ |
| Example 13 | $(Sr_{0.98}Eu_{0.02})AlSiN_3 \cdot (Sr_{0.98}Eu_{0.02})_2Si_5N_8$ |
| Example 14 | $(Sr_{0.98}Eu_{0.02})AlSiN_3 \cdot 2(Sr_{0.98}Eu_{0.02})_2Si_5N_8$ |
| Example 15 | $(Sr_{0.98}Eu_{0.02})AlSiN_3 \cdot 3(Sr_{0.98}Eu_{0.02})_2Si_5N_8$ |

TABLE 3-continued

| | Phosphor composition |
|---|---|
| Example 16 | $2(Sr_{0.98}Eu_{0.02})AlSiN_3 \cdot (Sr_{0.98}Eu_{0.02})_2Si_5N_8$ |
| Example 17 | $(Sr_{0.98}Eu_{0.02})AlSiN_3 \cdot (Sr_{0.98}Eu_{0.02})Si_7N_{10}$ |
| Example 18 | $(Sr_{0.98}Eu_{0.02})AlSiN_3 \cdot 2(Sr_{0.98}Eu_{0.02})Si_7N_{10}$ |
| Example 19 | $(Sr_{0.98}Eu_{0.02})AlSiN_3 \cdot 3(Sr_{0.98}Eu_{0.02})Si_7N_{10}$ |
| Example 20 | $2(Sr_{0.98}Eu_{0.02})AlSiN_3 \cdot (Sr_{0.98}Eu_{0.02})Si_7N_{10}$ |
| Example 21 | $(Sr_{0.98}Eu_{0.02})AlSiN_3 \cdot 3Si_3N_4$ |
| Example 22 | $(Sr_{0.98}Eu_{0.02})_3Al_2Si_9N_{16}$ |
| Example 23 | $(Sr_{0.98}Eu_{0.02})_5Al_2Si_{14}N_{24}$ |
| Example 24 | $(Sr_{0.98}Eu_{0.02})_7Al_2Si_{19}N_{32}$ |
| Example 25 | $(Sr_{0.98}Eu_{0.02})_9Al_2Si_{24}N_{40}$ |

As Comparative Examples 1 to 5, Tables 4, 5, and 6 show phosphor compositions with 2 atomic % of Sr replaced by Eu, with the numerical values of "a", "b", and "c" being those shown in Table 4, and these compositions were produced and evaluated in the same way as the above. Although the phosphor compositions in Tables 4, 5, and 6 may be represented differently, they have the same composition ratios, respectively.

TABLE 4

| | a | b | c | Phosphor composition |
|---|---|---|---|---|
| Comparative Example 1 | 1 | 6 | 1 | $(Sr_{0.98}EU_{0.02})_3N_2 \cdot 6AlN \cdot Si_3N_4$ |
| Comparative Example 2 | 1 | 9 | 1 | $(Sr_{0.98}Eu_{0.02})_3N_2 \cdot 9AlN \cdot Si_3N_4$ |
| Comparative Example 3 | 2 | 9 | 2 | $2(Sr_{0.98}EU_{0.02})_3N_2 \cdot 9AlN \cdot 2Si_3N_4$ |
| Comparative Example 4 | 1 | 6 | 4 | $(Sr_{0.98}Eu_{0.02})_3N_2 \cdot 6AlN \cdot 4Si_3N_4$ |
| Comparative Example 5 | 2 | 0 | 5 | $2(Sr_{0.98}Eu_{0.02})_3N_2 \cdot 5Si_3N_4$ |

TABLE 5

| | Phosphor composition |
|---|---|
| Comparative Example 1 | $(Sr_{0.98}EU_{0.02})AlSiN_3 \cdot AlN$ |
| Comparative Example 2 | $(Sr_{0.98}Eu_{0.02})AlSiN_3 \cdot 2AlN$ |
| Comparative Example 3 | $2(Sr_{0.98}Eu_{0.02})AlSiN_3 \cdot AlN$ |
| Comparative Example 4 | $(Sr_{0.98}Eu_{0.02})Al_2Si_4N_8$ |
| Comparative Example 5 | $(Sr_{0.98}EU_{0.02})_2Si_5N_8$ |

In the production of these compositions, the same phosphor ingredients and added reducing agent as those described in Example 2 were used. Phosphor compositions were produced and evaluated by the same procedure and under the same condition as those in Example 2, except that the mixed weight ratios were set to be the weight ratios shown in Table 6.

TABLE 6

| | Composition formula | $SrCO_3$ | $Eu_2O_3$ | $Si_3N_4$ | AlN | C |
|---|---|---|---|---|---|---|
| Example 9 | $(Sr_{0.98}Eu_{0.02})_2AlSi_2N_5$ | 5.787 g | 0.141 g | 1.977 g | 0.820 g | 0.480 g |
| Example 10 | $(Sr_{0.98}Eu_{0.02})_3AlSi_3N_7$ | 8.681 g | 0.211 g | 2.965 g | 0.820 g | 0.721 g |
| Example 11 | $(Sr_{0.98}Eu_{0.02})_4AlSi_4N_9$ | 11.574 g | 0.282 g | 3.953 g | 0.820 g | 0.961 g |
| Example 12 | $(Sr_{0.98}Eu_{0.02})_3Al_2Si_3N_8$ | 8.681 g | 0.211 g | 2.965 g | 1.639 g | 0.721 g |
| Example 13 | $(Sr_{0.98}Eu_{0.02})_3AlSi_6N_{11}$ | 8.681 g | 0.211 g | 5.930 g | 0.820 g | 0.721 g |
| Example 14 | $(Sr_{0.98}Eu_{0.02})_5AlSi_{11}N_{19}$ | 14.468 g | 0.352 g | 10.872 g | 0.820 g | 1.201 g |
| Example 15 | $(Sr_{0.98}Eu_{0.02})_7AlSi_{16}N_{27}$ | 20.255 g | 0.493 g | 15.814 g | 0.820 g | 1.682 g |
| Example 16 | $(Sr_{0.98}Eu_{0.02})_4Al_2Si_7N_{14}$ | 11.574 g | 0.282 g | 6.919 g | 1.639 g | 0.961 g |
| Example 17 | $(Sr_{0.98}Eu_{0.02})_2AlSi_8N_{13}$ | 5.787 g | 0.141 g | 7.907 g | 0.820 g | 0.480 g |
| Example 18 | $(Sr_{0.98}Eu_{0.02})_3AlSi_{15}N_{23}$ | 8.681 g | 0.211 g | 14.825 g | 0.820 g | 0.721 g |
| Example 19 | $(Sr_{0.98}Eu_{0.02})_4AlSi_{22}N_{33}$ | 11.574 g | 0.282 g | 21.744 g | 0.820 g | 0.961 g |
| Example 20 | $(Sr_{0.98}Eu_{0.02})_3Al_2Si_8N_{16}$ | 8.681 g | 0.211 g | 8.895 g | 1.639 g | 0.721 g |
| Example 21 | $(Sr_{0.98}Eu_{0.02})AlSi_{10}N_{15}$ | 2.894 g | 0.070 g | 9.884 g | 0.820 g | 0.240 g |
| Example 22 | $(Sr_{0.98}Eu_{0.02})_3Al_2Si_9N_{16}$ | 8.681 g | 0.211 g | 8.895 g | 1.639 g | 0.721 g |
| Example 23 | $(Sr_{0.98}Eu_{0.02})_5Al_2Si_{14}N_{24}$ | 14.468 g | 0.352 g | 13.837 g | 1.639 g | 1.201 g |
| Example 24 | $(Sr_{0.98}Eu_{0.02})_7Al_2Si_{19}N_{32}$ | 20.255 g | 0.493 g | 18.779 g | 1.639 g | 1.682 g |
| Example 25 | $(Sr_{0.98}Eu_{0.02})_9Al_2Si_{24}N_{40}$ | 26.042 g | 0.633 g | 23.721 g | 1.639 g | 2.162 g |
| Comparative Example 1 | $(Sr_{0.98}Eu_{0.02})Al_2SiN_4$ | 2.894 g | 0.070 g | 0.988 g | 1.639 g | 0.240 g |
| Comparative Example 2 | $(Sr_{0.98}Eu_{0.02})Al_3SiN_5$ | 2.894 g | 0.070 g | 0.988 g | 2.459 g | 0.240 g |
| Comparative Example 3 | $(Sr_{0.98}Eu_{0.02})_2Al_3Si_2N_7$ | 5.787 g | 0.141 g | 1.977 g | 2.459 g | 0.480 g |
| Comparative Example 4 | $(Sr_{0.98}Eu_{0.02})Al_2Si_4N_8$ | 2.894 g | 0.070 g | 3.953 g | 1.639 g | 0.240 g |
| Comparative Example 5 | $(Sr_{0.98}Eu_{0.02})_2Si_5N_8$ | 14.468 g | 0.352 g | 12.355 g | 0 g | 1.201 g |

Hereinafter, the characteristics of the phosphor compositions thus obtained will be described briefly.

The body colors of the phosphor compositions of the present example were all orange. An emission spectrum and an excitation spectrum are omitted herein. The phosphor compositions of Examples 9 to 25 were all red phosphors having an emission peak in the vicinity of a wavelength of 620 nm to 640 nm in the same way as in the phosphor of Example 1 or 2 shown in FIG. 15 or 27, which were excited with light in a large wavelength range of 220 nm to 600 nm (i.e., ultraviolet light—near-ultraviolet light—violet light—blue light—green light—yellow light—orange light).

For reference, Table 7 shows a summary of an emission peak wavelength and an absolute value of an emission peak height of the phosphor compositions of Examples 9 to 25 and Comparative Examples 1 to 5.

TABLE 7

| | Emission peak wavelength (nm) | Relative emission peak height (arbitrary unit) |
|---|---|---|
| Example 9 | 639 | 39 |
| Example 10 | 626 | 38 |
| Example 11 | 629 | 88 |
| Example 12 | 639 | 40 |
| Example 13 | 625 | 97 |
| Example 14 | 630 | 100 |
| Example 15 | 628 | 86 |
| Example 16 | 628 | 92 |
| Example 17 | 631 | 73 |
| Example 18 | 628 | 67 |
| Example 19 | 628 | 66 |
| Example 20 | 626 | 54 |
| Example 21 | 638 | 55 |
| Example 22 | 625 | 60 |
| Example 23 | 630 | 67 |
| Example 24 | 625 | 82 |
| Example 25 | 628 | 92 |
| Comparative Example 1 | 490 | 69 |

TABLE 7-continued

| | Emission peak wavelength (nm) | Relative emission peak height (arbitrary unit) |
|---|---|---|
| Comparative Example 2 | 484 | 79 |
| Comparative Example 3 | 487 | 99 |
| Comparative Example 4 | 594 | 12 |
| Comparative Example 5 | 621 | 104 |

Figure 28:
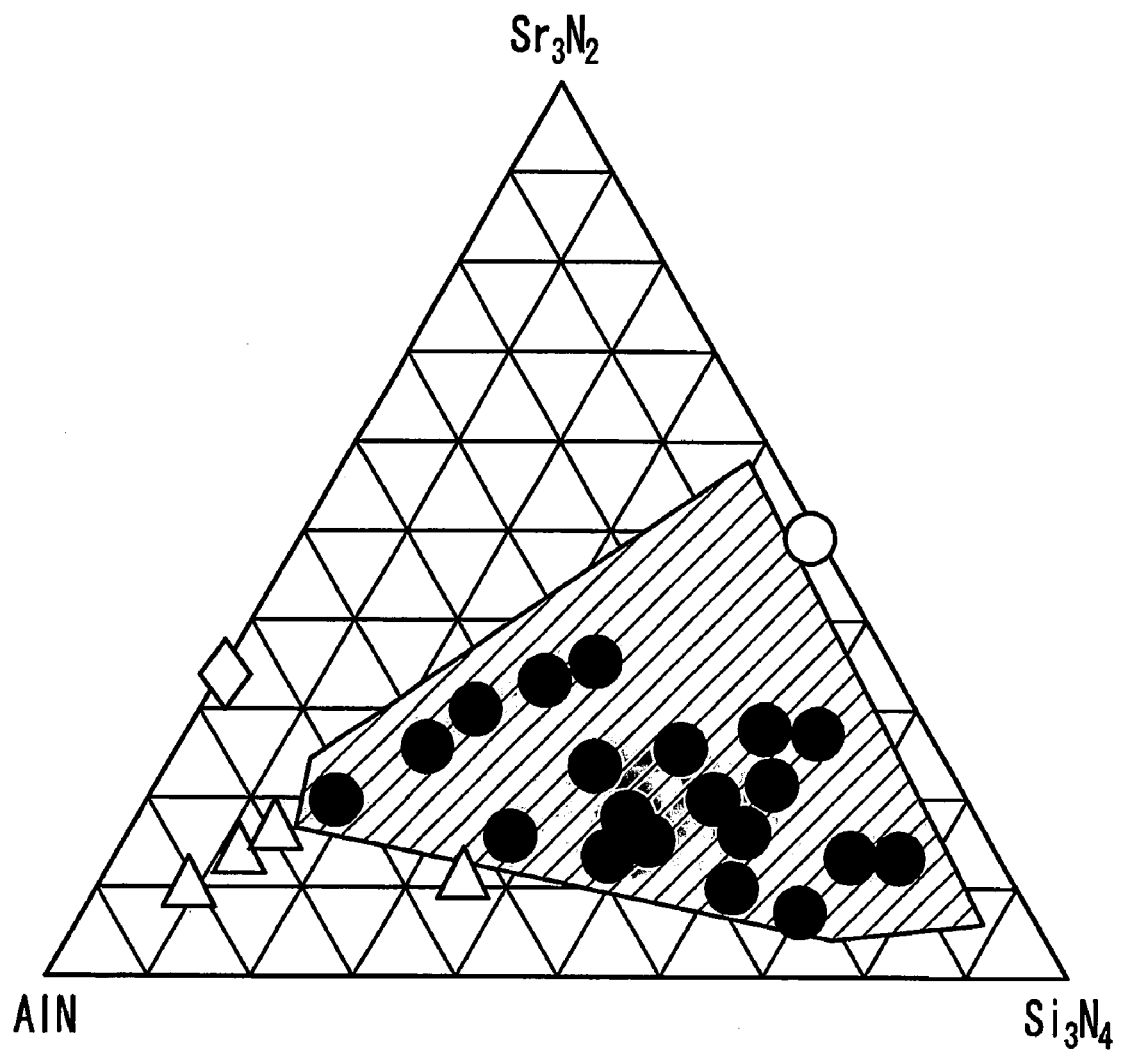
FIG. 28 is a ternary system of composition showing a composition range of the phosphor composition of the present invention.

Furthermore, FIG. 28 is a ternary system of composition showing a composition range of the phosphor compositions of the present invention. In FIG. 28, regarding the emission colors of the phosphor compositions of Examples 1, 2, and 5-25, and the phosphor compositions of Comparative Examples 1-5, ● represents red color, and Δ represents the colors other than the red color.

In FIG. 28, ○ represents a conventional $Sr_2Si_5N_8:Eu^{2+}$ nitridosilicate phosphor emitting red light. Furthermore, in FIG. 28, ◇ represents a $Sr_3Al_2N_5:Eu^{2+}$ phosphor composition that is unstable chemically in the atmosphere and cannot be substantially evaluated for emission characteristics. Furthermore, in the case of using the production condition of Example 2, the compositions containing $Sr_3N_2$ in a high ratio in the ternary system of composition shown in FIG. 28 tended to be difficult to produce due to melting, and unstable chemically in the atmosphere.

It is understood from FIG. 28 and Table 7 that, as a phosphor composition different from the conventional nitridosilicate phosphor (e.g., $Sr_2Si_5N_8:Eu^{2+}$), a phosphor composition, which contains a composition represented by a composition formula: $aSr_3N_2 \cdot bAlN \cdot cSi_3N_4$ as a main component of a phosphor host, and contains $Eu^{2+}$ ions as an activator, wherein "a", "b", and "c" are numerical values satisfying $0.2 \leq a/(a+b) \leq 0.95$, $0.05 \leq b/(b+c) \leq 0.8$, and $0.4 \leq c/(c+a) \leq 0.95$, becomes a red phosphor.

The phosphor composition characteristic in terms of the constituent composition, compared with the above-mentioned conventional nitridosilicate phosphor, is the one with "a", "b", and "c" being the numerical values satisfying $0.2 \leq a/(a+b) \leq 0.6$, $0.3 \leq b/(b+c) \leq 0.8$, and $0.4 \leq c/(c+a) \leq 0.8$, in particular, $0.2 \leq a/(a+b) \leq 0.3$, $0.6 \leq b/(b+c) \leq 0.8$, and $0.4 \leq c/(c+a) \leq 0.6$, represented by the composition formula: $SrAlSiN_3$ containing $Eu^{2+}$ ions as an activator.

In Examples 9 to 25, the case of the phosphor composition produced by the same production method as that shown in Example 2 has been described. Even according to the production method for allowing nitride materials to react directly with each other shown in Example 1, the same results are obtained.

Furthermore, in Examples 9 to 25, the case where the element "M" is set to be Sr has been described. Even in the case where "M" is Ca, and where the main component of "M" is set to be Ca or Sr, and a part of "M" is replaced by Ba, Mg, or Zn, the same results are obtained.

Next, another embodiment of the present invention will be described.

The characteristics of the phosphor activated with $Eu^{2+}$ were investigated in detail. Consequently, the following was found. The phosphors shown in the following (1) to (3) have a high internal quantum efficiency under the excitation of a blue light-emitting element having an emission peak in a blue wavelength range of 420 nm to less than 500 nm, in particular, 440 nm to less than 500 nm, as well as a high internal quantum efficiency under the excitation of a violet light-emitting element having an emission peak in a near-ultraviolet—violet range wavelength range of 360 nm to less than 420 nm. Satisfactory phosphors have an internal quantum efficiency of 90% to 100%.

(1) A green phosphor of an alkaline-earth metal orthosilicate type, a thiogallate type, an aluminate type, and a nitride type (nitridosilicate type, SIALON type, etc.) activated with $Eu^{2+}$ and having an emission peak in a wavelength range of 500 nm to less than 560 nm (e.g., phosphors such as $(Ba, Sr)_2SiO_4:Eu^{2+}$, $SrGa_2S_4:Eu^{2+}$, $SrAl_2O_4:Eu^{2+}$, $BaSiN_2:Eu^{2+}$, and $Sr_{1.5}Al_3Si_9N_{16}:Eu^{2+}$).

(2) A yellow phosphor of an alkaline-earth metal orthosilicate type, a thiogallate type, and a nitride type (nitridosilicate type, SIALON type, etc.) activated with $Eu^{2+}$ and having an emission peak in a wavelength range of 560 nm to less than 600 nm (e.g., phosphors such as $(Sr, Ba)_2SiO_4:Eu^{2+}$, $CaGa_2S_4:Eu^{2+}$, $0.75(Ca_{0.9}Eu_{0.1})O.2.25AlN.3.25Si_3N_4:Eu^{2+}$, $Ca_{1.5}Al_3Si_9N_{16}:Eu^{2+}$, $(Sr, Ca)_2SiO_4:Eu^{2+}$, $CaSiAl_2O_3N_2:Eu^{2+}$, and $CaSi_6AlON_9:Eu^{2+}$).

(3) A red phosphor of a nitride type (nitridosilicate type, nitridoaluminosilicate type) activated with $Eu^{2+}$ and having an emission peak in a wavelength range of 600 nm to less than 660 nm (e.g., phosphors such as $Sr_2Si_5N_8:Eu^{2+}$, $SrSiN_2:Eu^{2+}$, $SrAlSiN_3:Eu^{2+}$, $CaAlSiN_3:Eu^{2+}$, and $Sr_2Si_4AlON_7:Eu^{2+}$).

The excitation spectra of these phosphors have an excitation peak in a wavelength range shorter than the wavelength of light emitted by the blue light-emitting element, mostly in a near-ultraviolet—violet wavelength range of 360 nm to less than 420 nm. Therefore, the external quantum efficiency under the excitation of the blue light-emitting element is not necessarily high. However, the internal quantum efficiency is found to be at least 70% that is higher than expected from the excitation spectrum, and 90% to 100% in a particularly preferable case.

Figure 29:
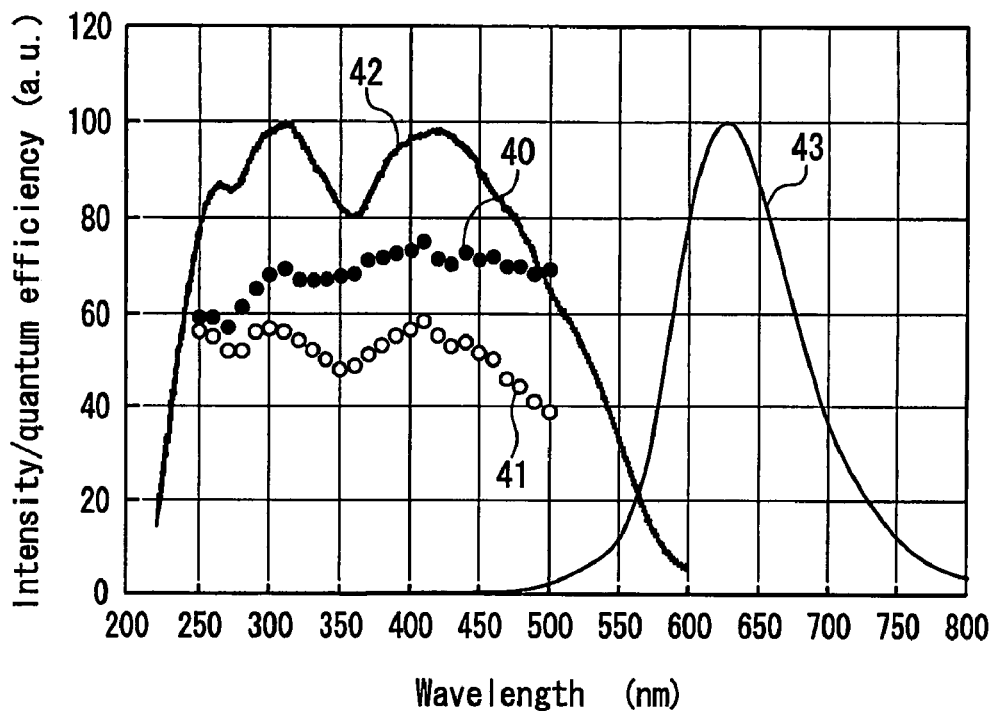
FIG. 29 shows emission characteristics of a $SrSiN_2:Eu^{2+}$ red phosphor.
Figure 30:
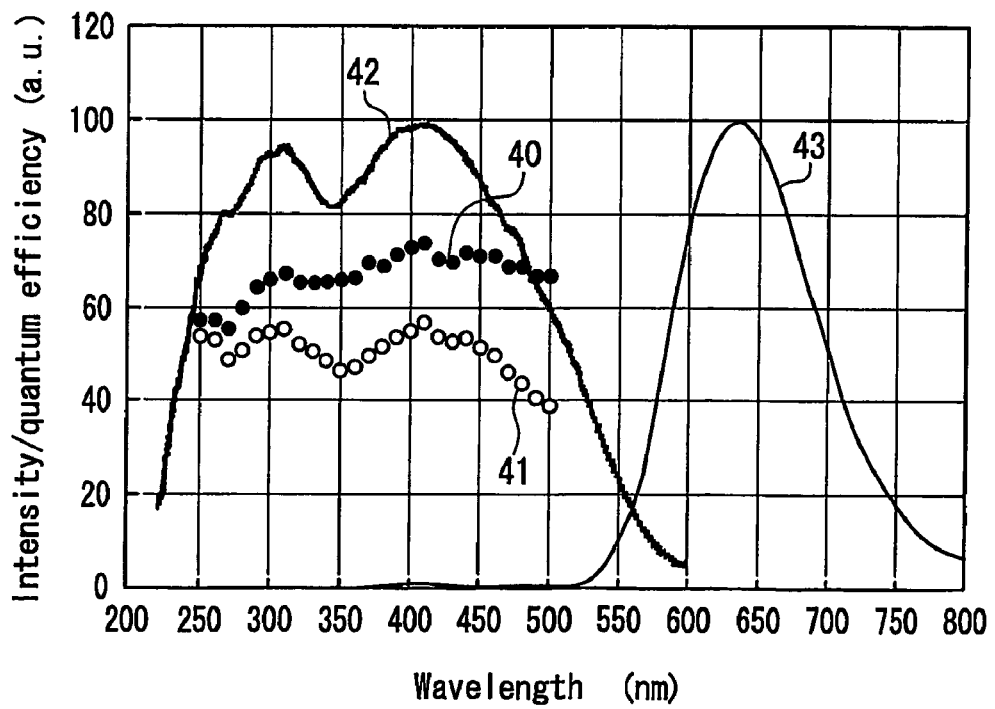
FIG. 30 shows emission characteristics of a $SrAlSiN_3:Eu^{2+}$ red phosphor.
Figure 31:
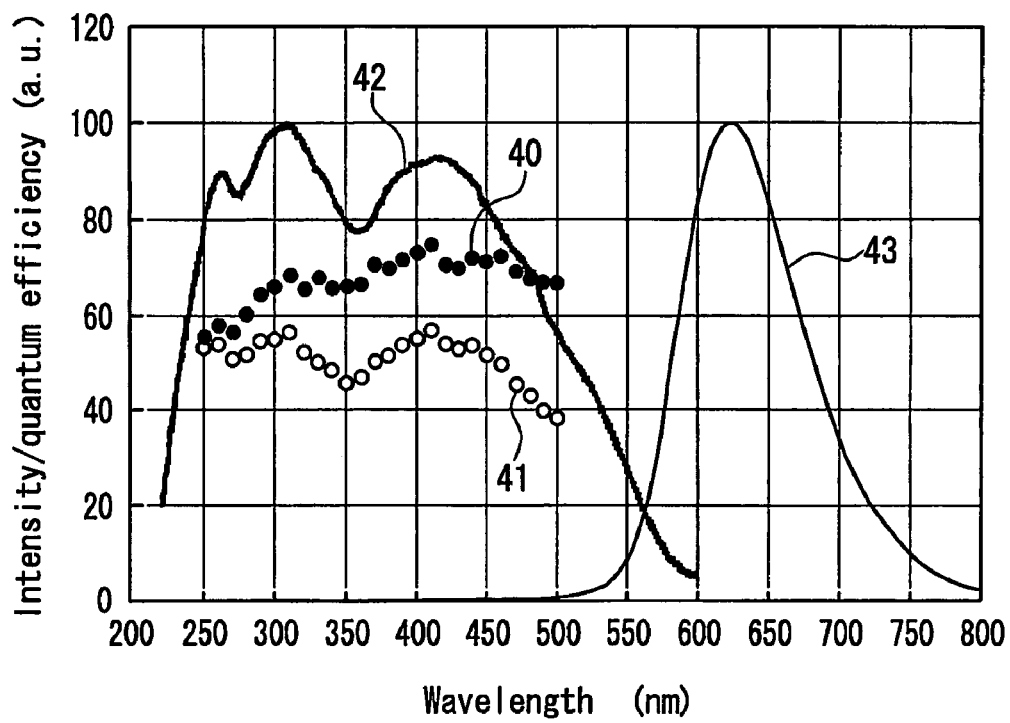
FIG. 31 shows emission characteristics of a $Sr_2Si_5N_8:Eu^{2+}$ red phosphor.

As an example, FIG. 29 shows an internal quantum efficiency 40, an external quantum efficiency 41, and an excitation spectrum 42 of a $SrSiN_2:Eu^{2+}$ red phosphor, and for reference, an emission spectrum 43 of the phosphor. FIGS. 30 to 35 respectively show the internal quantum efficiency 40, the external quantum efficiency 41, and the excitation spectrum 42, and for reference, the emission spectrum 43 in the same way as in FIG. 29, regarding a $SrAlSiN_3:Eu^{2+}$ red phosphor (FIG. 30), a $Sr_2Si_5N_8:Eu^{2+}$ red phosphor (FIG. 31), a $(Ba, Sr)_2SiO_4:Eu^{2+}$ green phosphor (FIG. 32), a $(Sr, Ba)_2SiO_4:Eu^{2+}$ yellow phosphor (FIG. 33), a $(Sr, Ca)_2SiO_4:Eu^{2+}$ yellow phosphor (FIG. 34), and a $0.75(Ca_{0.9}Eu_{0.1})O.2.25AlN.3.25Si_3N_4:Eu^{2+}$ yellow phosphor (FIG. 35). For example, the external quantum efficiency of the $(Sr, Ba)_2SiO_4:Eu^{2+}$ yellow phosphor that is an alkaline-earth metal orthosilicate phosphor activated with $Eu^{2+}$ shown in FIG. 33 is about 75% under the excitation of a blue light-emitting element with a wavelength of 440 nm, about 67% at a wavelength of 460 nm, and about 60% at a wavelength of 470 nm. However, in the blue wavelength range of 440 nm to less than 500 nm, the internal quantum efficiency is found to be at least 85% that is higher than expected from an excitation spectrum, and about 94% in a particularly satisfactory case.

Furthermore, in addition to the above-mentioned phosphors, a phosphor coactivated with $Eu^{2+}$ or $Ce^{3+}$ also is found to have the same characteristics. As an example, FIGS. 36 to 39 show the internal quantum efficiency 40, the external quantum efficiency 41, and the excitation spectrum 42, and for reference, the emission spectrum 43 in the same way as in FIG. 29, regarding a $(Y, Gd)_3Al_5O_{12}:Ce^{3+}$ yellow phosphor (FIG. 36), a $BaMgAl_{10}O_{17}:Eu^{2+}$ blue phosphor (FIG. 37), a $Sr_4Al_{14}O_{25}:Eu^{2+}$ blue-green phosphor (FIG. 38), and a $(Sr, Ba)_{10}(PO_4)_6Cl_2:Eu^{2+}$ blue phosphor (FIG. 39).

The following is understood from FIGS. 29 to 39. The excitation wavelength dependency of an external quantum efficiency of each phosphor is similar to the shape of an excitation spectrum. The external quantum efficiency is not necessarily high under the excitation of light with a wavelength longer than that of a peak of an excitation spectrum (for example, under the excitation of a blue light-emitting element); however, the internal quantum efficiency exhibits a high numerical value under the excitation of the blue light-emitting element. Furthermore, it is understood from FIGS. 29 to 35 and FIGS. 37 to 39 that each phosphor has a high internal quantum efficiency under the excitation of the above-mentioned violet light-emitting element, and the satisfactory phosphors have an internal quantum efficiency of 90% to 100%.

Further investigation found the following. In addition to the above-mentioned phosphors (1) to (3), the following phosphors (4) and (5) have a high internal quantum efficiency under the excitation of the violet light-emitting element.

(4) A nitride type (nitridosilicate type, SIALON type, etc.) blue or green phosphor activated with $Eu^{2+}$ or $Ce^{3+}$ and having an emission peak in a wavelength range of 490 nm to 550 nm (e.g., phosphors such as $Sr_2Si_5N_8:Ce^{3+}$, $SrSiAl_2O_3N_2:Eu^{2+}$, and $Ca_{1.5}Al_3Si_{19}N_{16}:Ce^{3+}$).

(5) A blue-green or blue phosphor of an alkaline-earth metal orthosilicate type or a halophosphate type activated with $Eu^{2+}$ and having an emission peak in a wavelength range of 420 nm to less than 500 nm (e.g., phosphors such as $Ba_3MgSi_2O_8:Eu^{2+}$, and $(Sr, Ca)_{10}PO_4)_6Cl_2:Eu^{2+}$).

The excitation spectra of these phosphors have an excitation peak in a near-ultraviolet—violet wavelength range of 360 nm to less than 420 nm, so that the external quantum efficiency under the excitation of the violet light-emitting element is not high.

Figure 40:
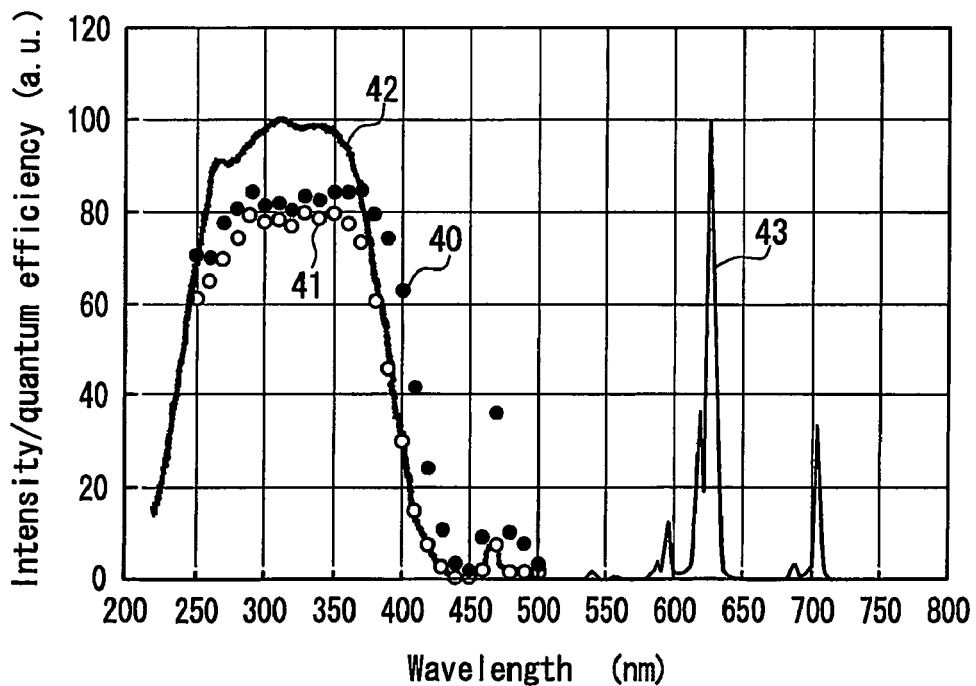
FIG. 40 shows emission characteristics of a $La_2O_2S:Eu^{3+}$ red phosphor.

As an example, FIG. 40 shows the internal quantum efficiency 40, the external quantum efficiency 41, and the excitation spectrum 42 of a $La_2O_2S:Eu^{3+}$ red phosphor frequently used in combination with the above-mentioned conventional violet light-emitting element, and for reference, the emission spectrum 43 of the phosphor. As is understood from FIG. 40, the internal quantum efficiency and the external quantum efficiency of the above-mentioned $La_2O_2S:Eu^{3+}$ red phosphor decrease rapidly with the increase in an excitation wavelength, in a violet range in which the peak of the excitation spectrum is 380 nm to less than 420 nm, and furthermore in an excitation wavelength of about 360 to 380 nm or more. For example, in the case where the excitation wavelength is prolonged gradually in a violet wavelength range of 380 nm to less than 420 nm, the internal quantum efficiency changes greatly at a low level (about 80% (380 nm), about 62% (400 nm), about 25% (420 nm)).

Although data is omitted, the internal quantum efficiency, the external quantum efficiency and the excitation spectrum of the $Y_2O_2S:Eu^{3+}$ red phosphor correspond to the characteristics of the internal quantum efficiency, the external quantum efficiency, and the excitation spectrum of the above-mentioned $La_2O_2S:Eu^{3+}$ shifted to a short wavelength side by 10 to 50 nm.

More specifically, it is understood that the $La_2O_2S:Eu^{3+}$ red phosphor and the $Y_2O_2S:Eu^{3+}$ red phosphor frequently used in combination with the above-mentioned conventional violet light-emitting element have difficulty in converting light emitted by a light-emitting element having an emission peak in a near-ultraviolet—violet wavelength range of 360 nm to less than 420 nm, in particular, in a violet wavelength range of 380 nm to less than 420 nm into red light at a high conversion efficiency, in terms of the physical properties of the material.

The reason why the above-mentioned $La_2O_2S:Eu^{3+}$ red phosphor and the $Y_2O_2S:Eu^{3+}$ red phosphor exhibit the above-mentioned excitation wavelength dependency of an internal quantum efficiency is as follows. In the case where $Eu^{3+}$ is excited in the charge transfer state (CTS), and these phosphors emit light after the excitation energy is relaxed to a 4f energy level of $Eu^{3+}$ via the CTS, light emission with a high efficiency is obtained, and in the case where these phosphors emit light directly by the excitation of $Eu^{3+}$ without the CTS, light emission with a high efficiency is not obtained. The above-mentioned CTS refers to the state where one electron is transferred from the surrounding anions (O or S) to $Eu^{3+}$. Due to the above-mentioned mechanism, it is difficult to obtain a light-emitting device with a high luminous flux, using the above-mentioned red phosphor of an oxysulfide type and the light-emitting element (in particular, a violet light-emitting element).

Furthermore, in the case of configuring a white light-emitting device that excites a plurality of kinds of phosphors using a violet light-emitting element, due to the color balance, the intensity of the output light has a correlation with an internal quantum efficiency of a phosphor having a lowest internal quantum efficiency. That is, if at least one phosphor having a low internal quantum efficiency is present in a phosphor constituting the light-emitting device, the intensity of output light becomes low, which makes it difficult to obtain white light with a high luminous flux.

Herein, the internal quantum efficiency refers to a ratio of the quantum number of light emitted by a phosphor, with respect to the quantum number of excited light absorbed by the phosphor. The external quantum efficiency refers to a ratio of the quantum number of light emitted by a phosphor, with respect to the quantum number of excited light illuminating the phosphor. More specifically, a high quantum efficiency represents that excited light is converted efficiently. A method for measuring a quantum efficiency has already been established, and Publication of Illuminating Engineering Institute of Japan describes the detail thereof.

The light emitted by a light-emitting element absorbed by a phosphor with a high internal quantum efficiency is converted efficiently to be output. On the other hand, the light emitted by a light-emitting element that is not absorbed by the phosphor is output as it is. Therefore, a light-emitting device including a light-emitting element having an emission peak in the above-mentioned wavelength range and a phosphor having a high internal quantum efficiency under the excitation of light emitted by the light-emitting element can use light energy efficiently. Thus, by combining at least the above-mentioned phosphors (1) to (5) with the above-mentioned light-emitting element, a light-emitting device with a high luminous flux and a high color rendering property can be obtained.

On the other hand, a light-emitting device including a light-emitting element having an emission peak in the above-mentioned wavelength range, and a phosphor having a low internal quantum efficiency under the excitation of light emitted by the light-emitting element cannot convert light energy emitted by the light-emitting element efficiently, and hence has a low luminous flux.

A light-emitting device including a light-emitting element having an emission peak in a near-ultraviolet—violet wavelength range of 360 nm to less than 420 nm, and a phosphor having a low external quantum efficiency under the excitation of light emitted by the light-emitting element emits light in a near-ultraviolet—violet wavelength range that has a low spectral luminous efficacy and hardly participates in the enhancement of a luminous flux. Therefore, unless light emitted by the light-emitting element is allowed to be absorbed in a large amount by a phosphor, by increasing the thickness of the phosphor layer, enhancing the concentration of a phosphor in the phosphor layer, etc., a luminous flux becomes low.

Hereinafter, another embodiment of the light-emitting device of the present invention will be described.

Embodiment 6

An example of a light-emitting device of the present invention includes a phosphor layer containing a nitride phosphor and a light-emitting element. The light-emitting element has an emission peak in a wavelength range of 360 nm to less than 500 nm, the nitride phosphor is excited with light emitted by the light-emitting element to emit light, and the light-emitting device contains at least light-emitting component light emitted by the nitride phosphor as output light. Furthermore, the nitride phosphor is activated with $Eu^{2+}$ and represented by a composition formula: $(M_{1-x}Eu_x)AlSiN_3$, where "M" is at least one element selected from the group consisting of Mg, Ca, Sr, Ba, and Zn, and "x" is a numerical value satisfying $0.005 \leq x \leq 0.3$.

The light-emitting element is not particularly limited, as long as it is a photoelectric transducer for converting electric energy into light, which emits light having an emission peak in any of wavelength ranges of 360 nm to less than 420 nm or 420 nm to less than 500 nm, more preferably 380 nm to less than 420 nm or 440 nm to less than 500 nm. For example, a light-emitting diode (LED), a laser diode (LD), a surface-emitting LD, an inorganic electroluminescence (EL) element, an organic EL element, or the like can be used.

In the case of using, as a light-emitting element, an LED or an LD including a GaN-based compound as a light-emitting layer, it is preferable to use a violet light-emitting element that emits light having an emission peak in a wavelength range of preferably 380 nm to less than 420 nm, more preferably 395 nm to 415 nm, or a blue light-emitting element that emits light having an emission peak in a wavelength range of preferably 440 nm to less than 500 nm, more preferably 450 nm to 480 nm, since a high output is obtained.

It is preferable that the output light contains light-emitting component light emitted by the light-emitting element. In particular, in the case where the above-mentioned light-emitting element has an emission peak in a blue wavelength range, if light-emitting component light emitted by the nitride phosphor and light-emitting component light emitted by the emission element are included in output light, white light having a higher color rendering property is obtained, which is more preferable.

The above-mentioned nitride phosphor is represented by the above-mentioned composition formula: $(M_{1-x}Eu_x)AlSiN_3$, which emits light in a warm color having an emission peak in a wavelength range of 600 nm to less than 660 nm, preferably red light having an emission peak in a wavelength range of 610 nm to 650 nm. The above-mentioned nitride phosphor corresponds to a nitride phosphor having a high internal quantum efficiency under the excitation of light in a wavelength range of 360 nm to less than 500 nm, for example, the $SrAlSiN_3:Eu^{2+}$ red phosphor, the $CaAlSiN_3:Eu^{2+}$ red phosphor, and the like shown in FIG. 30.

The light-emitting device including at least a phosphor layer containing a nitride phosphor with a high internal quantum efficiency and the above-mentioned light-emitting element can output light energy efficiently. The light-emitting device configured as described above has a high intensity of a light-emitting component in a warm color, and a special color rendering index R9 with a large numerical value. This light-emitting device has a high luminous flux and a high color rendering property, comparable to those of a conventional light-emitting device using a $La_2O_2S:Eu^{3+}$ phosphor and a conventional light-emitting device using a combination of a $Sr_2Si_5N_8:Eu^{2+}$ phosphor and a YG:Ce phosphor.

The light-emitting device of the present embodiment is not particularly limited, as long as it includes at least a phosphor layer containing the above-mentioned nitride phosphor and the above-mentioned light-emitting element. For example, the light-emitting device of the present embodiment corresponds to a semiconductor light-emitting device, a white LED, a display device using a white LED, an illumination device using a white LED, etc. More specifically, examples of the display device using a white LED include an LED information display terminal, an LED traffic light, and an LED lamp for an automobile. Examples of the illumination device using a white LED include an LED indoor-outdoor illumination lamp, an interior LED lamp, an LED emergency lamp, and an LED decorative lamp.

Among them, the above-mentioned white LED is particularly preferable. In general, a conventional LED is a light-emitting element of a monochromatic light source that emits light having a particular wavelength from the light emission principle. That is, a light-emitting element that emits white light cannot be obtained from the conventional LED. In contrast, white fluorescence can be obtained from the white LED of the present embodiment by a method for combining, for example, the conventional LED and a phosphor.

In the present embodiment, when the main component of the element "M" is set to be Sr or Ca, the nitride phosphor obtains a satisfactory color tone and a high emission intensity, which is more preferable. Setting the main component to be Sr or Ca means that at least 50 atomic % of the element "M" is any one element of Sr and Ca. Furthermore, it is preferable that at least 80 atomic % of the element "M" is any one element of Sr and Ca, and it is more preferable that all the atoms of the element "M" are any one element of Sr and Ca.

Furthermore, it is preferable that the above-mentioned injection type electroluminescence element is used, since the light-emitting element emits a strong output light. It is more preferable that an LED or an LD particularly containing a GaN-based semiconductor in an active layer is used as an injection type electroluminescence element, since strong stable output light is obtained.

Embodiment 7

As another example of the light-emitting device of the present invention, the above-mentioned phosphor layer of Embodiment 6 may further contain a green phosphor that is activated with $Eu^{2+}$ or $Ce^+$ and has an emission peak in a wavelength range of 500 nm to less than 560 nm. The green phosphor is not particularly limited, as long as it is excited with light emitted by the light-emitting element described in Embodiment 6, and emits light having an emission peak in a wavelength range of 500 nm to less than 560 nm, preferably 510 nm to 550 nm, and more preferably 525 nm to 550 nm.

For example, in the case of using a blue light-emitting element, it may be possible to use a green phosphor in which an excitation peak of an excitation spectrum on a longest wavelength side is not in a wavelength range of 420 nm to less than 500 nm (i.e., an excitation peak of an excitation spectrum on a longest wavelength side is in a wavelength range of less than 420 nm).

Figure 32:
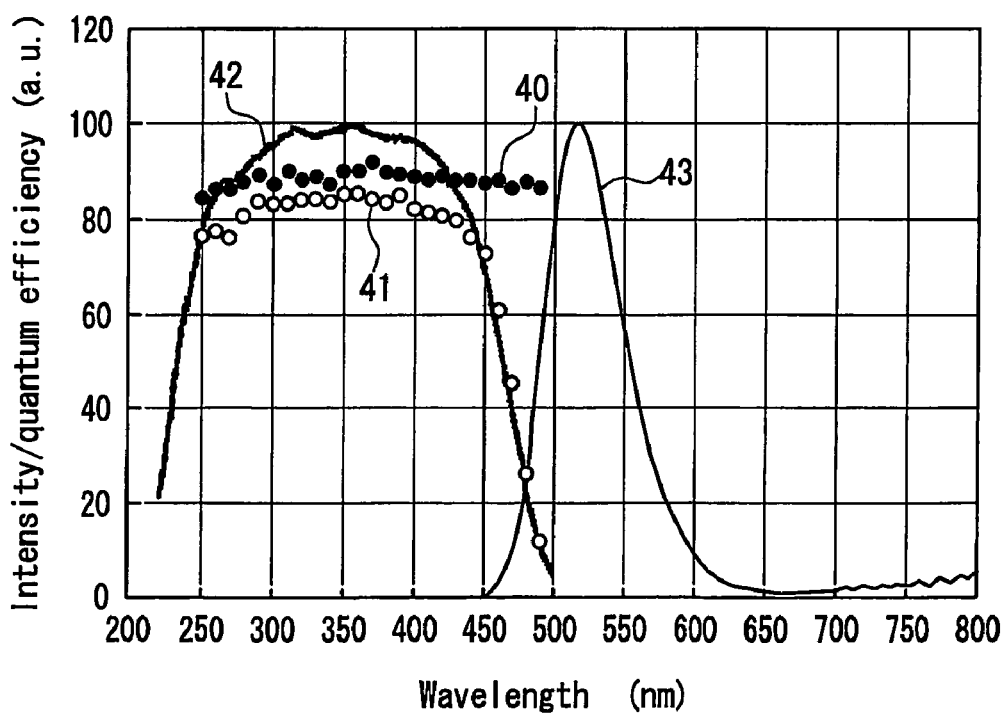
FIG. 32 shows emission characteristics of a $(Ba, Sr)_2SiO_4:Eu^{2+}$ green phosphor.
Figure 33:
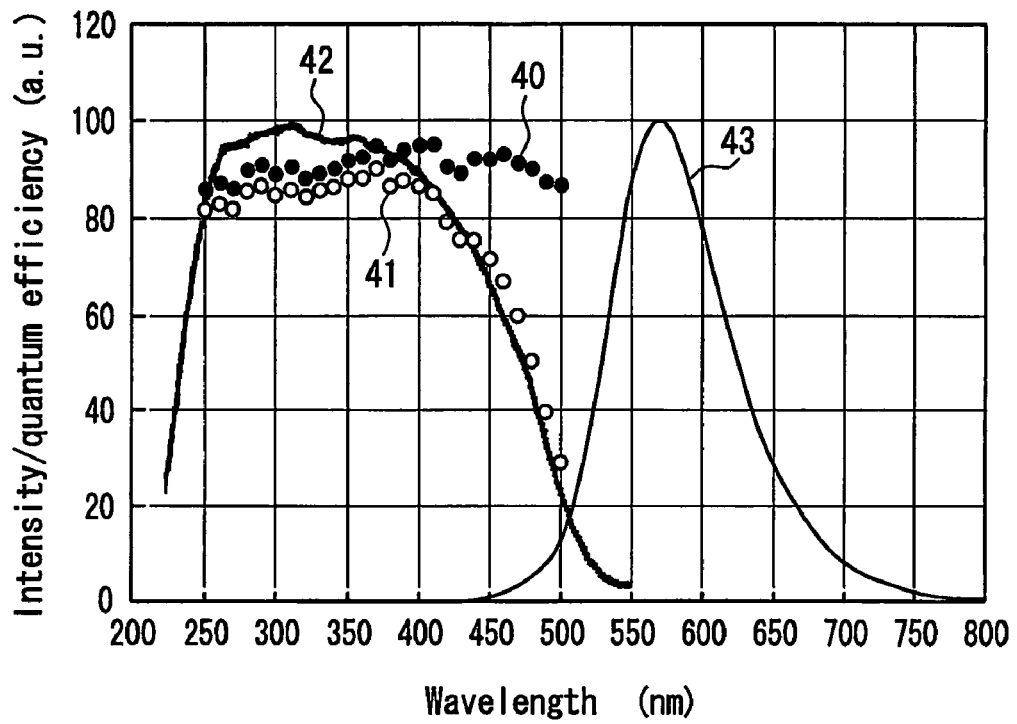
FIG. 33 shows emission characteristics of a $(Sr, Ba)_2SiO_4:Eu^{2+}$ yellow phosphor.

The green phosphor corresponds to a phosphor having an internal quantum efficiency under the excitation of light in a wavelength range of 360 nm to less than 500 nm, for example, the $(Ba, Sr)_2SiO_4:Eu^{2+}$ green phosphor shown in FIG. 32 or the like. A light-emitting device including at least a phosphor layer containing at least the phosphor and the above-mentioned light-emitting element is preferable, since it outputs light energy efficiently. In such a light-emitting device, the emission intensity of green light contained in output light increases and the color rendering property is enhanced. Furthermore, green light has a high excitation energy efficacy and a higher luminous flux. In particular, depending upon the combination of a phosphor contained in a phosphor layer, it is possible to obtain output light having a high color rendering property with an average color rendering index Ra of at least 90.

It is more preferable that the above-mentioned green phosphor is a nitride phosphor or an oxynitride phosphor activated with $Eu^{2+}$ (e.g., $BaSiN_2:Eu^{2+}$, $Sr_{1.5}Al_3Si_9N_{16}:Eu^{2+}$, $Ca_{1.5}Al_3Si_9N_{16}:Eu^{2+}$, $CaSiAl_2O_3N_2:Eu^{2+}$, $SrSiAl_2O_3N_2:Eu^{2+}$, $CaSi_2O_2N_2:Eu^{2+}$, $SrSi_2O_2N_2:Eu^{2+}$, $BaSi_2O_2N_2:Eu^{2+}$), an alkaline-earth metal orthosilicate phosphor activated with $Eu^{2+}$ (e.g., $(Ba, Sr)_2SiO_4:Eu^{2+}$, $(Ba, Ca)_2SiO_4:Eu^{2+}$), a thiogallate phosphor activated with $Eu^{2+}$ (e.g., $SrGa_2S_4:Eu^{2+}$), an aluminate phosphor activated with $Eu^{2+}$ (e.g., $SrAl_2O_4:Eu^{2+}$), an aluminate phosphor coactivated with $Eu^{2+}$ and $Mn^{2+}$ (e.g., $BaMgAl_{10}O_{17}:Eu^{2+}, Mn^{2+}$), a nitride phosphor or an oxynitride phosphor activated with $Ce^{3+}$ (e.g., $Sr_2Si_5N_8:Ce^{3+}$, $Ca_{1.5}Al_3Si_9N_{16}:Ce^{3+}$, $Ca_2Si_5N_8:Ce^{3+}$), and a phosphor having a garnet configuration activated with $Ce^{3+}$ (e.g., $Ys(Al, Ga)_5O_{12}:Ce^{3+}$, $Y_3Al_5O_{12}:Ce^{3+}$, $BaY_2SiAl_4O_{12}:Ce^{3+}$, $Ca_3Sc_2Si_3O_{12}:Ce^{3+}$), since the internal quantum efficiency under the excitation of the above-mentioned light-emitting element becomes high.

Thus, the light-emitting device of the present embodiment includes a phosphor layer containing at least the nitride phosphor of Embodiment 6 and the above-mentioned green phosphor, and the light-emitting element of Embodiment 6, and contains red light-emitting component light emitted by the nitride phosphor and green light-emitting component light emitted by the green phosphor as output light.

Embodiment 8

As still another example of the light-emitting device of the present invention, the phosphor layer of Embodiment 6 or 7 further may contain a yellow phosphor activated with $Eu^{2+}$ or $Ce^{3+}$ and having an emission peak in a wavelength range of 560 nm to less than 600 nm. The yellow phosphor is not particularly limited as long as it is excited with light emitted by the light-emitting element described in Embodiment 6, and emits light having an emission peak in a wavelength range of 560 nm to less than 600 nm, preferably 565 nm to 580 nm.

For example, in the case of using a blue light-emitting element, a yellow phosphor whose excitation peak of an excitation spectrum on a longest wavelength side is not in a wavelength range of 420 nm to less than 500 nm (i.e., a yellow phosphor whose excitation peak of an excitation spectrum on a longest wavelength side is in a wavelength range of less than 420 nm) may be used.

Figure 34:
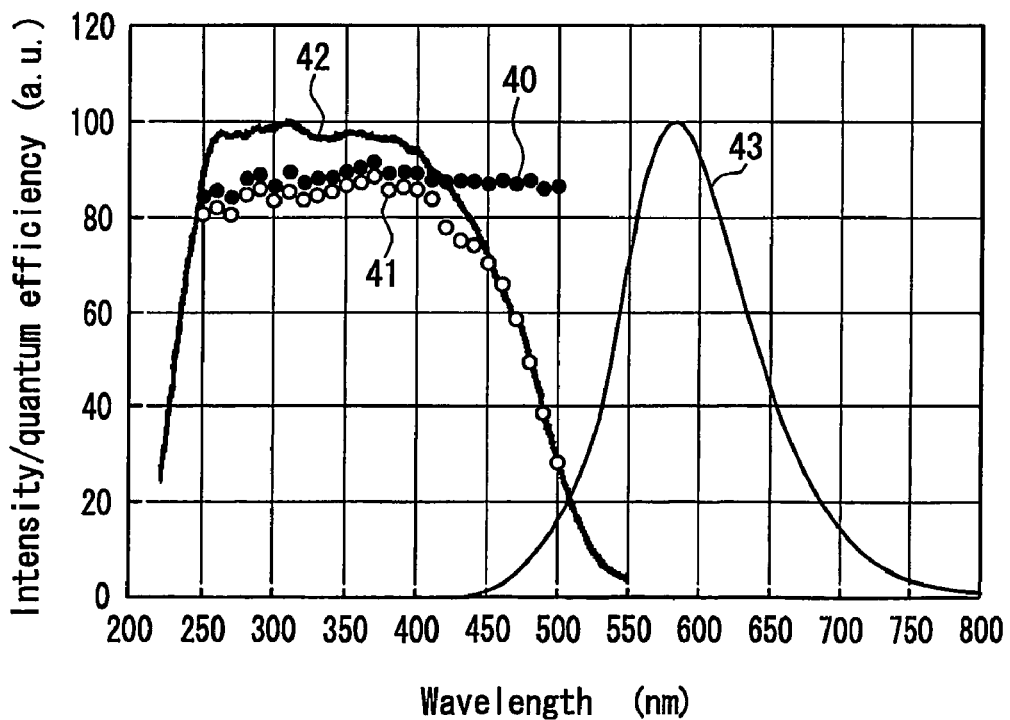
FIG. 34 shows emission characteristics of a $(Sr, Ca)_2SiO_4:Eu^{2+}$ yellow phosphor.
Figure 35:
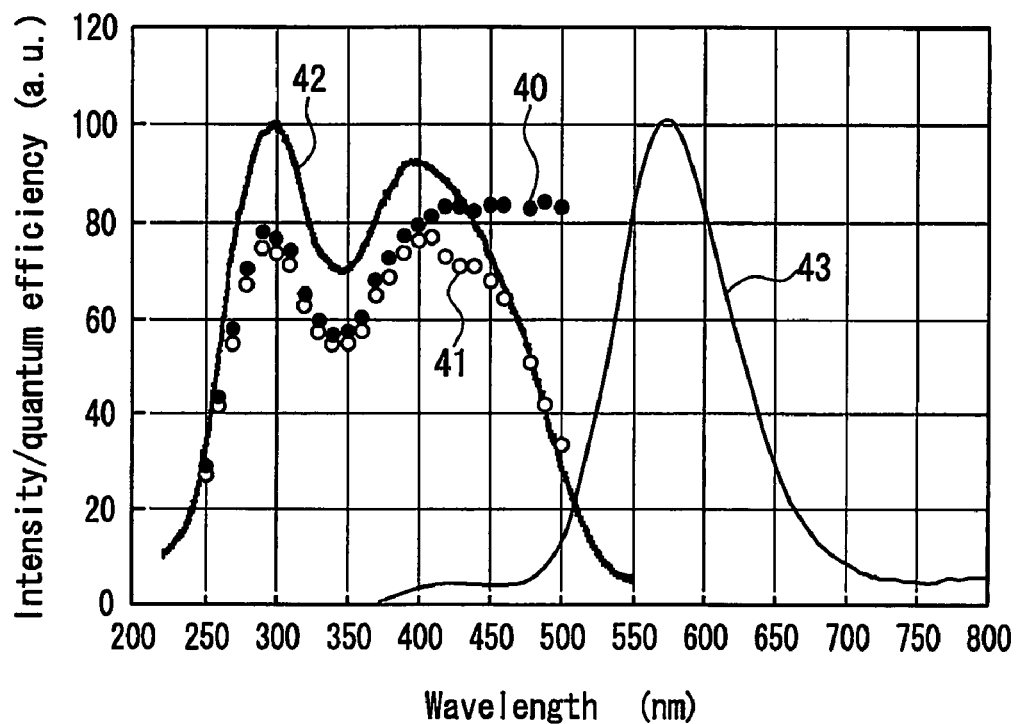
FIG. 35 shows emission characteristics of a $0.75CaO.2.25AlN.3.25 Si_3N_4:Eu^{2+}$ yellow phosphor.
Figure 36:
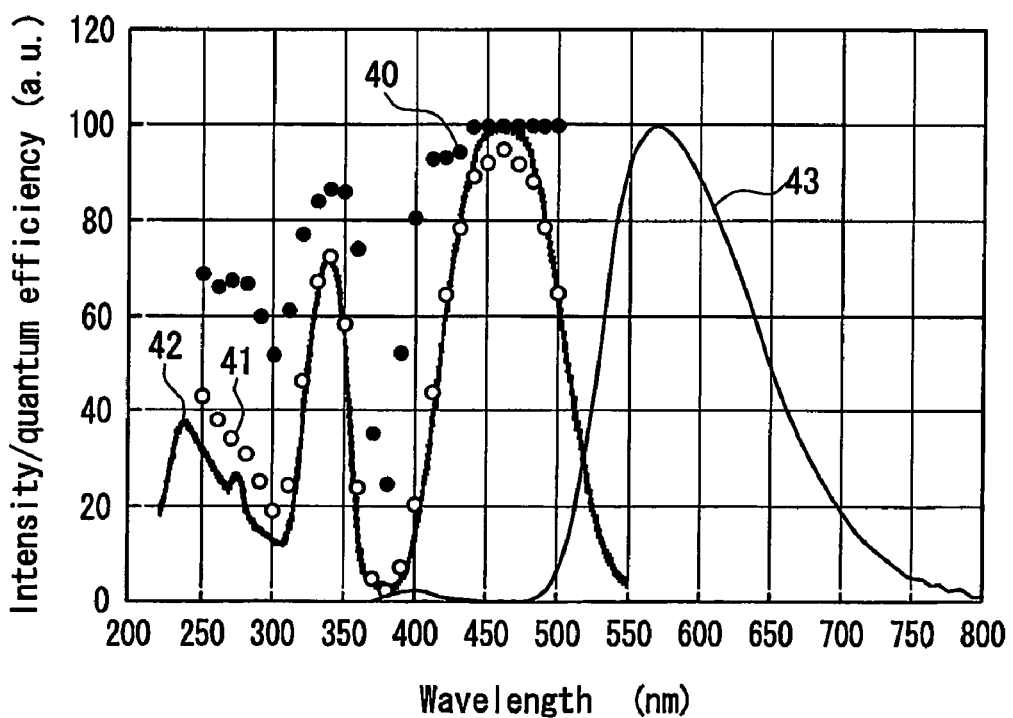
FIG. 36 shows emission characteristics of a $(Y, Gd)_3Al_5O_{12}:Ce^{3+}$ yellow phosphor.

The above-mentioned yellow phosphor corresponds to a phosphor having an internal quantum efficiency under the excitation of light in a wavelength range of 360 nm to less than 500 nm (e.g., a $(Sr, Ba)_2SiO_4:Eu^{2+}$ yellow phosphor shown in FIG. 33, a $(Sr, Ca)_2SiO_4:Eu^{2+}$ yellow phosphor shown in FIG. 34, a $0.75CaO.2.25 AlN.3.25 Si_3N_4:Eu^{2+}$ yellow phosphor shown in FIG. 35), and a phosphor having a high internal quantum efficiency under the excitation of light in a wavelength range of 420 nm to less than 500 nm (e.g., a $(Y, Gd)_3Al_5O_{12}:Ce^{3+}$ yellow phosphor shown in FIG. 36). A light-emitting device including at least a phosphor layer containing at least this phosphor and the above-mentioned light-emitting element is preferable since it outputs light energy efficiently. This light-emitting device has a high emission intensity of yellow light contained in output light and an enhanced color rendering property, and emits light, particularly in mild color or warm color. Furthermore, yellow light has relatively high spectral luminous efficacy, and a high luminous flux. In particular, depending upon the material design of the phosphor layer, it is possible to obtain output light having a high color rendering property with Ra of at least 90.

It is further preferable to use, as the above-mentioned yellow phosphor, a nitride phosphor or an oxynitride phosphor activated with $Eu^{2+}$ (e.g., $0.75CaO.2.25AlN.3.25Si_3N_4:Eu^{2+}$, $Ca_{1.5}Al_3Si_9N_{16}Eu^{2+}$, $CaSiAl_2O_3N_2:Eu^{2+}$, $CaSi_6AlON_9:Eu^{2+}$), an alkaline-earth metal orthosilicate phosphor activated with $Eu^{2+}$ (e.g., $(Sr, Ba)_2SiO_4:Eu^{2+}$, $(Sr, Ca)_2SiO_4:Eu^{2+}$), a thiogallate phosphor activated with $Eu^{2+}$ (e.g., $CaGa_2S_4:Eu^{2+}$), and a phosphor having a garnet configuration activated with $Ce^{3+}$ (e.g., $(Y, Gd)_3Al_5O_{12}:Ce^{3+}$) since the internal quantum efficiency under the excitation of the above-mentioned light-emitting element becomes high.

Thus, the light-emitting device of the present embodiment includes a phosphor layer containing at least the nitride phosphor of Embodiment 6 and the yellow phosphor, and the light-emitting element of Embodiment 6, and contains red light-emitting component light emitted by the nitride phosphor and yellow light-emitting component light emitted by the yellow phosphor in output light.

Embodiment 9

As still another example of the light-emitting device of the present invention, the phosphor layer described in any of Embodiments 6 to 8 further may contain a blue phosphor activated with $Eu^{2+}$ and having an emission peak in a wavelength range of 420 nm to less than 500 nm. The blue phosphor is not particularly limited as long as it is excited with light emitted by the light-emitting element described in Embodiment 6, and emits light having an emission peak in a wavelength range of 420 nm to less than 500 nm, preferably 440 nm to 480 nm in terms of the color rendering property and the output. In this case, the light-emitting element is not particularly limited as long as it is the one described in Embodiment 6; however, it is preferable to use a violet light-emitting element for the following reason. The range of choices of a phosphor ingredient is extended, so that it is easy to design the color of light emitted by the light-emitting device, and even when the wavelength position of light emitted by the light-emitting element varies depending upon the driving condition such as the power for the light-emitting element, the influence on output light is small.

Figure 37:
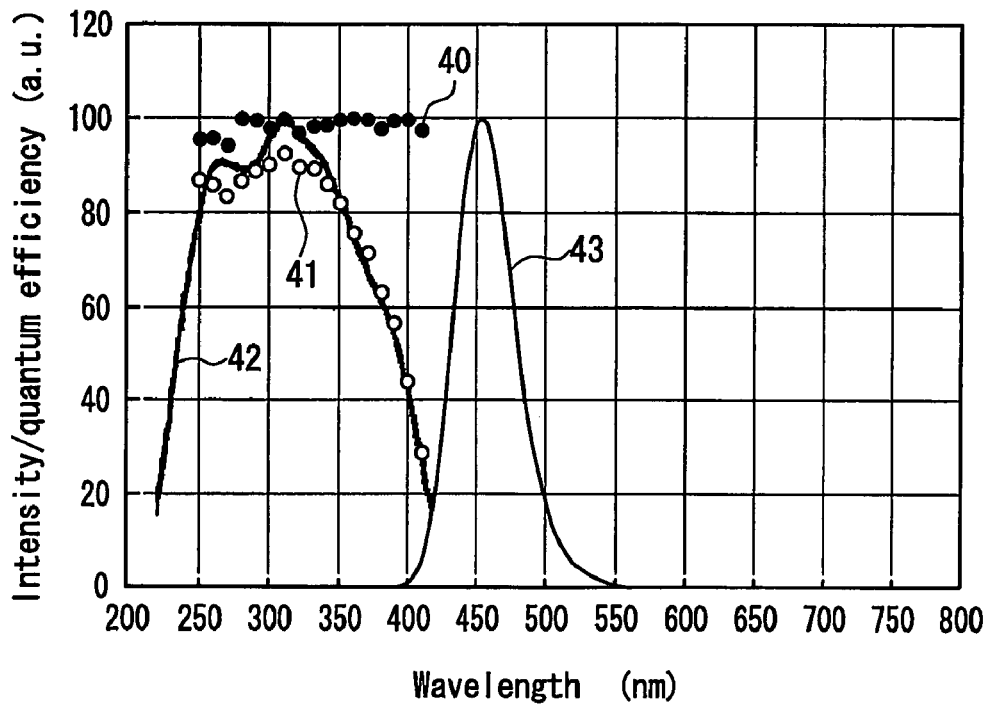
FIG. 37 shows emission characteristics of a $BaMgAl_{10}O_{17}:Eu^{2+}$ blue phosphor.
Figure 38:
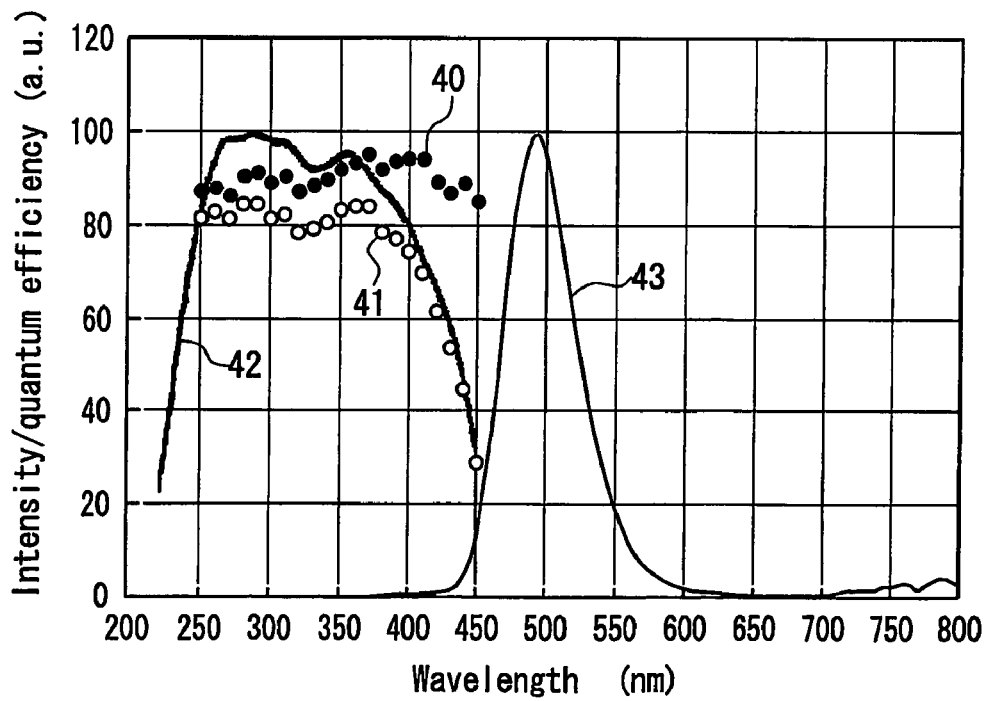
FIG. 38 shows emission characteristics of a $Sr_4Al_{14}O_{25}:Eu^{2+}$ blue-green phosphor.
Figure 39:
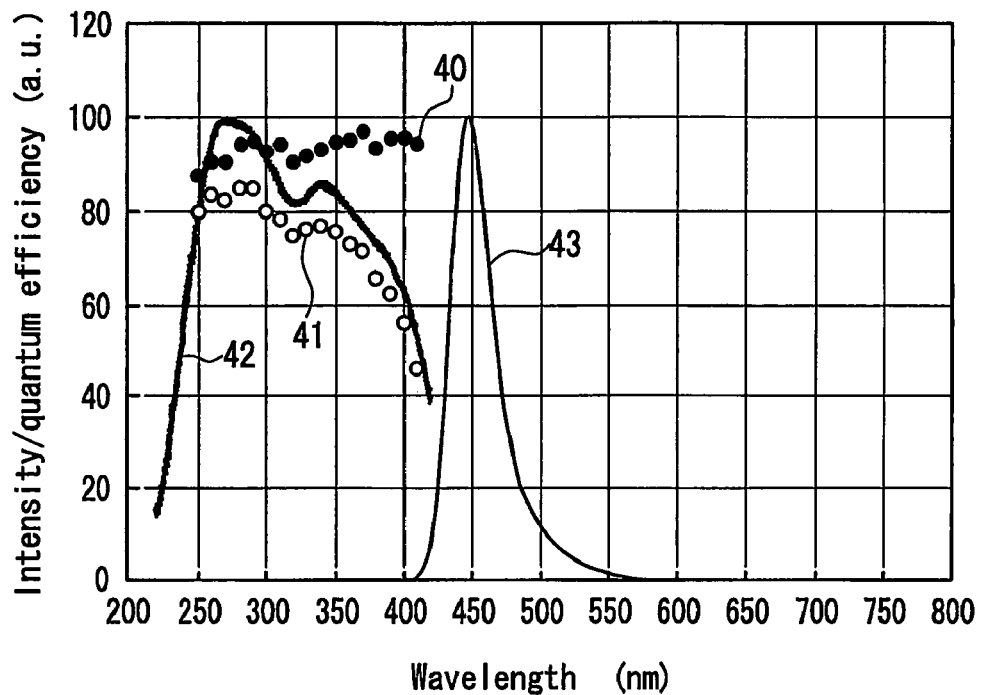
FIG. 39 shows emission characteristics of a $(Sr, Ba)_{10}(PO_4)_6Cl_2:Eu^{2+}$ blue phosphor.

The above-mentioned blue phosphor corresponds to a phosphor having a high internal quantum efficiency under the excitation of light in a wavelength range of 360 nm to less than 500 nm, preferably 360 nm to less than 420 nm (e.g., a $BaMgAl_{10}O_{17}:Eu^{2+}$ blue phosphor shown in FIG. 37, a $Sr_4Al_{14}O_{25}:Eu^{2+}$ blue phosphor shown in FIG. 38, a $(Sr, Ba)_{10}(PO_4)_6Cl_2:Eu^{2+}$ blue phosphor shown in FIG. 39). A light-emitting device including at least a phosphor layer containing this phosphor and the above-mentioned light-emitting element is preferable since it outputs light energy efficiently. This light-emitting device has a high intensity of blue emission contained in output light, an enhanced color rendering property, and a high luminous flux. In particular, depending upon the material design of the phosphor layer, it is possible to obtain output light having a high color rendering property with Ra of at least 90, and it is possible to obtain white output light dose to the sunlight with all the special color rendering indexes R1 to R15 of at least 80, preferably at least 85, and more preferably at least 90. For example, by using $BaMgAl_{10}O_{17}:Eu^{2+}$, $(Sr, Ba)_{10}(PO_4)_6Cl_2:Eu^{2+}$, $Ba_3MgSi_2O_8:Eu^{2+}$, $SrMgAl_{10}O_{17}:Eu^{2+}$, $(Sr, Ca)_{10}(PO_4)_6Cl_2:Eu^{2+}$, $Ba_5SiO_4Cl_6:Eu^{2+}$, $BaAl_8O_{1.5}:Eu^{2+}$, $Sr_{10}(PO_4)_6Cl_2:Eu^{2+}$, a blue phosphor, etc., output light having the above-mentioned high color rendering property and special color rendering index can be obtained.

Furthermore, it is further preferable to use, as the above-mentioned blue phosphor, a nitride phosphor or an oxynitride phosphor activated with $Eu^{2+}$ (e.g., $SrSiAl_2O_3N_2:Eu^{2+}$), an alkaline-earth metal orthosilicate phosphor activated with $Eu^{2+}$ (e.g., $Ba_3MgSi_2O_8:Eu^{2+}$, $Sr_3MgSi_2O_8:Eu^{2+}$), an aluminate phosphor activated with $Eu^{2+}$ (e.g., $BaMgAl_{10}O_{17}:Eu^{2+}$, $BaAl_8O_{13}:Eu^{2+}$, $Sr_4Al_{14}O_{25}:Eu^{2+}$), and a halophosphate phosphor activated with $Eu^{2+}$ (e.g., $Sr_{10}(PO_4)_6Cl_2:Eu^{2+}$), $(Sr, Ca)_{10}(PO_4)_6Cl_2:Eu^{2+}$, $(Ba, Ca, Mg)_{10}(PO_4)_6Cl_2:Eu^{2+}$), since the internal quantum efficiency under the excitation of the above-mentioned light-emitting element becomes high.

In Embodiments 6 to 9, in order to obtain a high luminous flux, it is preferable that the phosphor contained in the above-mentioned phosphor layer does not substantially contain a phosphor other than the phosphor activated with $Eu^{2+}$ or $Ce^{3+}$, and does not substantially contain an inorganic phosphor other than a nitride phosphor or an oxynitride phosphor. The configuration that does not substantially contain a phosphor other than the phosphor activated with $Eu^{2+}$ or $Ce^{3+}$ means that at least 90% by weight, preferably at least 95% by weight, and more preferably at least 98% by weight of the phosphor contained in the phosphor layer is a phosphor activated with $Eu^{2+}$ or $Ce^{3+}$. Furthermore, the configuration that does not substantially contain an inorganic phosphor other than a nitride phosphor or an oxynitride phosphor means that at least 90% by weight, preferably at least 95% by weight, and more preferably at least 98% by weight of the phosphor contained in the phosphor layer is a nitride phosphor or an oxynitride phosphor. The above-mentioned nitride phosphor or oxynitride phosphor holds a relatively high internal quantum efficiency even at an operation temperature and an environmental temperature of 100° C. to 150° C., and the peak of a wavelength of an emission spectrum does not shift to a short wavelength side, for example, as in the above-mentioned alkaline-earth metal orthosilicate phosphor or phosphor having a garnet configuration. Therefore, even when the power is increased to enhance the intensity of excited light of the light-emitting device with the above configuration, or even when the light-emitting device is used in a high temperature atmosphere, the emission color varies less, whereby stable output light is obtained.

In order to obtain a light-emitting device emitting a high luminous flux, a phosphor having a lowest internal quantum efficiency under the excitation of light emitted by the light-emitting element, among phosphors substantially contained in the phosphor layer, is set to have an internal quantum efficiency (absolute value) of at least 80%, preferably at least 85%, and more preferably at least 90%.

Embodiment 10

Still another example of the light-emitting device of the present invention includes a phosphor layer containing a phosphor and a light-emitting element. The light-emitting element has an emission peak in a wavelength range of 360 nm to less than 500 nm, and the phosphor is excited with light emitted by the light-emitting element to emit light. The light-emitting device contains at least light-emitting component light emitted by the phosphor as output light. Furthermore, the phosphor contains a nitride phosphor or an oxynitride phosphor activated with $Eu^{2+}$ and having an emission peak in a wavelength range of 600 nm to less than 660 nm, and an alkaline-earth metal orthosilicate phosphor excited with $Eu^{2+}$ and having an emission peak in a wavelength range of 500 nm to less than 600 nm. Each internal quantum efficiency of these phosphors under the excitation of light emitted by the light-emitting element is at least 80%.

As the light-emitting element, the same light-emitting element as that described in Embodiment 6 can be used.

It is preferable that the output light contains light-emitting component light emitted by the light-emitting element. In particular, in the case where the light-emitting element has an emission peak in a blue wavelength range, it is preferable that light-emitting component light emitted by the phosphor and light-emitting component light emitted by the light-emitting element are contained in output light, since white light having a higher color rendering property is obtained.

The above-mentioned nitride phosphor or oxynitride phosphor activated with $Eu^{2+}$ corresponds to a phosphor emitting light in a warm color having an emission peak in a wavelength range of 600 nm to less than 660 nm, preferably red light having an emission peak in a wavelength range of 610 nm to 650 nm, and having a high internal quantum efficiency under the excitation of light in a wavelength range of 360 nm to less than 500 nm. More specifically, a nitridoaluminosilicate phosphor represented by a composition formula: $(M_{1-x}Eu_x)AlSiN_3$ (e.g., a $SrAlSiN_3:Eu^{2+}$ red phosphor, a $CaAlSiN_3:Eu^{2+}$ red phosphor shown in FIG. 30), a nitridosilicate phosphor represented by a composition formula: $(M_{1-x}Eu_x)SiN_2$ (e.g., a $SrSiN_2:Eu^{2+}$ red phosphor or a $CaSiN_2:Eu^{2+}$ red phosphor shown in FIG. 29), a nitridosilicate phosphor represented by a composition formula: $(M_{1-x}Eu_x)_2Si_5N_8$ (e.g., a $Sr_2Si_5N_8:Eu^{2+}$ red phosphor, a $Ca_2Si_5N_8:Eu^{2+}$ red phosphor, or a $Ba_2Si_5N_8:Eu^{2+}$ red phosphor shown in FIG. 31), or an oxonitridoaluminosilicate phosphor represented by a composition formula: $(M_{1-x}Eu_x)_2Si_4AlON_7$ (e.g., a $Sr_2Si_4AlON_7:Eu^{2+}$ red phosphor) may be used. In the above composition formula, "M" is at least one element selected from the group consisting of Mg, Ca, Sr, Ba, and Zn, and "x" is a numerical value satisfying $0.005 \leq x \leq 0.3$.

Furthermore, the above-mentioned alkaline-earth metal orthosilicate phosphor is activated with $Eu^{2+}$ and has an emission peak in a wavelength range of 500 nm to less than 600 nm, preferably 525 nm to less than 600 nm. More specifically, the above-mentioned alkaline-earth metal orthosilicate phosphor corresponds to a green phosphor having an emission peak in a wavelength range of 525 nm to less than 560 nm, more preferably 530 nm to 550 nm (e.g., a $(Ba, Sr)_2SiO_4:Eu^2$ green phosphor shown in FIG. 32), or a yellow phosphor having an emission peak in a wavelength range of 560 nm to less than 600 nm (e.g., a $(Sr, Ba)_2SiO_4:Eu^{2+}$ yellow phosphor shown in FIG. 33), a $(Sr, Ca)_2SiO_4:Eu^{2+}$ yellow phosphor shown in FIG. 34), and having a high internal quantum efficiency under the excitation of light in a wavelength range of 360 nm to less than 500 nm.

The above-mentioned phosphors have an internal quantum efficiency of at least 80%, preferably at least 85%, and more preferably at least 90% under the excitation of light emitted by the light-emitting element. A light-emitting device including at least a phosphor layer containing a phosphor having a high internal quantum efficiency as described above and the above-mentioned light-emitting element can output light energy efficiently. Furthermore, a light-emitting device configured using the above-mentioned nitride phosphor or oxynitride phosphor has a high intensity of a light-emitting component in a warm color, and a special color rendering index R9 with a large numerical value.

Furthermore, the light-emitting device with the above-mentioned configuration does not use a sulfide phosphor that has a problem in terms of the reliability, and uses an expensive nitride phosphor or oxynitride phosphor only as a red phosphor, whereby a white light source with a high luminous flux and a high color rendering property can be provided, and the cost of a light-emitting device such as a white light source can be reduced.

The light-emitting device of the present embodiment is not particularly limited, as long as it includes at least a phosphor layer containing the above-mentioned nitride phosphor or oxynitride phosphor that is excited with $Eu^{2+}$ to emit red light, and the above-mentioned alkaline-earth metal orthosilicate phosphor activated with $Eu^{2+}$, and the above-mentioned light-emitting element. For example, the light-emitting device of the present embodiment corresponds to the above-mentioned white LED or the like.

In the present embodiment, it is more preferable that the main component of the above-mentioned element "M" is set to be Sr or Ca, since the nitride phosphor or oxynitride phosphor represented by the above-mentioned composition formula has a satisfactory color tone and a high emission intensity. Setting the main component to be Sr or Ca means that at least 50 atomic % of the element "M" is any one element of Sr and Ca. Furthermore, it is preferable that at least 80 atomic % of the element "M" is any one element of Sr and Ca, and it is more preferable that all the atoms of the element "M" is any one element of Sr and Ca.

Furthermore, it is preferable to use the above-mentioned injection type electroluminescence element as the above-mentioned light-emitting element, since such an element emits strong output light.

It is preferable to use, as the above-mentioned alkaline-earth metal orthosilicate phosphor, a green phosphor activated with $Eu^{2+}$ and having an emission peak in a wavelength range of 500 nm to less than 560 nm, preferably 525 nm to less than 560 nm, and more preferably 530 nm to 550 nm (e.g., $(Ba, Sr)_2SiO_4:Eu^{2+}$, $(Ba, Ca)_2SiO_4:Eu^2$). A light-emitting device using this green phosphor has a high emission intensity of green light contained in output light, and an enhanced color rendering property. Furthermore, green light has high spectral luminous efficacy and a higher luminous flux. In particular, depending upon the combination of phosphors contained in the phosphor layer, it is possible to obtain output light having a high color rendering property with Ra of at least 90.

Furthermore, it is preferable to use, as the above-mentioned alkaline-earth metal orthosilicate phosphor, a yellow phosphor activated with $Eu^{2+}$ and having an emission peak in a wavelength range of 560 nm to less than 600 nm, preferably 565 nm to 580 nm (e.g., $(Sr, Ba)_2SiO_4:Eu^{2+}$). A light-emitting device using this yellow phosphor has a high emission intensity of yellow light contained in output light, and an enhanced color rendering property. In particular, a light-emitting device emitting light in mild color or warm color can be provided. Furthermore, yellow light has relatively high spectral luminous efficacy and a high luminous flux. In particular, depending upon the material design of the phosphor layer, it is possible to obtain output light with Ra of at least 90 and a high color rendering property. Furthermore, it also is preferable to use a $(Sr, Ca)_2SiO_4:Eu^{2+}$ yellow phosphor, or the light emitting fluorescence close to that of the above-mentioned yellow phosphor.

In the present embodiment, it is preferable that a nitride phosphor or an oxynitride phosphor is not substantially contained as a phosphor other than the above-mentioned red phosphor contained in the above-mentioned phosphor layer. Because of this, the amount of a nitride phosphor or an oxynitride phosphor used in a light-emitting device can be minimized, and the production cost of the light-emitting device can he reduced. Furthermore, it is preferable that a sulfide phosphor is not substantially contained as a phosphor other than the above-mentioned red phosphor contained in the above-mentioned phosphor layer. This can enhance the reliability of a light-emitting device, and for example, a light-emitting device with less change (e.g., degradation) with time can be provided.

Even in Embodiment 10, it is preferable that the phosphor contained in the above-mentioned phosphor layer does not substantially contain a phosphor other than the phosphor activated with $Eu^{2+}$ or $Ce^{3+}$ so as to obtain a high luminous flux. Furthermore, it is preferable that the internal quantum efficiency of a phosphor having a lowest internal quantum efficiency under the excitation of light emitted by a light-emitting element, among the phosphors substantially contained in the phosphor layer, is at least 80%.

Hereinafter, light-emitting devices of Embodiments 6 to 10 will be described with reference to FIGS. 1 to 12.

FIGS. 1, 2, and 3 are cross-sectional views of semiconductor light-emitting devices showing examples of the light-emitting device of the present invention.

FIG. 1 shows a semiconductor light-emitting device having a configuration in which at least one light-emitting element 1 is mounted on a submount element 4, and the light-emitting element 1 is sealed with a base material that also functions as a phosphor layer 3 containing a phosphor composition 2. FIG. 2 shows a semiconductor light-emitting device having a configuration in which at least one light-emitting element 1 is mounted on a cup 6 provided at a mount lead of a lead frame 5, the phosphor layer 3 containing the phosphor composition 2 is provided in the cup 6, and the entire body is sealed with a sealant 7 made of resin or the like. FIG. 3 shows a semiconductor light-emitting element of a chip type having a configuration in which at least one light-emitting element 1 is mounted in a housing 8, and the phosphor layer 3 containing the phosphor composition 2 is provided.

In FIGS. 1 to 3, the light-emitting element 1 is a photoelectric transducer for converting electric energy into light, and is not particularly limited as long as it emits light having an emission peak in a wavelength range of 360 nm to less than 500 nm, preferably 380 nm to less than 420 nm or 440 nm to less than 500 nm, and more preferably 395 nm to 415 nm or 450 nm to 480 nm. For example, an LED, an LD, a surface-emitting LD, an inorganic EL element, an organic EL element, or the like may be used. In particular, in order to increase the output of a semiconductor light-emitting element, an LED or a surface-emitting LED is preferable.

In FIGS. 1 to 3, the phosphor layer 3 is configured by dispersing, as the phosphor composition 2, at least a nitride phosphor represented by a composition formula: $(M_{1-x}Eu_x)AlSiN_3$ where "M" is at least one element selected from the group consisting of Mg, Ca, Sr, Ba, and Zn, and "x" is a numerical value satisfying $0.005 \leq x\ 0.3$.

There is no particular limit on a material used for the base material of the phosphor layer 3, and in general, transparent resin such as epoxy resin or silicone resin, low-melting glass, or the like may be used. In order to provide a light-emitting device having less decrease in emission intensity with the passage of an operation time, the above-mentioned base material is preferably silicone resin or a translucent inorganic material such as low-melting glass, and more preferably the above-mentioned translucent inorganic material. For example, in the case of using the transparent resin for the base material of the phosphor layer 3, the content of a nitride phosphor is preferably 5 to 80% by weight, and more preferably 10 to 60% by weight. The nitride phosphor contained in the phosphor layer 3 absorbs a part or an entirety of light emitted by the light-emitting element 1 to convert it into red light. Therefore, light-emitting component light emitted by the nitride phosphor is contained as output light of the semiconductor light-emitting device.

Furthermore, in the case where the phosphor layer 3 contains at least a nitride phosphor represented by a composition formula: $(M_{1-x}Eu_x)AlSiN_3$ as the phosphor composition 2, the phosphor layer 3 further may contain a phosphor other than the nitride phosphor. For example, when the above-mentioned alkaline-earth metal orthosilicate phosphor, nitride phosphor, oxynitride phosphor, aluminate phosphor, halophosphate phosphor, thiogallate phosphor, and the like, activated with $Eu^{2+}$ or $Ce^{3+}$ and having a high internal quantum efficiency under the excitation of light in a wavelength range of 360 nm to less than 500 nm are used in the following phosphor layers (1) to (6), and a violet light-emitting element having an emission peak in a wavelength range of 360 nm to less than 420 nm is used as the light-emitting element 1, a phosphor is excited with light emitted by the light-emitting element 1 at a high efficiency, whereby a semiconductor light-emitting element is obtained, which emits white light, for example, owing to the color mixture and the like of light emitted by a plurality of phosphors.

(1) A phosphor layer containing a blue phosphor emitting light having an emission peak in a wavelength range of 420 nm to less than 500 nm, preferably 440 nm to less than 500 nm, a green phosphor emitting light having an emission peak in a wavelength range of 500 nm to less than 560 nm, preferably 510 nm to 550 nm, a yellow phosphor emitting light having an emission peak in a wavelength range of 560 nm to less than 600 nm, preferably 565 nm to 580 nm, and the above-mentioned nitride phosphor.

(2) A phosphor layer containing a blue phosphor emitting light having an emission peak in a wavelength range of 420 nm to less than 500 nm, preferably 440 nm to less than 500 nm, a green phosphor emitting light having an emission peak in a wavelength range of 500 nm to less than 560 nm, preferably 510 nm to 550 nm, and the above-mentioned nitride phosphor.

(3) A phosphor layer containing a blue phosphor emitting light having an emission peak in a wavelength range of 420 nm to less than 500 nm, preferably 440 nm to less than 500 nm, a yellow phosphor emitting light having an emission peak in a wavelength range of 560 nm to less than 600 nm, preferably 565 nm to 580 nm, and the above-mentioned nitride phosphor.

(4) A phosphor layer containing a green phosphor emitting light having an emission peak in a wavelength range of 500 nm to less than 560 nm, preferably 525 nm to less than 560 nm, a yellow phosphor emitting light having an emission peak in a wavelength range of 560 nm to less than 600 nm, preferably 565 nm to 580 nm, and the above-mentioned nitride phosphor.

(5) A phosphor layer containing the above-mentioned yellow phosphor and the above-mentioned nitride phosphor.

(6) A phosphor layer containing the above-mentioned green phosphor and the above-mentioned nitride phosphor.

Furthermore, when the above-mentioned phosphors are used in the following phosphor layers (7) to (9), and a blue light-emitting element having an emission-peak in a wavelength range of 420 nm to less than 500 nm is used as the light-emitting element 1, a semiconductor light-emitting device is obtained that emits white light owing to the color mixture of light emitted by the light-emitting element 1 and light emitted by the phosphors, etc.

(7) A phosphor layer containing a green phosphor emitting light having an emission peak in a wavelength range of 500 nm to less than 560 nm, preferably 525 nm to less than 560 nm, a yellow phosphor emitting light having an emission peak in a wavelength range of 560 nm to less than 600 nm, preferably 565 nm to 580 nm, and the above-mentioned nitride phosphor.

(8) A phosphor layer containing the yellow phosphor and the above-mentioned nitride phosphor.

(9) A phosphor layer containing the green phosphor and the above-mentioned nitride phosphor.

In the case of using a blue light-emitting element as the light-emitting element, the green phosphor and the yellow phosphor can be widely selected from not only an alkaline-earth metal orthosilicate phosphor activated with $Eu^{2+}$, a nitride phosphor activated with $Eu^{2+}$, and an oxynitride phosphor, but also a phosphor (in particular, a YAG:Ce phosphor) having a garnet configuration activated with $Ce^{3+}$, a thiogallate phosphor activated with $Eu^{2+}$, and the like. More specifically, a $SrGa_2S_4:Eu^{2+}$ green phosphor, a $Y_3(Al, Ga)_5O_{12}$: $Ce^{3+}$ green phosphor, a $Y_3Al_5O_{12}:Ce^{3+}$ green phosphor, a $BaY_2SiAl_4O_{12}:Ce^{3+}$ green phosphor, a $Ca_3Sc_2Si_3O_{12}:Ce^{3+}$ green phosphor, a $(Y, Gd)_3Al_5O_{12}:Ce^{3+}$ yellow phosphor, a $Y_3Al_5O_{12}:Ce^{3+}, Pr^{3+}$ yellow phosphor, a $CaGa_2S_4:Eu^{2+}$ yellow phosphor, or the like can be used.

Alternatively, in FIGS. 1 to 3, the phosphor layer 3 is configured by at least dispersing, as the phosphor composition 2, a nitride phosphor or an oxynitride phosphor activated with $Eu^{2+}$ and having an emission peak in any wavelength range of 500 nm to less than 560 nm or 560 nm to less than 600 nm.

Regarding the phosphor layer 3, the above-mentioned base material may be used. Furthermore, the phosphor composition 2 contained in the phosphor layer 3 absorbs a part or an entirety of light emitted by the light-emitting element 1 to convert it into light. Therefore, the output light of the semiconductor light-emitting device contains at least light-emitting component light emitted by a nitride phosphor or an oxynitride phosphor, and light-emitting component light emitted by an alkaline-earth metal orthosilicate phosphor.

Furthermore, even in the case where the phosphor layer 3 contains, as the phosphor composition 2, a nitride phosphor or an oxynitride phosphor that is activated with $Eu^{2+}$ to emit red light, and an alkaline-earth metal orthosilicate phosphor that is activated with $Eu^{2+}$ and has an emission peak in any wavelength range of 500 nm to less than 560 nm or 560 nm to less than 600 nm, the phosphor layer 3 further may or may not contain the above-mentioned nitride phosphor or oxynitride phosphor, and a phosphor other than an alkaline-earth metal orthosilicate phosphor.

For the purpose of reducing the used amount of the nitride phosphor or the oxynitride phosphor, and the sulfide phosphor, it is preferable that the phosphor layer does not contain a nitride phosphor or an oxynitride phosphor other than the above and a sulfide phosphor.

For example, if the above-mentioned aluminate phosphor, halophosphate phosphor, etc. activated with $Eu^{2+}$ or $Ce^{3+}$ and having a high internal quantum efficiency under the excitation of a wavelength range of 360 nm to less than 500 nm, and the above-mentioned phosphor layers (1) to (6) are used in combination, a phosphor is excited with light emitted by the light-emitting element at a high efficiency, whereby a semiconductor light-emitting device emits white light owing to the color mixture of light emitted by a plurality of phosphors. Furthermore, if the above-mentioned aluminate phosphor, halophosphate phosphor, etc. and the above-mentioned phosphor layers (7) to (9) are used in combination, a semiconductor light-emitting device emits white light owing to the color mixture of light emitted by the light-emitting element 1 and light emitted by the phosphor.

The semiconductor light-emitting device of the present embodiment uses a phosphor having an external quantum efficiency under the excitation of the blue light-emitting element that is not necessarily high and a high internal quantum efficiency. Therefore, for example, in the case of obtaining desired white light by the color mixture of light emitted by the blue light-emitting element and light emitted by the phosphor, a relatively large amount of the phosphor is required. Thus, in order to obtain desired white light, it is necessary to increase the thickness of a phosphor layer. On the other hand, when the thickness of the phosphor layer increases, there is an advantage that a light-emitting device with less color irregularity of white light is obtained.

It is preferable that the phosphor layer 3 is composed of a plurality of layers or a multi-layered configuration, and a part of the phosphor layer 3 contains the above-mentioned nitride phosphor or oxynitride phosphor, since color blur and output blur of emitted light of the semiconductor light-emitting device of the present embodiment can be suppressed.

A nitride phosphor or an oxynitride phosphor containing $Eu^{2+}$ as a luminescent center ion absorbs blue, green, and yellow visible light to convert it into red light. Therefore, when the phosphor layer 3 containing the above-mentioned nitride phosphor or oxynitride phosphor is formed by mixing a blue phosphor, a green phosphor, or a yellow phosphor, and the above-mentioned nitride phosphor or oxynitride phosphor, the phosphor layer 3 absorbs light emitted by the blue, green, or yellow phosphor, whereby the nitride phosphor or oxynitride phosphor emits red light. Therefore, it becomes difficult to control the emission color of the light-emitting device for the reason in terms of production steps of a phosphor layer. In order to solve this problem, it is preferable that the phosphor layer 3 is composed of a plurality of layers or a multi-layered configuration, and the layer closest to a principal light output surface of the light-emitting element 1 is made of a nitride phosphor or an oxynitride phosphor emitting red light, whereby the phosphor layer 3 is made unlikely to be excited with light emitted by the blue, green, or yellow phosphor. Furthermore, the yellow phosphor activated with $Eu^{2+}$ or $Ce^{3+}$ is excited with blue light or green light, and the above-mentioned green phosphor activated with $Eu^{2+}$ or $Ce^{3+}$ is excited with blue light. Therefore, in the case where the phosphor layer 3 is formed by mixing a plurality of kinds of phosphors having different emission colors, the same problem as the above may arise. In order to solve this problem, in the semiconductor light-emitting device of the present embodiment, it is preferable that the phosphor layer 3 is composed of a plurality of layers or a multi-layered configuration, and the layer farthest from the principal light output surface of the light-emitting element 1 is made of a phosphor emitting light with a short wavelength.

The semiconductor light-emitting device of the present embodiment includes at least the above-mentioned light-emitting element, and a phosphor layer having a high internal quantum efficiency under the excitation of the light-emitting element and containing at least a nitride phosphor or an oxynitride phosphor that converts excited light into red light efficiently, and provides, as output light, at least red light-emitting component light emitted by the nitride phosphor or oxynitride phosphor. The semiconductor light-emitting device satisfies both a high luminous flux and a high color rendering property, and in particular, emits white light in a warm color. In the case where the light-emitting element is a blue light-emitting element, the output light further contains light-emitting component light emitted by the light-emitting element.

FIGS. 4 and 5 are schematic views showing configurations of illumination•display devices showing examples of the light-emitting device of the present invention. FIG. 4 shows an illumination•display device configured using at least one semiconductor light-emitting device 9 in which the phosphor layer 3 containing the above-mentioned phosphor composition 2 is combined with the light-emitting element 1, and output light 10 thereof. FIG. 5 shows an illumination•display device in which at least one light-emitting element 1 is combined with the phosphor layer 3 containing the above-mentioned phosphor composition 2, and output light 10 thereof. The same light-emitting element 1 and the phosphor layer 3 as those of the semiconductor light-emitting device described above can be used. Furthermore, the function, effect, and the like of the illumination•display device with such a configuration also are the same as those in the case of a semiconductor light-emitting device described above.

FIGS. 6 to 12 show specific examples incorporating the illumination•display devices that are the embodiments of the light-emitting device of the present invention schematically shown in FIGS. 4 and 5. FIG. 6 is a perspective view of an illumination module 12 having an integrated light-emitting portion 11. FIG. 7 is a perspective view of the illumination module 12 having a plurality of light-emitting portions 11.

FIG. 8 is a perspective view of a table lamp type illumination device having a light-emitting portion 11 and being capable of controlling the ON-OFF and light amount with a switch 13. FIG. 9 is a side view of an illumination device as a light source configured using a screw cap 14, a reflective plate 15, and an illumination module 12 having a plurality of light-emitting portions 11. FIG. 10 is a bottom view of the illumination device shown in FIG. 9. FIG. 11 is a perspective view of a plate type image display device provided with the light-emitting portions 11. FIG. 12 is a perspective view a segmented number display device provided with the light-emitting portions 11.

The illumination•display device of the present embodiment is configured using a phosphor having a high internal quantum efficiency under the excitation of the light-emitting element, in particular, using a semiconductor light-emitting device with high intensity of a red light-emitting component and a satisfactory color rendering property. Therefore, the illumination•display device satisfies a high luminous flux, and in particular a high color rendering property with a high intensity of a red light-emitting component, which are excellent relative to those of the conventional illumination•display device.

As described above, according to the present invention, by combining at least the above-mentioned nitride phosphor represented by a composition formula: $(M_{1-x}Eu_x)AlSiN_3$, with the light-emitting element, a light-emitting device that satisfies both a high luminous flux and a high color rendering property, in particular, a light-emitting device emitting white light in a warm color can be provided.

Furthermore, according to the present invention, by combining at least a nitride phosphor or an oxynitride phosphor having an emission peak in a wavelength range of 600 nm to less than 660 nm, an alkaline-earth metal orthosilicate phosphor having an emission peak in a wavelength range of 500 nm to less than 600 nm, and the light-emitting element, a light-emitting device satisfying both a high luminous flux and a high color rendering property, in particular, a light-emitting device emitting white light in a warm color can be provided.

Hereinafter, the light-emitting device of the present invention will be described in detail by way of examples.

EXAMPLE 26

Figure 41:
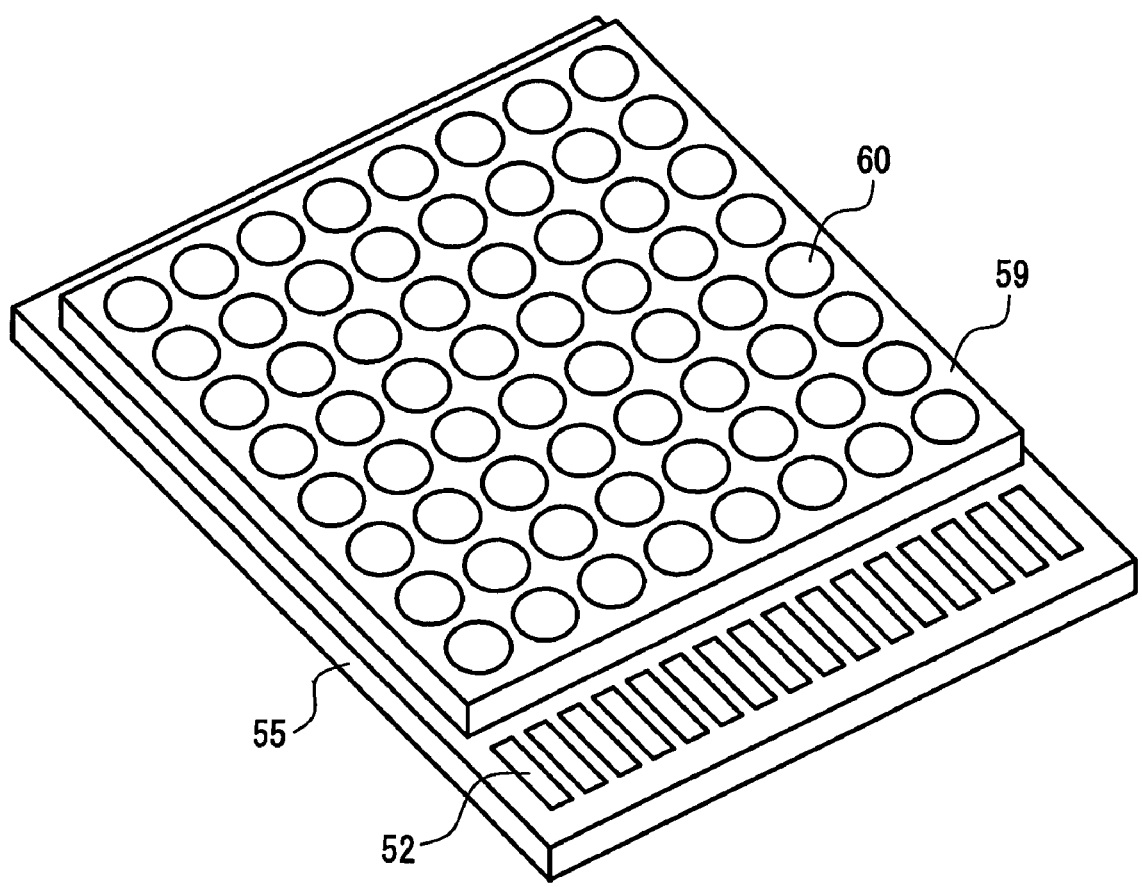
FIG. 41 is a perspective view of a light-emitting device in Example 26 of the present invention.
Figure 42:
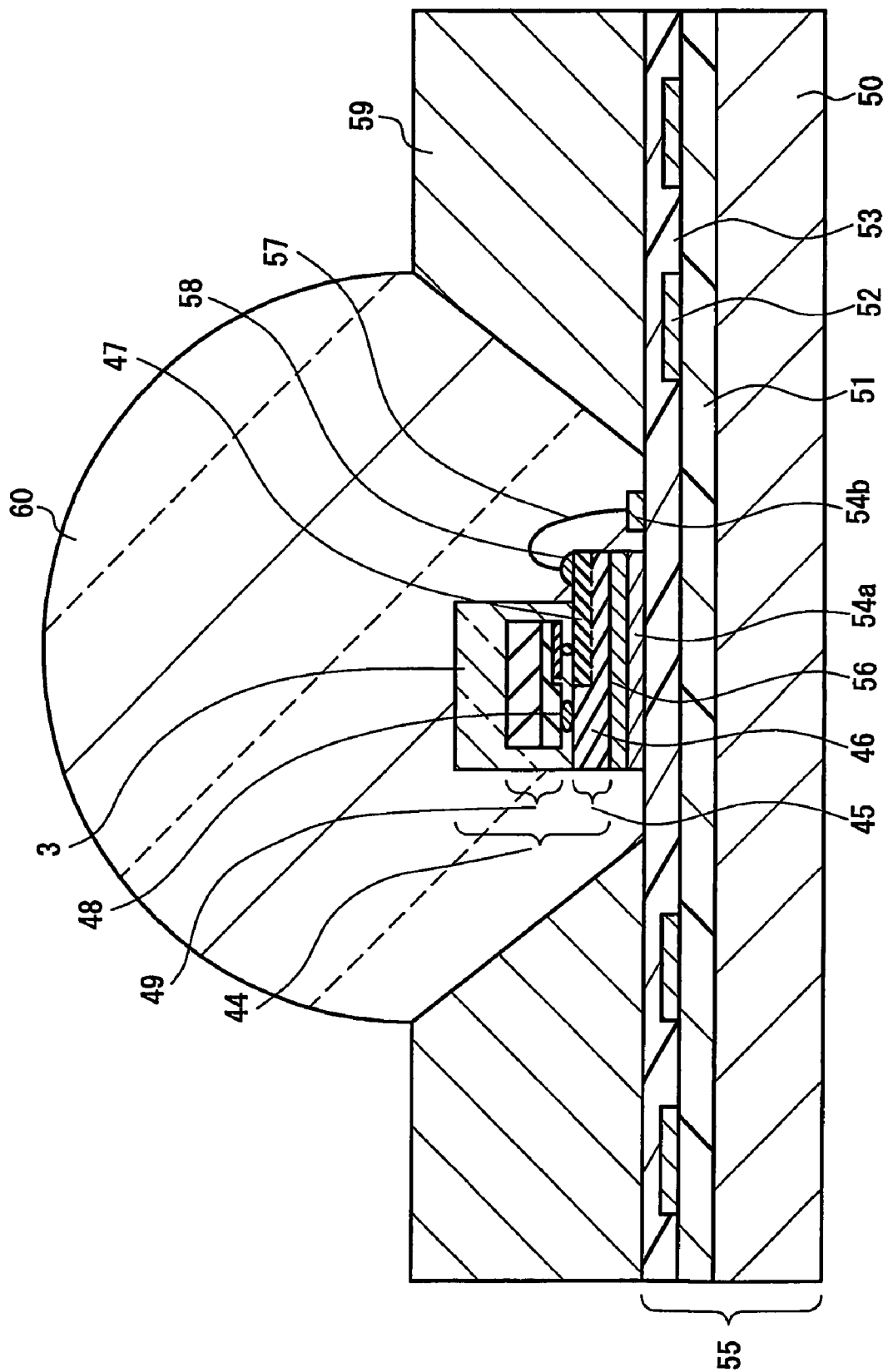
FIG. 42 a partial cross-sectional view of the light-emitting device in Example 26 of the present invention.

In the present example, a card-type illumination module light source shown in FIG. 41 was produced as a light-emitting device, and the emission characteristics thereof were evaluated. FIG. 42 is a partial cross-sectional view of FIG. 41.

First, a method for producing a semiconductor light-emitting device 44 will be described. A blue LED chip 49 emitting light having an emission peak in the vicinity of 470 nm was mounted as a GaInN light-emitting layer on paired n-electrode 46 and p-electrode 47 of respective Si diode elements (submount elements) 45 formed in a matrix on an n-type Si wafer via a micro-bump 48.

The blue LED chip 49 was mounted on the respective Si diode elements 45 formed in a matrix, and consequently, the blue LED chips 49 also were mounted in a matrix.

Then, the n-electrode 46 and the p-electrode 47 were connected to an n-electrode and a p-electrode of each blue LED chip 49. Thereafter, the phosphor layer 3 containing the phosphor composition 2 was formed on the periphery of the blue LED chip 49 using a printing technique. Furthermore, the upper surface of the phosphor layer 3 was flattened by polishing, and then, cut to be separated with a diamond cutter to form a semiconductor light-emitting device 44.

Next, a first insulating thick film 51 (thickness: 75 μm), a copper electrode 52 (thickness: about 10 μm, width: 0.5 mm), a second insulating thick film 53 (thickness: 30 µm), and electrode pads 54a and 54b (thickness: about 10 µm, 64 pairs in total) were laminated successively on an aluminum metal substrate 50 (size: 3 cm×3 cm, thickness: 1 mm), whereby a radiating multi-layered substrate 55 was formed. The first insulating thick film 51 and the second insulating thick film 53 were made of alumina-dispersed epoxy resin formed by thermocompression bonding. Furthermore, the copper electrode 52 was patterned by etching, and the electrode pads 54a and 54b were positive and negative electrodes for supplying power formed by etching. A contact hole was provided in a part of the second insulating thick film 53, and the electrode pads 54a and 54b were formed so as to supply a current through the copper electrode 52.

Next, the semiconductor light-emitting device 44 was disposed at a predetermined position on the radiating multi-layered substrate 55. At this time, a reverse electrode (n-electrode) 56 of the Si diode element 45 was attached to the electrode pad 54a with an Ag paste, and a bonding pad portion 58 on the p-electrode 47 was connected to the electrode pad 54b with an Au wire 57, whereby a current can be supplied to the semiconductor light-emitting device 44.

Next, an aluminum metal reflective plate 59 having a ground hole in the shape of a reverse conical tube was attached to the radiating multi-layered substrate 55 with an adhesive. At this time, the semiconductor light-emitting device 44 on the radiating multi-layered substrate 55 was formed so as to be housed in the ground hole of the aluminum metal reflective plate 59. Furthermore, a dome-shaped lens 60 using epoxy resin was formed so as to cover the semiconductor light-emitting device 44 and the entire ground hole, whereby the light-emitting device of Example 26 was obtained.

FIG. 41 is a perspective view of the light-emitting device of Example 26. In Example 26, a card-type illumination module light source was produced using 64 semiconductor light-emitting devices 44, and the emission characteristics thereof were evaluated.

In Example 26, a current of about 40 mA (about 80 mA in total) was allowed to flow through two semiconductor light-emitting device groups each having 32 semiconductor light-emitting devices 44 connected in series to the copper electrodes 52, whereby the semiconductor light-emitting devices 44 were driven to obtain output light. The output light is a color mixture of light emitted by the blue LED chip 49 and light emitted by a phosphor contained in the phosphor layer 3, which is excited with the light emitted by the blue LED chip to emit light. Furthermore, arbitrary white light was obtained as the output light by appropriately selecting the kind and amount of an LED chip and a phosphor.

Hereinafter, the phosphor layer 3 will be described.

The phosphor layer 3 was formed by hardening epoxy resin with a phosphor added thereto by drying. In Example 26, two kinds of phosphors were used: a $SrAlSiN_3$:$Eu^{2+}$ red phosphor (center particle diameter: 2.2 µm, maximum internal quantum efficiency: 60%) having an emission peak in the vicinity of a wavelength of 625 nm and a $(Ba, Sr)_2SiO_4$:$Eu^{2+}$ green phosphor (center particle diameter: 12.7 µm, maximum internal quantum efficiency: 91%) having an emission peak in the vicinity of a wavelength of 555 nm. As the epoxy resin, epoxy resin (main agent) mainly containing bisphenol A type liquid epoxy resin and two-solution mixed epoxy resin of epoxy resin (curing agent) mainly containing an alicyclic acid anhydride. The $SrAlSiN_3$:$Eu^{2+}$ red phosphor and the $(Ba, Sr)_2SiO_4$:$Eu^{2+}$ green phosphor were mixed in a weight ratio of about 1:10, and the mixed phosphor and the epoxy resin were mixed in a weight ratio of about 1:3 (phosphor concentration=25% by weight).

COMPARATIVE EXAMPLE 6

A card-type illumination module light source was produced in the same way as in Example 26, using two kinds of phosphors: a $Sr_2Si_5N_8$:$Eu^{2+}$ red phosphor (center particle diameter: 1.8 µm, maximum internal quantum efficiency: 62%) having an emission peak in the vicinity of a wavelength of 625 nm; and a $Y_3Al_5O_{12}$:$Ce^{3+}$ yellow phosphor (center particle diameter: 17.6 µm, maximum internal quantum efficiency: 98%) having an emission peak in the vicinity of a wavelength of 560 nm. The phosphor layer 3 was obtained by mixing a $Sr_2Si_5N_8$:$Eu^{2+}$ red phosphor with a $Y_3Al_5O_{12}$:$Ce^{3+}$ yellow phosphor in a weight ratio of about 1:6, and mixing the mixed phosphor thus obtained with epoxy resin in a weight ratio of about 1:14 (phosphor concentration=6.7% by weight). In the same way as in Example 26, output light was obtained by allowing a current to flow through the semiconductor light-emitting device, and the emission characteristics thereof were evaluated.

The thickness of the phosphor layer 3 was set to be about 500 µm in Example 26, and about 100 µm in Comparative Example 6, in order to obtain white light with equal light color (relative color temperature: about 3800 K, duv, chromaticity). The emission characteristics of the $SrAlSiN_3$:$Eu^{2+}$ red phosphor in Example 26 were originally similar to those of the $Sr_2Si_5N_8$:$Eu^{2+}$ red phosphor in Comparative Example 6. For the purpose of further enhancing the comparison precision, as the phosphor of Example 26, a green phosphor having emission performance that is as similar as possible to that of Comparative Example 6 was used. The $(Ba, Sr)_2SiO_4$:$Eu^{2+}$ green phosphor in Example 26 and the $(Ba, Sr)_2SiO_4$:$Eu^{2+}$ green phosphor shown in FIG. 32 are different from each other in an atomic ratio of Sr and Ba, but similar to each other in excitation wavelength dependency of an internal quantum efficiency and an external quantum efficiency.

Hereinafter, the emission characteristics of the light-emitting devices of Example 26 and Comparative Example 6 will be described.

Figure 43:
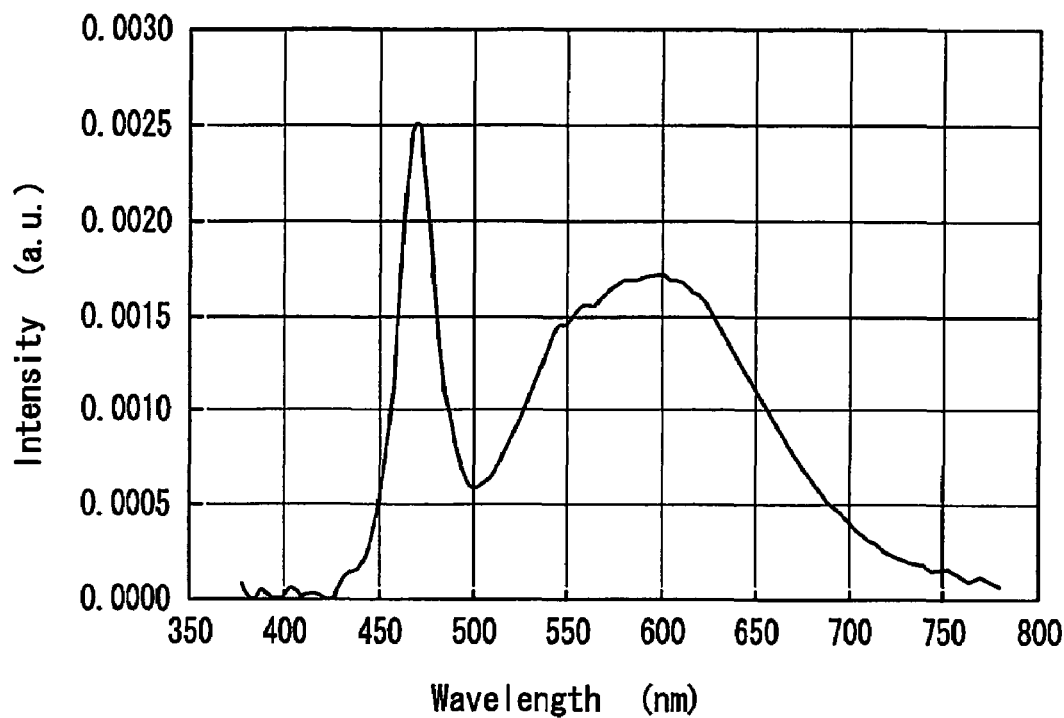
FIG. 43 shows an emission spectrum of the light-emitting device in Example 26 of the present invention.
Figure 44:
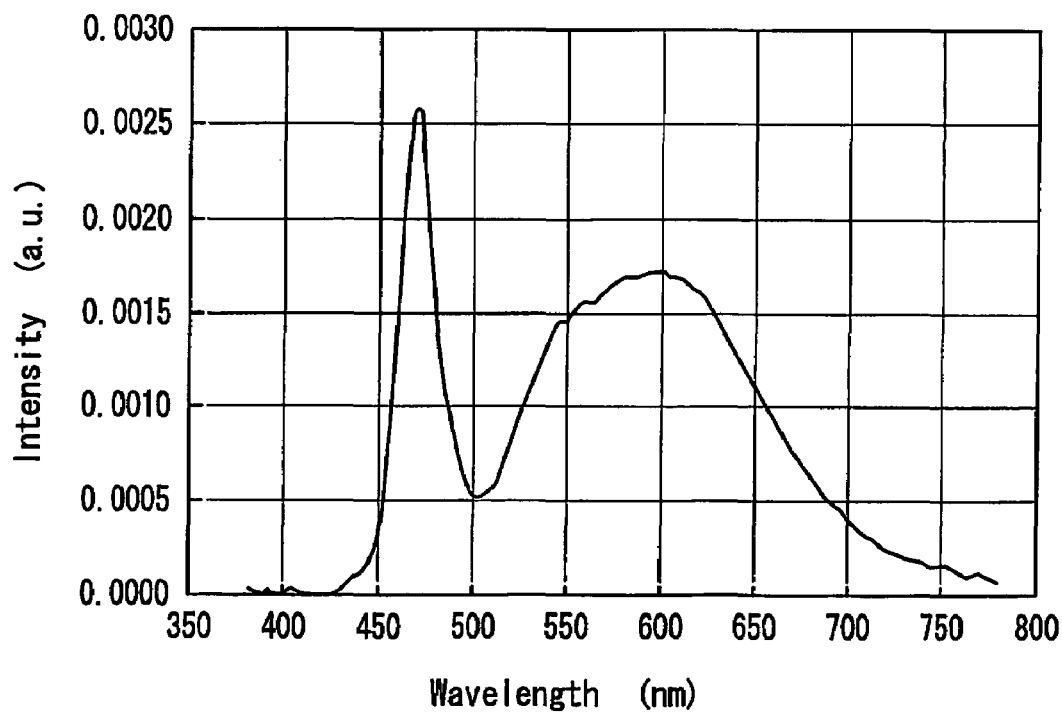
FIG. 44 shows an emission spectrum of the light-emitting device in Comparative Example 6 of the present invention.

FIGS. 43 and 44 respectively show emission spectra in Example 26 and Comparative Example 6. As is apparent from FIGS. 43 and 44, the light-emitting devices of Example 26 and Comparative Example 6 have similar emission spectra, and emit white light having an emission peak in the vicinity of 470 nm and 600 nm, i.e., white light owing to the color mixture of blue light and yellow light.

Table 8 shows emission characteristics of the light-emitting devices of Example 26 and Comparative Example 6

TABLE 8

|  | Example 26 | Comparative Example 6 |
| --- | --- | --- |
| Correlated color temperature (K) | 3800 | 3797 |
| duv | 0 | −0.02 |
| Chromaticity (x, y) | (0.3897, 0.3823) | (0.3898, 0.3823) |
| Ra | 83 | 83 |
| R9 | 31 | 33 |
| Relative luminous flux | 98.7 | 100 |

In Table 8, "duv" represents an index showing a shift of white light from a-blackbody radiation path. "Ra" represents an average color rendering index, and "R9" represents a red special color rendering index, which show how faithfully test light reproduces test color, with the color seen in reference light being 100.

Under the condition of substantially equal light color (correlated color temperature, duv, and chromaticity), irrespective of using a $(Ba, Sr)_2SiO_4:Eu^{2+}$ green phosphor having low emission intensity under the illumination of light of 470 nm, Ra, R9, and luminous flux in Example 26 were substantially similar to those in Comparative Example 6. That is, it was found that the emission performance in Example 16 was equal to that in Comparative Example 6 (conventional light-emitting device satisfying both a high color rendering property and a high luminous flux). The reason for this is considered as follows: the internal quantum efficiency of the phosphor used in Example 26 under the irradiation of light emitted by the blue LED is high, the light emitted by the blue LED absorbed by the phosphor is converted efficiently to emit light, and light emitted by the blue LED that has not been absorbed is output efficiently.

The correlated color temperature of the light-emitting device can be adjusted arbitrarily by varying the concentration of the phosphor and the thickness of the phosphor layer. The emission characteristics such as a color rendering index and a luminous flux can be evaluated by simulation, in the case where a phosphor layer is configured using at least one phosphor having a predetermined spectral distribution and a predetermined internal quantum efficiency, and a base material such as resin with a transmittance of 100%, and a light-emitting device is configured using a light-emitting element with a constant output having a predetermined spectral distribution, and the correlated color temperature of output light is varied. When only a color rendering index is evaluated, the numerical value of an internal quantum efficiency may not be necessary, and the evaluation by simulation can be performed only with the spectral distribution of a phosphor and a light-emitting element. In order to investigate the light color satisfying both the high color rendering property and the high luminous index of the above-mentioned light-emitting devices, Ra and the behavior of a relative luminous flux of white light emitted by the light-emitting devices of Example 26 and Comparative Example 6 were evaluated by simulation, in the case of varying the correlated color temperature with duv being set to be 0.

Figure 45:
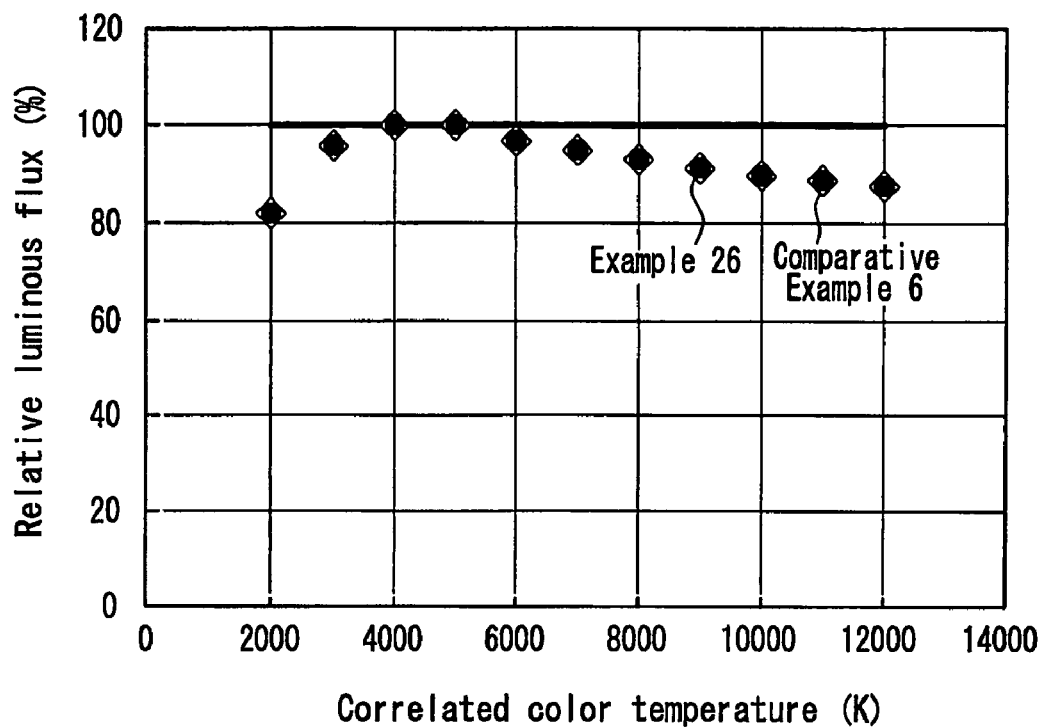
FIG. 45 shows results obtained by simulating the relationship between the correlated color temperature and the relative luminous flux in Example 26 and Comparative Example 6 of the present invention.

FIG. 45 shows the results obtained by evaluating, by simulation, the relative luminous flux of white light emitted by the light-emitting devices of Example 26 and Comparative Example 6 in the case of varying a correlated color temperature. It is understood from FIG. 45 that similar behaviors were exhibited in Example 26 and Comparative Example 6. That is, in the case of producing a light-emitting device with a correlated color temperature of white light of 3000 K to 6000 K, preferably 3500 K to 5000 K, Example 26 exhibits a relatively high luminous flux corresponding to 95 to 100% of a luminous flux in the case of setting the correlated color temperature in Comparative Example 6 to be 3797K. The luminous flux in the case of setting the correlated color temperature in Comparative Example 6 to be 3797K is represented by a solid line in FIG. 45.

Figure 46:
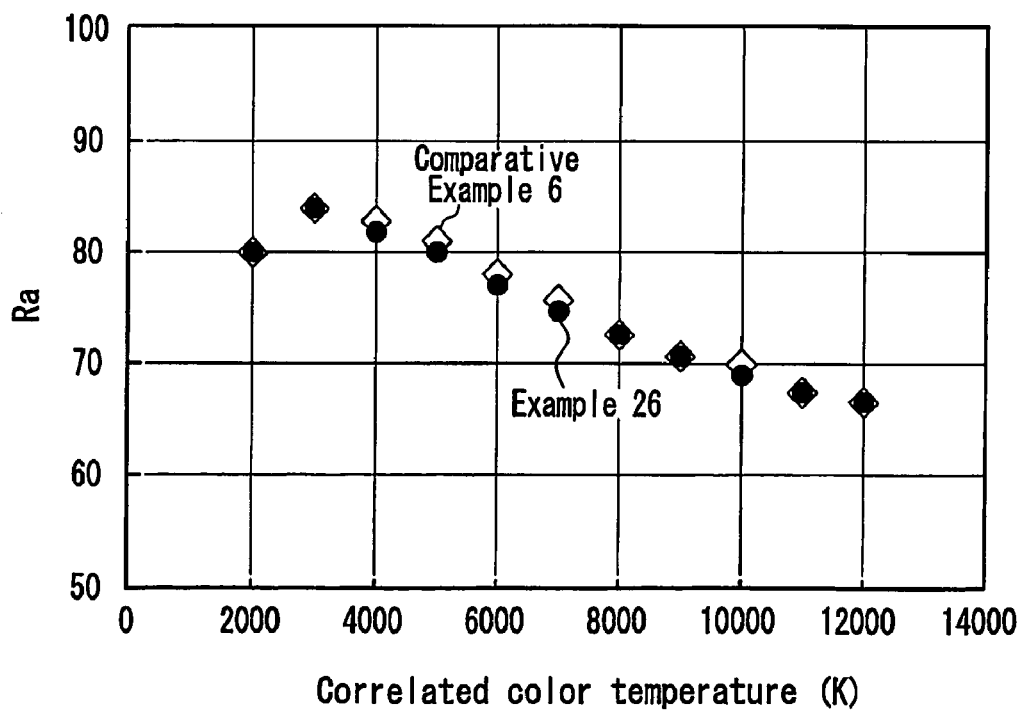
FIG. 46 shows results obtained by simulating the relationship between the correlated color temperature and Ra in Example 26 and Comparative Example 6 of the present invention.

Furthermore, FIG. 46 shows the results obtained by evaluating, by simulation, the relative luminous flux of white light emitted by the light-emitting devices of Example 26 and Comparative Example 6 in the case of varying a correlated color temperature. It is understood that relatively high numerical values Ra of at least 80 were exhibited in Example 26 and Comparative Example 6 in the case of producing a light-emitting device with a correlated color temperature of white light of 2000 K to 5000 K, preferably 2500 K to 4000 K.

It is understood from FIGS. 45 and 46 that, in Example 26 and Comparative Example 6, in the case of producing a light-emitting device with a correlated color temperature of white light of 3000 K to 5000 K, preferably 3000 K to 4500 K, and more preferably 3500 K to 4000 K, a light-emitting device satisfying both a high luminous flux and high Ra is obtained.

EXAMPLE 27

A light-emitting device in which a correlated color temperature was varied with duv being set to be 0 was configured in the same way as in Example 26, except that the $(Ba, Sr)_2SiO_4:Eu^{2+}$ green phosphor was changed from a phosphor having an emission peak in the vicinity of a wavelength of 555 nm to a phosphor having an emission peak in the vicinity of a wavelength of 535 nm.

Figure 47:
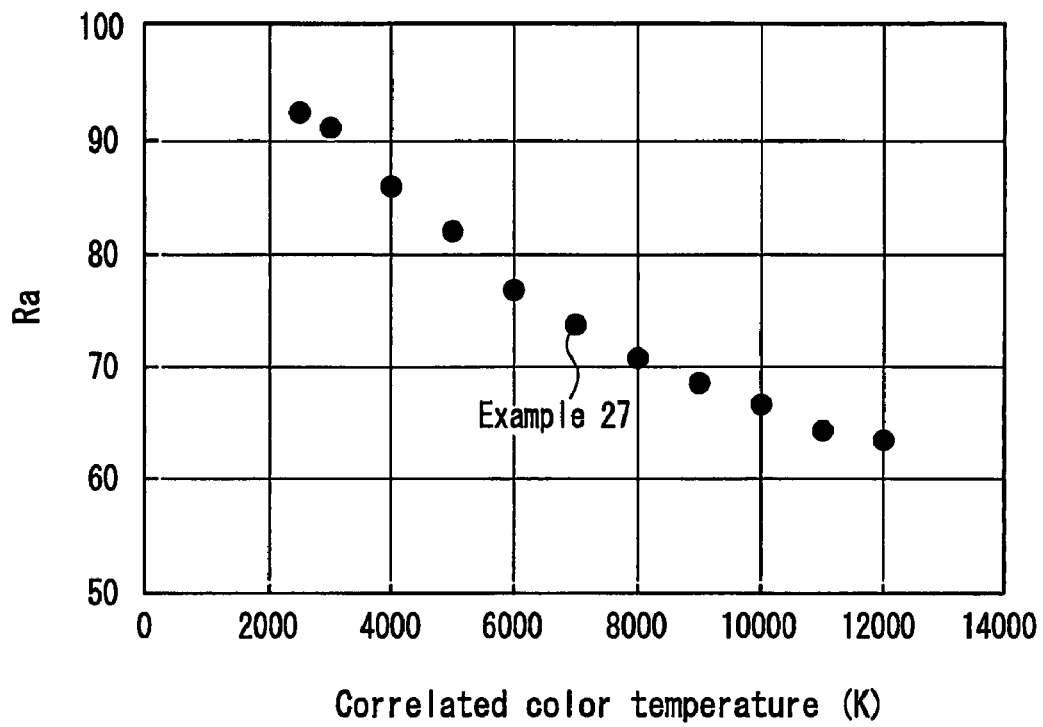
FIG. 47 shows results obtained by simulating the relationship between the correlated color temperature and Ra in Example 27 of the present invention.

FIG. 47 shows the results obtained by evaluating Ra of white light emitted in Example 27 by simulation. It is understood from FIG. 47 that a light-emitting device with a lower correlated color temperature exhibits higher Ra. In the case of producing a light-emitting device emitting white light with a correlated color temperature of 2000 K to 5000 K, Ra is at least 80. Furthermore, in the case of a correlated color temperature 3000 K or less, Ra is at least 90.

Figure 48:
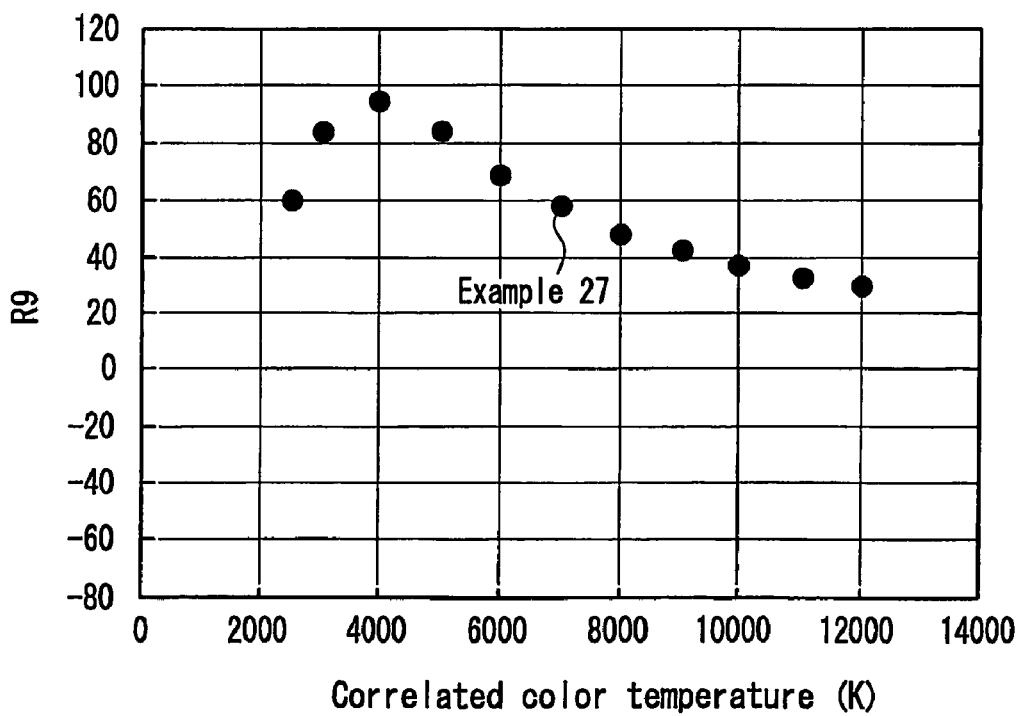
FIG. 48 shows results obtained by simulating the relationship between the correlated color temperature and R9 in Example 27 of the present invention.

FIG. 48 shows the results obtained by evaluating R9 of white light emitted by Example 27 by simulation. The following is understood from FIG. 48. In the case of producing a light-emitting device emitting white light with a correlated color temperature of 2000 K to 8000 K, R9 exhibits a high numerical value of at least 40. In the case of producing a light-emitting device emitting white light with a correlated color temperature of 2500 K to 6500 K, R9 exhibits a numerical value of about at least 60. In the case of producing a light-emitting device emitting white light with a correlated color temperature of 3000 K to 5000 K, R9 exhibits a numerical value of about at least 80.

Figure 49:
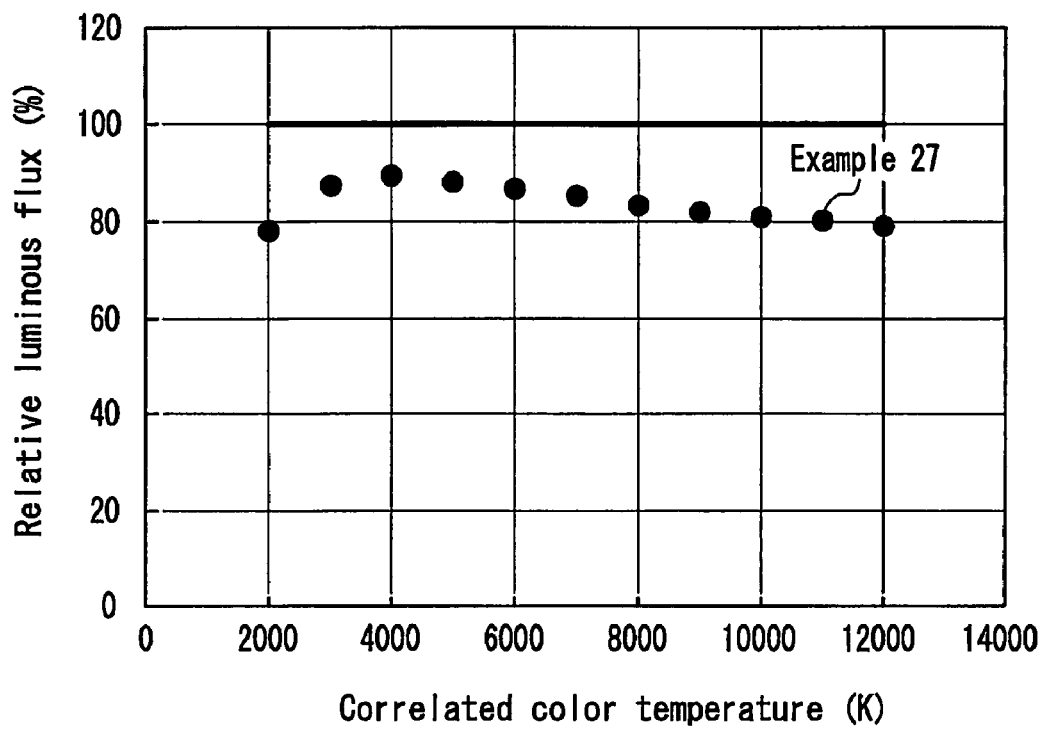
FIG. 49 shows results obtained by simulating the relationship between the correlated color temperature and the relative luminous flux in Example 27 of the present invention.

FIG. 49 shows the results obtained by evaluating, by simulation, a relative luminous flux of white light emitted by the light-emitting device of Example 27 in the case of varying a correlated color temperature. The following is understood from FIG. 49. In the case of producing a light-emitting device with a correlated color temperature of white light of 2500 K to 8000 K, preferably 3000 K to 5000 K, and more preferably 3500 K to 4500 K, in Example 27, a relatively high luminous flux is exhibited, which corresponds to 82% to 85% of the luminous flux in the case where the correlated color temperature in Comparative Example 6 is set to be 3797 K. The luminous flux in the case of setting the correlated color temperature of Comparative Example 6 to be 3797 K is represented by a solid line in FIG. 49.

It is understood from FIGS. 47 to 49 that the light-emitting device of Example 27 emits output light with a high color rendering property, which has Ra and R9 of at least 80 and realizes a high luminous flux, in the case where the correlated color temperature is 3000 K to 5000 K. Furthermore, the light-emitting device of Example 27 emits output light with a preferable color rendering property, which has Ra and R9 of at least 82 and realizes a high luminous flux, in the case where the correlated color temperature is 3500 K to 4500 K. In particular, in the case where the correlated color temperature is about 4000 K, the light-emitting device emits output light with a more preferable color rendering property, which has Ra and R9 of at least 85 and realizes a higher luminous flux.

Figure 50:
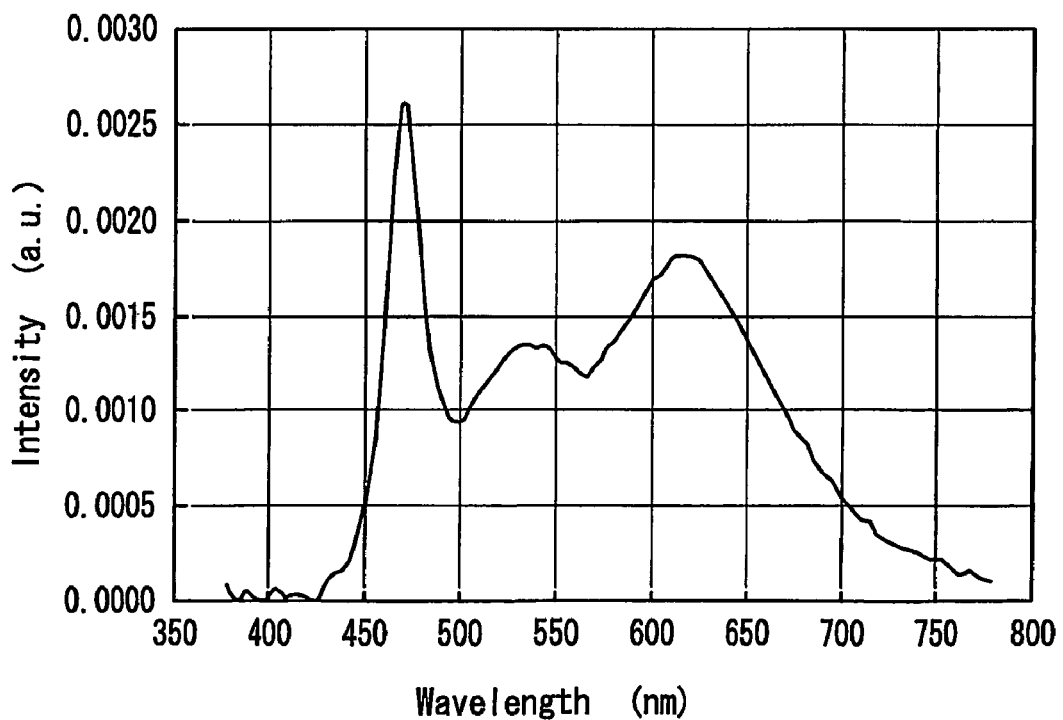
FIG. 50 shows an emission spectrum of the light-emitting device in Example 27 of the present invention.

FIG. 50 shows the simulation data of an emission spectrum of the light-emitting device of Example 27 emitting white light in a warm color with a particularly preferable correlated color temperature of 4000 K (duv=0). In the case of this emission spectrum, chromaticity (x, y) is (0.3805, 0.3768), and Ra and R9 are 86 and 95, respectively. The shape of the emission spectrum represents a ratio in intensity of an emission peak in a wavelength range of 460 to 480 nm by a blue LED, an emission peak in a wavelength range of 520 to 550 nm by the green phosphor of Example 27 emitting light based on a 5d-4f electron transition of rare earth ions, and an emission peak in a wavelength range of 610 to 640 nm by the red phosphor of Example 27 emitting light based on 5d-4f electron transition of rare earth ions (i.e., 460-480 nm:520-550 nm:610-640 nm is 24-28:12-15:16-20). One preferable embodiment of the present invention is a light-emitting device that emits white light in a warm color having an emission spectrum shape in which an emission peak has the above-mentioned ratio. The phosphor emitting light based on 5d-4f electron transition of rare earth ions refers to a phosphor mainly containing rare earth ions such as $Eu^{2+}$ or $Ce^{3+}$ as a luminescent center ion. Such a phosphor has a similar emission spectrum shape irrespective of the kind of a phosphor host in the case where the wavelength of an emission peak is the same.

Furthermore, the following was found by simulation. In the case of changing the green phosphor of Example 26 to the $(Ba, Sr)_2SiO_4:Eu^{2+}$ green phosphor having an emission peak in a wavelength range of 520 to 550 nm, and further adding the $(Sr, Ba)_2SiO_4:Eu^{2+}$ yellow phosphor having an emission peak in a wavelength range of 560 to 580 nm, a light-emitting device with a high color rendering property is obtained. For example, at output light with a correlated color temperature of 3800 K, duv=0, and chromaticity (0.3897, 0.3823), Ra was 88, R9 was 72, and a relative luminous flux was 93%.

The relationship between the correlated color temperature, Ra, R9, and the relative luminous flux was evaluated by simulation under the light color condition where duv=0, in the case where the green phosphor of Example 26 was changed to a $(Ba, Sr)_2SiO_4:Eu^{2+}$ green phosphor having an emission peak in a shorter wavelength range of 520 nm, for example. Consequently, it was found that a light-emitting device with a shorter wavelength of an emission peak of a green phosphor has lower numerical values of Ra, R9, and relative luminous flux, and the performance as the illumination device decreases. For example, in the case of using a green phosphor having an emission peak in a wavelength of 520 nm, at a correlated color temperature of 3800 K, duv=0, and chromaticity (0.3897, 0.3823), Ra was 80, R9 was 71, and the relative luminous flux was 85%. Thus, it is preferable to use a green phosphor with a wavelength of at least 525 nm of an emission peak.

In Examples 26 and 27, the $SrAlSiN_3:Eu^{2+}$ red phosphor was used. However, there is no particular limit thereto, as long as the phosphor is a red phosphor represented by a composition formula: $(M_{1-x}Eu_x)AlSiN_3$, where "M" is at least one element selected from the group consisting of Mg, Ca, Sr, Ba, and Zn, and "x" is a numerical value satisfying $0.005 \leq x \leq 0.3$. For example, the same functional effect is recognized even in the $CaAlSiN_3:Eu^{2+}$ red phosphor.

Furthermore, even in the case of using, for example, a known nitride phosphor or oxynitride phosphor exhibiting similar emission characteristics (e.g., a nitridosilicate phosphor represented by a composition formula: $(M_{1-x}Eu_x)SiN_2$ or a composition formula: $(M_{1-x}Eu_x)_2Si_5N_8$, an oxonitridoaluminosilicate phosphor represented by a composition formula: $(M_{1-x}Eu_x)_2Si_4AlON_7$) in place of the $SrAlSiN_3:Eu^{2+}$ red phosphor, the similar functional effect is recognized. In the above-mentioned composition formula, "M" is at least one element selected from the group consisting of Mg, Ca, Sr, Ba, and Zn, and "x" is a numerical value satisfying $0.005 \leq x \leq 0.3$.

Furthermore, the green phosphor and the yellow phosphor are not limited to those used in the above-mentioned examples. It also is possible to use any phosphor emitting light having an emission peak in a wavelength range of 525 nm to less than 600 nm, for example, a phosphor having an excitation peak on a longest wavelength side of an excitation spectrum in a wavelength range of less than 420 nm. Even when a YAG:Ce phosphor that is known as a phosphor used for a white LED (e.g., a $(Y_3(Al, Ga)_5O_{12}:Ce^{3+}$ green phosphor, a $Y_3Al_5O_{12}:Ce^{3+}$ green phosphor, a $(Y, Gd)_3Al_5O_{12}:Ce^{3+}$ yellow phosphor, a $Y_3Al_5O_{12}:Ce^{3+}, Pr^{3+}$ yellow phosphor) is used as the above-mentioned green phosphor or yellow phosphor, the similar functional effect is recognized.

EXAMPLE 28

In the present example, a card-type illumination module light source shown in FIGS. 41 and 42 was produced by mounting a violet LED chip emitting light having an emission peak in the vicinity of 405 nm with GaInN being a light-emitting layer, in place of the blue LED chip 49 described in Example 26 or 27, and the emission characteristics thereof were evaluated. The output light of the present example was at least mixed-color light mainly containing light emitted by a phosphor included in the phosphor layer 3, which was excited with light emitted by the violet LED chip to emit light. Furthermore, arbitrary white light was obtained as the output light by appropriately selecting the kind and amount of the phosphor.

Hereinafter, the phosphor layer 3 of the present example will be described in detail.

The phosphor layer 3 was formed by hardening epoxy resin with a phosphor added thereto by drying. In the present example, three kinds of phosphors were used: a $SrAlSiN_3:Eu^{2+}$ red phosphor (center particle diameter: 2.2 μm, maximum internal quantum efficiency: 60%, internal quantum efficiency under the excitation of 405 nm: about 60%) having an emission peak in the vicinity of a wavelength of 625 nm, a $(Ba, Sr)_2SiO_4:Eu^{2+}$ green phosphor (center particle diameter: 15.2 μm, maximum internal quantum efficiency: 97%, internal quantum efficiency under the excitation of 405 nm: about 97%) having an emission peak in the vicinity of a wavelength of 535 nm, and a $BaMgAl_{10}O_{17}:Eu^{2+}$ blue phosphor (center particle diameter: 8.5 μm, maximum internal quantum efficiency: about 100%, internal quantum efficiency under the excitation of 405 nm: about 100%) having an emission peak in the vicinity of a wavelength of 450 nm. As the epoxy resin, two-solution mixed epoxy resin of epoxy resin (main agent) mainly containing bisphenol A type liquid epoxy resin and epoxy resin (curing agent) mainly containing an alicyclic acid anhydride was used. The production conditions for the above-mentioned $SrAlSiN_3:Eu^{2+}$ red phosphor have not been optimized. Therefore, although the internal quantum efficiency is low, it is possible to improve the internal quantum efficiency by at least 1.5 times by optimizing the production condition. The $SrAlSiN_3:Eu^{2+}$ red phosphor, the $(Ba, Sr)_2SiO_4:Eu^{2+}$ green phosphor, and the $BaMgAl_{10}O_{17}:Eu^{2+}$ blue phosphor were mixed in a weight ratio of about 6:11:30, and the mixed phosphor and epoxy resin were mixed in a weight ratio of about 1:3 (phosphor concentration=25% by weight).

COMPARATIVE EXAMPLE 7

A card-type illumination module light source was produced in the same way as in Example 28 using three kinds of phosphors: a $La_2O_2S:Eu^{3+}$ red phosphor (center particle diameter: 9.3 µm, maximum internal quantum efficiency: 84%, internal quantum efficiency under the excitation of 405 nm: about 50%) having an emission peak in the vicinity of a wavelength of 626 nm, a $(Ba, Sr)_2SiO_4:Eu^{2+}$ green phosphor (center particle diameter: 15.2 µm, maximum internal quantum efficiency: 97%, internal quantum efficiency under the excitation of 405 nm: about 97%) having an emission peak in the vicinity of a wavelength of 535 nm, and a $BaMgAl_{10}O_{17}:Eu^{2+}$ blue phosphor (center particle diameter: 8.5 µm, maximum internal quantum efficiency: about 100%, internal quantum efficiency under the excitation of 405 nm: about 100%) having an emission peak in the vicinity of a wavelength of 450 nm. As the phosphor layer 3, a $La_2O_2S:Eu^{3+}$ red phosphor, a $(Ba, Sr)_2SiO_4:Eu^{2+}$ green phosphor, and a $BaMgAl_{10}O_{17}:Eu^{2+}$ blue phosphor were mixed in a weight ratio of about 155:20:33, and the mixed phosphor and epoxy resin were mixed in a weight ratio of about 1:3 (phosphor concentration=25% by weight). Then, in the same way as in Example 28, output light was obtained by allowing a current to flow through the semiconductor light-emitting device, and the emission characteristics thereof were evaluated.

The thickness of the phosphor layer 3 was set to be about 500 µm in Example 28 and Comparative Example 7 so as to obtain white light with equal light color (correlated color temperature: about 3800 K, duv, chromaticity).

Hereinafter, the emission characteristics of the light-emitting devices of Example 28 and Comparative Example 7 will be described.

Figure 51:
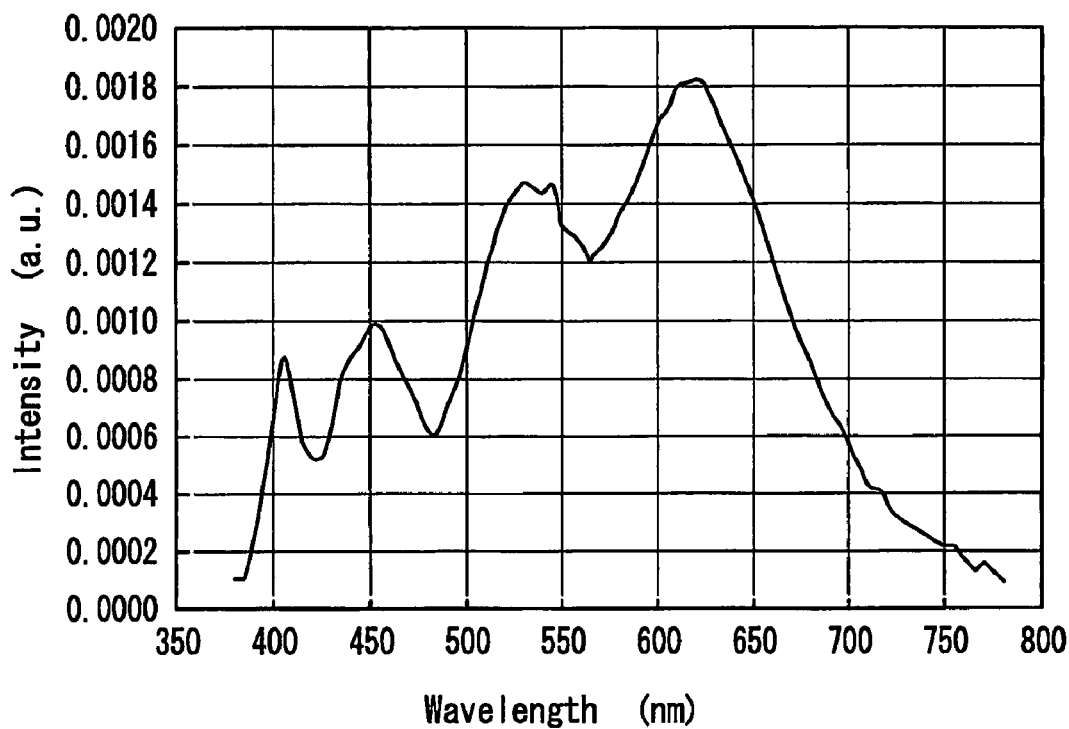
FIG. 51 shows an emission spectrum of the light-emitting device in Example 28 of the present invention.
Figure 52:
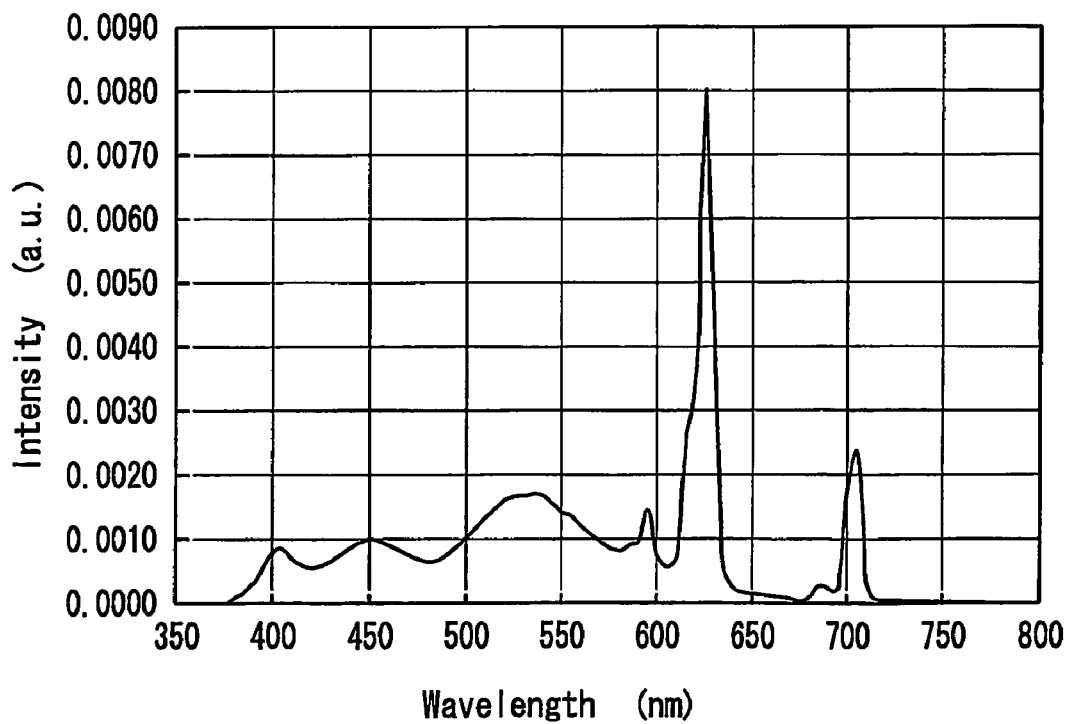
FIG. 52 shows an emission spectrum of the light-emitting device in Comparative Example 7 of the present invention.

FIGS. 51 and 52 respectively show emission spectra in Example 28 and Comparative Example 7. As is understood from FIGS. 51 and 52, the light-emitting devices in Example 28 and Comparative Example 7 emit white light having an emission peak in the vicinity of 405 nm, 450 nm, 535 nm, and 625 nm, i.e., white light owing to the color mixture of violet light, blue light, green light, and red light. The emission peak in the vicinity of 405 nm represents the leakage of light of the violet light-emitting element, and the emission peaks in the vicinity of 450 nm, 535 nm, and 625 nm represent light obtained by converting the above-mentioned violet light by the phosphors.

Table 9 shows the emission characteristics of the light-emitting devices of Example 28 and Comparative Example 7.

TABLE 9

|  | Example 28 | Comparative Example 7 |
|---|---|---|
| Correlated color temperature (K) | 3800 | 3792 |
| Duv | 0 | 0.03 |
| Chromaticity (x, y) | (0.3897, 0.3823) | (0.3901, 0.3826) |
| Relative luminous flux (%) | 117 | 100 |
| Ra | 96 | 78 |
| R1 | 98 | 71 |
| R2 | 97 | 93 |
| R3 | 92 | 82 |
| R4 | 93 | 67 |
| R5 | 98 | 77 |
| R6 | 98 | 85 |
| R7 | 96 | 85 |
| R8 | 95 | 66 |
| R9 | 83 | 34 |
| R10 | 92 | 91 |
| R11 | 90 | 62 |
| R12 | 92 | 90 |
| R13 | 99 | 77 |
| R14 | 94 | 86 |
| R15 | 97 | 71 |

In Table 9, "duv" represents an index showing a shift of white light from a blackbody radiation path. "Ra" represents an average color rendering index and "R1" to "R15" represent special color rendering indexes, which show how faithfully test light reproduces test color, with the color seen in reference light being 100. In particular, "R9" is a red special color rendering index.

In spite of the fact that production condition of the phosphor has not been optimized, and a low-performance red phosphor with a maximum internal quantum efficiency of 60% is used, in Example 28, white light with a relative luminous flux higher by 17% than that of Comparative Example 7 was emitted under the condition of substantially the same light color (correlated color temperature, duv, and chromaticity). The maximum internal quantum efficiency of a red phosphor used in Comparative example 7 is 83%, so that the output efficiency of the light-emitting device can be improved further by about 20%. In the case of the red phosphor used in Example 28, the maximum internal quantum efficiency is 60%, so that there is a room for enhancing white output of the light-emitting device by at least about 65%. More specifically, theoretically, white light with a higher luminous flux will be emitted with a material configuration of the light-emitting device of Example 28.

Furthermore, in the case where the light-emitting device of Example 28 was configured so as to emit white light with a correlated color temperature of 3800 K by combining at least the above-mentioned phosphors, the light-emitting device thus configured exhibited Ra larger than that of Comparative Example 7. Furthermore, in all the special color rendering indexes R1 to R15, as well as R9, larger numerical values than those of Comparative Example 7 were obtained. This shows that white light with a very satisfactory color rendering property is emitted in Example 28.

The light-emitting device of Example 28 emits white light having a high color rendering property in which the numerical values of the special color rendering indexes R1 to R15 are at least 80, which is dose to the sunlight. Such a light-emitting device is particularly suitable for a medical purpose. For example, an LED light source applicable to an endoscope or the like can be provided, and an excellent endoscope system capable of diagnosing under light dose to the sunlight can be provided.

Hereinafter, in order to investigate the light color that satisfies both the high color rendering property and the high luminous flux of the above-mentioned light-emitting device, the results were obtained by evaluating, by simulation, Ra and the behavior of a relative luminous flux of white light emitted by the light-emitting devices of Example 28 and Comparative Example 7, in the case of varying the correlated color temperature with duv being set to be 0.

Figure 53:
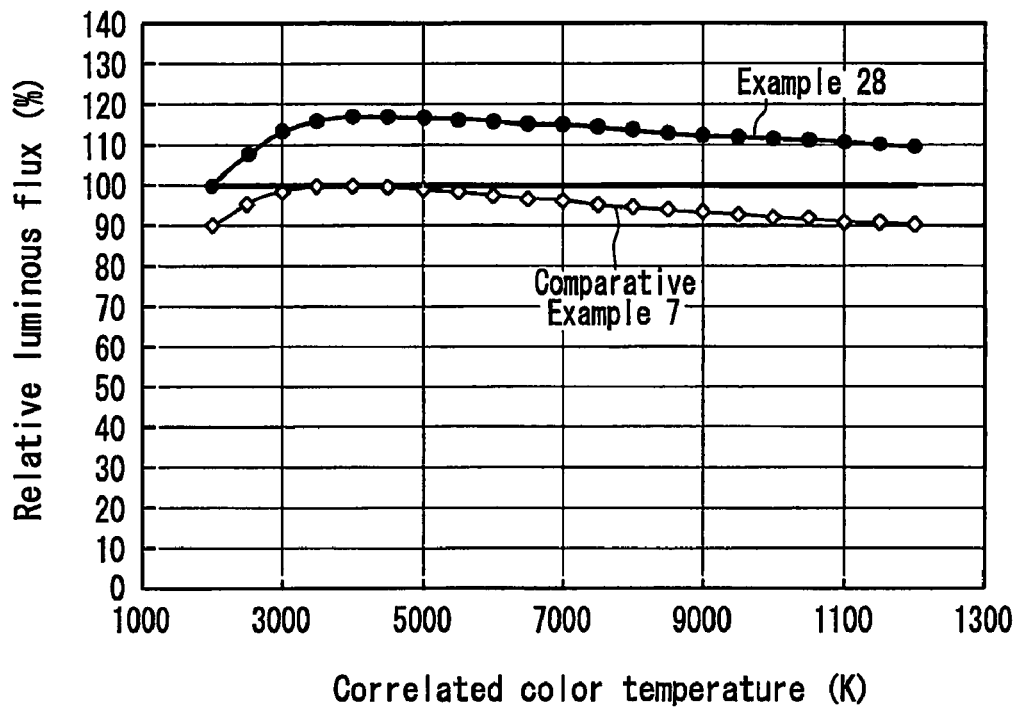
FIG. 53 shows results obtained by simulating the relationship between the correlated color temperature and the relative luminous flux in Example 28 and Comparative Example 7 of the present invention.

FIG. 53 shows the results obtained by evaluating, by simulation, a relative luminous flux of white light emitted by the light-emitting devices of Example 28 and Comparative Example 7 in the case of varying a correlated color temperature. It is understood from FIG. 53 that the light-emitting device of Example 28 emits white light having a luminous flux higher by about 10 to 20% than that of Comparative Example 7 over a wide correlated color temperature range of 2000 K to 12000 K. Furthermore, it is understood that the light-emitting device of Example 28 shows a relatively high luminous flux corresponding to at least 110 to 115% level of a luminous flux in the case of setting the correlated color temperature to be 3792 K in Comparative Example 7, when a light-emitting device with a correlated color temperature of output light of 2500 K to 12000 K, preferably 3500 K to 7000

K. The luminous flux in the case of setting the correlated color temperature of Comparative Example 7 is represented by a solid line in FIG. 53.

Hereinafter, regarding the respective phosphors used in Example 28 and Comparative Example 7, assuming that the production condition is sufficiently optimized and a phosphor with a maximum internal quantum efficiency of 100% is obtained, the results obtained by evaluating, by simulation, a luminous flux in the case of using this ideal phosphor will be described. In this simulation, the internal quantum efficiency under the excitation of 405 nm of each phosphor was estimated and evaluated from FIGS. 30, 32, 37, and 40, as shown in the following Table 10.

TABLE 10

| Phosphor | Internal quantum efficiency (%) |
| --- | --- |
| SrAlSiN$_3$:Eu$^{2+}$ red phosphor | 100 |
| La$_2$O$_2$S:Eu$^{3+}$ red phosphor | 60 |
| (Ba,Sr)$_2$SiO$_4$:Eu$^{2+}$ green phosphor | 100 |
| BaMgAl$_{10}$O$_{17}$:Eu$^{2+}$ blue phosphor | 100 |

Figure 54:
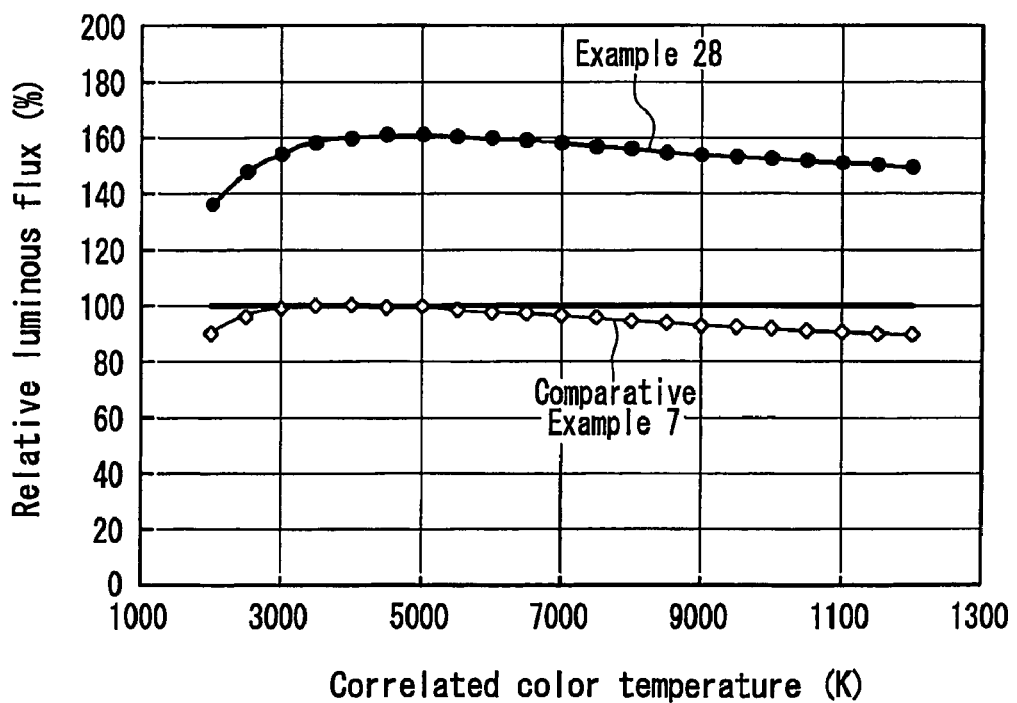
FIG. 54 shows results obtained by simulating the relationship between the correlated color temperature and the relative luminous flux of the light-emitting device using an ideal phosphor in Example 28 and Comparative Example 7 of the present invention.

FIG. 54 shows the results obtained by evaluating, by simulation, a relative luminous flux of white light emitted by the light-emitting devices of Example 28 and Comparative Example 7 in the case of varying a correlated color temperature, when using the ideal phosphor. It is understood from FIG. 54 that, in the case of using the ideal phosphor, the light-emitting device of Example 28 emits white light with a luminous flux higher by about 45 to 65% than that in Comparative Example 7 over a correlated color temperature range of 2000 K to 12000 K. Furthermore, in the case of producing a light-emitting device with a correlated color temperature of white light of 2500 K to 12000, preferably 3500 K to 6000 K, the light-emitting device thus produced exhibits a relatively high luminous flux corresponding to at least 150 to 160% of a luminous flux in the case of setting the correlated color temperature to be 3792 K in Comparative Example 7. The luminous flux in the case of setting the correlated color temperature of Comparative Example 7 to be 3792 K is represented by a solid line in FIG. 54.

More specifically, depending upon the future enhancement of performance of a SrAlSiN$_3$:Eu$^{2+}$ red phosphor, it can be expected that a light-emitting device emitting a luminous flux higher by about 45 to 65% than that in Comparative Example 7 is obtained under the evaluation of the same correlated color temperature.

Figure 55:
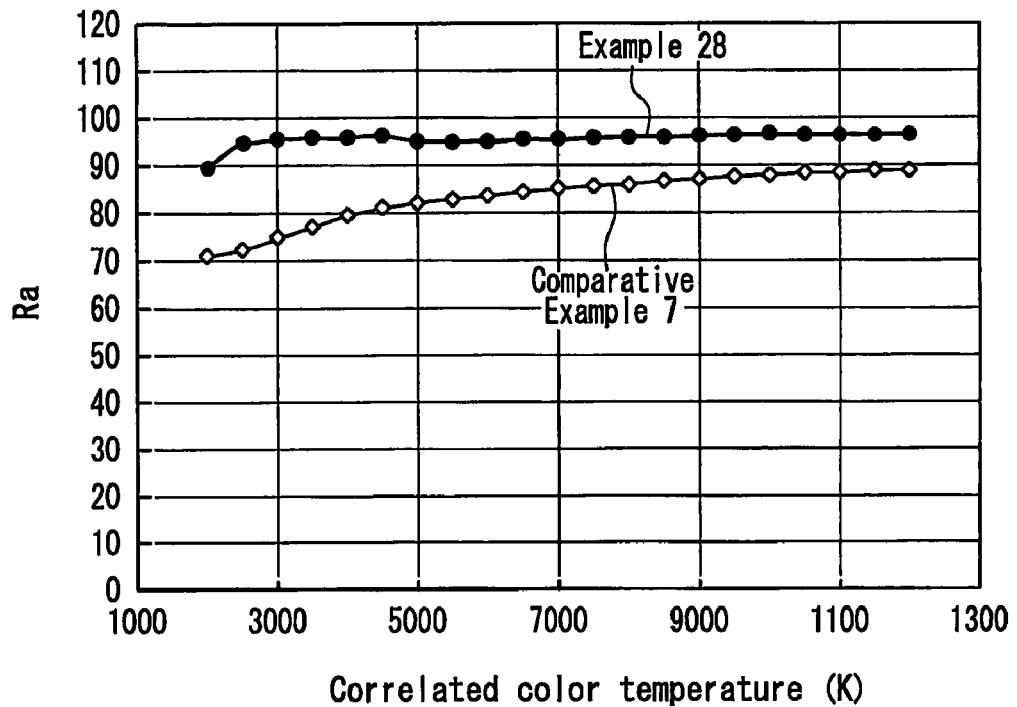
FIG. 55 shows results obtained by simulating the relationship between the correlated color temperature and Ra in Example 28 and Comparative Example 7 of the present invention.

FIG. 55 shows the results obtained by evaluating, by simulation, an average color rendering index (Ra) of white light emitted by the light-emitting devices of Example 28 and Comparative Example 7 in the case of varying a correlated color temperature. It is understood that the light-emitting device of Example 28 exhibits high Ra of at least 90 over a wide correlated color temperature range of 2000 K to 12000 K of a correlated color temperature of white light, and exhibits very high Ra of at least 95 over a wide correlated color temperature range of 3000 K to 12000 K.

Figure 56:
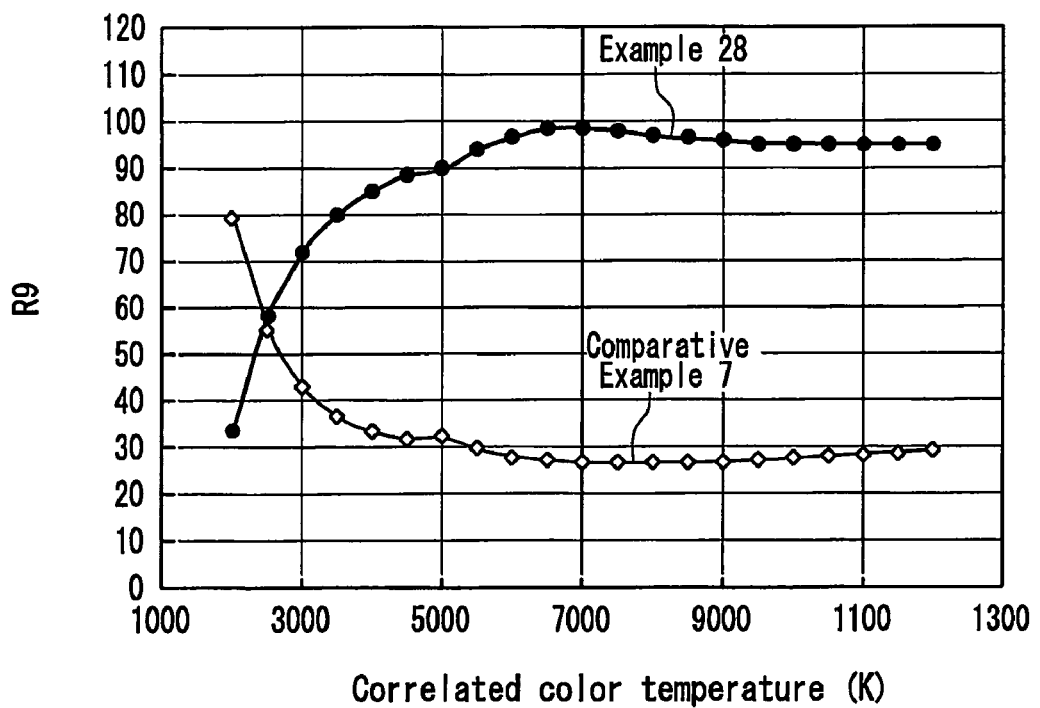
FIG. 56 shows results obtained by simulating the relationship between the correlated color temperature and R9 in Example 28 and Comparative Example 7 of the present invention.

FIG. 56 shows the results obtained by evaluating, by simulation, a red special color rendering index (R9) of white light emitted by the light-emitting device of Example 28 and Comparative Example 7 in the case of varying a correlated color temperature. The light-emitting device of Example 28 with a correlated color temperature of 2500 K to 12000 K shows a numerical value of R9 larger than that in Comparative Example 7. Furthermore, the light-emitting device exhibits high R9 of at least 30 over a wide correlated color temperature of white light of 2000 K to 12000 K, at least 70 in a range of 3000 K to 12000 K, at least 80 in a range of 3500 K to 12000 K, and at least 90 in a range of 5000 K to 12000 K. Thus, a preferable light-emitting device emitting white light having a high red color rendering index is obtained. The maximum value (96 to 98) of R9 was obtained in a correlated color temperature range of 6000 K to 8000 K.

It is understood from FIGS. 53 to 55 that the light-emitting device of Example 28 emits white light with a higher luminous flux and higher Ra than those in Comparative Example 7 over a wide correlated color temperature range of 2000 K to 12000 K. Furthermore, it is understood that, in the case of producing a light-emitting device with a correlated color temperature of white light of 2500 K to 12000 K, preferably 3500 K to 7000 K, and more preferably 4000 K to 5500 K, a light-emitting device that satisfies both a high luminous flux and high Ra can be obtained.

Furthermore, it is understood from FIGS. 53 to 56 that the light-emitting device of Example 28 emits white light with a higher luminous flux and higher R9 than those of Comparative Example 7 over a wide correlated color temperature range of 2500 K to 12000 K. Furthermore, in the case of producing a light-emitting device with a correlated color temperature of white light of 3000 K to 12000 K, preferably 3500 K to 12000 K, more preferably 5000 K to 12000 K, and most preferably 6000 K to 8000 K, a light-emitting device that satisfies both a high luminous flux and high R9 is obtained.

Figure 57:
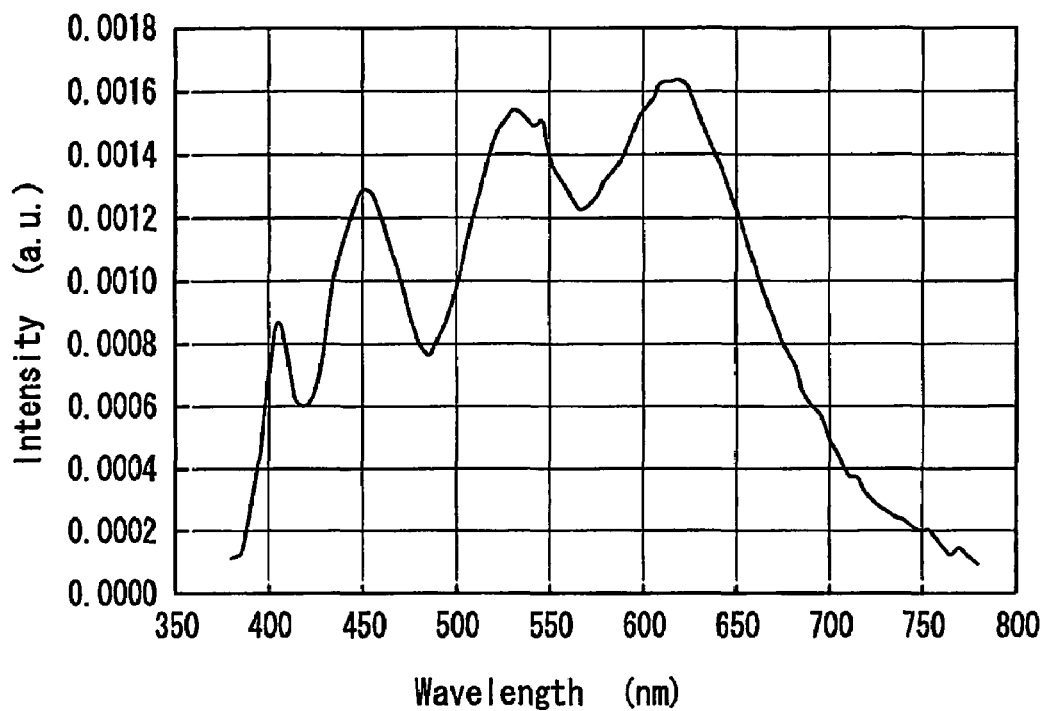
FIG. 57 shows results obtained by simulating an emission spectrum of the light-emitting device emitting white light in a warm color at a correlated color temperature of 4500 K (duv=0) in Example 28 of the present invention.

FIG. 57 shows simulation data of an emission spectrum of the light-emitting device of Example 28 that emits white light in a warm color with a correlated color temperature of 4500 K (duv=0) having a particularly preferable luminous flux and Ra. In the case of this emission spectrum, chromaticity (x, y) is (0.3608, 0.3635); Ra is 96; R1 is 98; R2 and R6 to R8 are 97; R3, R10, and R11 are 91; R4 and R14 are 94; R5, R13, and R15 are 99; and R9 and R12 are 88. It is understood that this can provide a light-emitting device emitting white light having a satisfactory color rendering property with all the special color rendering indexes of R1 to R15 being at least 85. The shape of this light-emitting spectrum represents a ratio in intensity of an emission peak in a wavelength range of 400 to 410 nm by a violet LED and an emission peak in a wavelength range of 440 to 460 nm, 520 to 540 nm, and 610 to 640 nm by a RGB phosphor in Example 28 emitting light based on 5d-4f electron transition of rare earth ions (i.e., 400-410 nm:440-460 nm:520-540 nm:610-640 nm is 8-10:12-14:15-17:16-18). One preferable embodiment of the present invention is a light-emitting device that emits white light in a warm color having an emission spectrum shape in which an emission peak has the above-mentioned ratio. The phosphor emitting light based on 5d-4f electron transition of rare earth ions refers to a phosphor mainly containing rare earth ions such as Eu$^{2+}$ or Ce$^{3+}$ as a luminescent center ion. Such a phosphor has a similar emission spectrum shape irrespective of the kind of a phosphor host in the case where the wavelength of an emission peak is the same.

Figure 58:
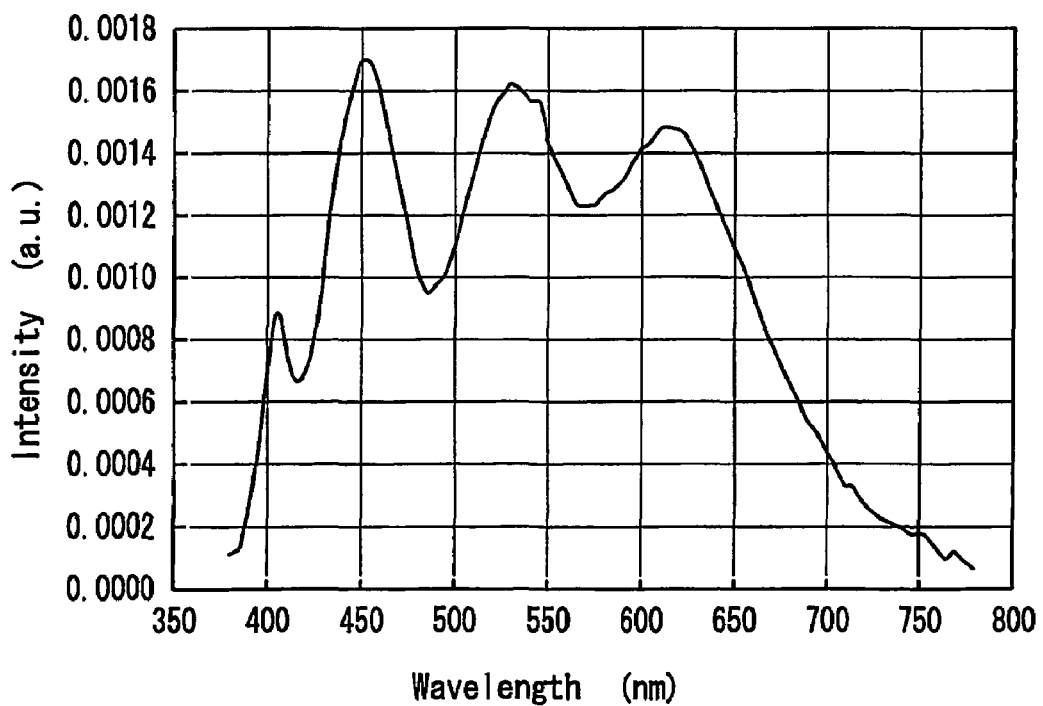
FIG. 58 shows results obtained by simulating an emission spectrum of the light-emitting device emitting white light in a warm color at a correlated color temperature of 5500 K (duv=0) in Example 28 of the present invention.

FIG. 58 shows simulation data of an emission spectrum of the light-emitting device of Example 28 emitting white light with a correlated color temperature of 5500 K (duv=0) having a particularly preferable luminous flux and Ra. In the case of this emission spectrum, chromaticity (x, y) is (0.3324, 0.3410); Ra is 96; R1 and R13 are 98; R2, R8, and R15 are 97; R3 and R12 are 90; R4 is 92; R5 is 99; R6 is 96; R7 is 95; R9 and R14 are 94; and R10 and R1 are 91. More specifically according to the present invention, it also is possible to provide, for example, a light-emitting device that emits white light close to the sunlight suitable for a medical purpose, with all the special color rendering indexes R1 to R15 being at least 90. The shape of this emission spectrum represents a ratio in intensity of an emission peak in a wavelength range of 400 to 410 nm by a violet LED and an emission peak in a wavelength range of 440 to 460 nm, 520 to 540 nm, and 610 to 640 nm by an RGB phosphor of Example 28 emitting light based on 5d-4f electron transition of rare earth ions (i.e., 400-410 nm:440-460 nm:520-540 nm:610-640 nm is 4-6:9-11:8-10:7-9). One preferable embodiment of the present invention is a light-emitting device emitting white light having an emission spectrum shape in which an emission peak has the above-mentioned ratio.

In Example 28, the case has been described where the light-emitting device is composed of a combination of a violet LED and three kinds of red, green, and blue (RGB) phosphors, and $SrAlSiN_3:Eu^{2+}$ is used as a red phosphor. Even in the case where the light-emitting device is configured by combining at least the above-mentioned violet LED with a phosphor represented by a composition formula: $(M_{1-x}Eu_x)AlSiN_3$ such as $SrAlSiN_3:Eu^{2+}$ or $CaAlSiN_3:Eu^{2+}$, and four kinds of red, yellow, green, and blue (RYGB) phosphors or three kinds of red, yellow, and blue (RYB) phosphors are used, the same function and effect are recognized.

Furthermore, in Example 28, the case using a $SrAlSiN_3:Eu^{2+}$ red phosphor has been described. However, the present invention is not limited thereto, as long as a phosphor is represented by a composition formula: $(M_{1-x}Eu_x)AlSiN_3$, where "M" is at least one element selected from the group consisting of Mg, Ca, Sr, Ba, and Zn, and "x" is a numerical value satisfying $0.005 \leq x \leq 0.3$. Furthermore, a green phosphor is not limited to that used in the above example, as long as it is a green phosphor emitting light having an emission peak in a wavelength range of 500 nm to less than 560 nm. A yellow phosphor emitting light having an emission peak in a wavelength range of 560 nm to less than 600 nm may be used in place of the green phosphor. The above-mentioned green or yellow phosphor having preferable emission output is the one activated with $Eu^{2+}$ or $Ce^{3+}$.

The characteristics of the $SrAlSiN_3:Eu^{2+}$ red phosphor are similar to those of the conventional red phosphors, for example, a nitride phosphor or an oxynitride phosphor such as $SrSiN_2:Eu^{2+}$, $Sr_2Si_5N_8:Eu^{2+}$, or $Sr_2Si_4AlON_7:Eu^{2+}$. Therefore, even in the case of using the above-mentioned conventional nitride phosphor or oxynitride phosphor in place of a $SrAlSiN_3:Eu^{2+}$ red phosphor in Example 27 or 28, the same functional effect is recognized.

Hereinafter, for reference, a method for producing $SrAlSiN_3:Eu^{2+}$, $Sr_2Si_5N_8:Eu^{2+}$, $SrSiN_2:Eu^{2+}$, $(Ba, Sr)_2SiO_4:Eu^{2+}$ (emission peak: 555 nm), $(Ba, Sr)_2SiO_4:Eu^{2+}$ (emission peak: 535 nm), $(Ba, Sr)_2SiO_4:Eu^{2+}$ (emission peak: 520 nm), and $(Sr, Ba)_2SiO_4:Eu^{2+}$ (emission peak: 570 nm), among the above-mentioned phosphors, will be described. As the $Y_3Al_5O_{12}:Ce^{3+}$ yellow phosphor, the $La_2O_2S:Eu^{3+}$ red phosphor, and the $BaMgAl_{10}O_{17}:Eu^{2+}$ blue phosphor, those which are available commercially were used.

Tables 11 and 12 show the mass of material compounds used for producing each phosphor.

TABLE 11

| Phosphor | Phosphor ingredient (g) | | | |
|---|---|---|---|---|
| | $Sr_3N_2$ | $Si_3N_4$ | AlN | $Eu_2O_3$ |
| $SrAlSiN_3:Eu^{2+}$ | 10.000 | 4.291 | 4.314 | 0.370 |
| $Sr_2Si_5N_8:Eu^{2+}$ | 10.000 | 12.303 | 0 | 0.370 |
| $SrSiN_2:Eu^{2+}$ | 10.000 | 4.291 | 0 | 0.370 |

TABLE 12

| Phosphor | Phosphor ingredient (g) | | | |
|---|---|---|---|---|
| | $BaCO_3$ | $SrCO_3$ | $SiO_2$ | $Eu_2O_3$ |
| $(Ba,Sr)_2SiO_4:Eu^{2+}$ (Peak: 520 nm) | 386.457 | 183.348 | 100.000 | 11.480 |
| $(Ba,Sr)_2SiO_4:Eu^{2+}$ (Peak: 535 nm) | 257.638 | 279.847 | 100.000 | 11.480 |
| $(Ba,Sr)_2SiO_4:Eu^{2+}$ (Peak: 555 nm) | 128.819 | 376.345 | 100.000 | 11.480 |
| $(Sr,Ba)_2SiO_4:Eu^{2+}$ (Peak: 570 nm) | 32.205 | 448.719 | 100.000 | 11.480 |

A method for producing three kinds of red phosphors shown in Table 11 will be described. First, predetermined compounds shown in Table 11 were mixed in a dry nitrogen atmosphere with a glove box, a mortar, etc. to obtain mixed powder. At this time, an accelerant (flux) was not used. Next, the mixed powder was placed in an alumina crucible. The mixed powder was fired provisionally in a nitrogen atmosphere at 800° C. to 1400° C. for 2 to 4 hours, and fired in an atmosphere of 97% nitrogen and 3% hydrogen at 1600° C. to 1800° C. for 2 hours to synthesize a red phosphor. After the firing, the body color of the phosphor powder was orange. After the firing, predetermined aftertreatments such as pulverizing, classification, washing, and drying were performed to obtain a red phosphor.

Next, a method for producing four kinds of green phosphors and yellow phosphors shown in Table 12 will be described. First, predetermined compounds shown in Table 12 were mixed in the atmosphere with a mortar to obtain mixed powder. Then, the mixed powder was placed in an alumina crucible. The mixed powder was fired provisionally in the atmosphere at 950° C. to 1000° C. for 2 to 4 hours to obtain provisionally fired powder. As a flux, 3.620 g of calcium chloride ($CaCl_2$) powder was added to the provisionally fired powder and mixed therewith. Thereafter, the resultant powder was fired in an atmosphere of 97% nitrogen and 3% hydrogen at 1200° C. to 1300° C. for 4 hours, whereby a green phosphor and a yellow phosphor were synthesized. The body color of the phosphor powder after the firing was green to yellow. After the firing, predetermined aftertreatments such as pulverizing, classification, washing, and drying were performed to obtain a green phosphor and a yellow phosphor.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The phosphor composition of the present invention contains a composition represented by a composition formula: $aM_3N_2 \cdot bAlN \cdot cSi_3N_4$ as a main component of a phosphor host. In the composition formula, "M" is at least one element selected from the group consisting of Mg, Ca, Sr, Ba, and Zn, and "a", "b", and "c" are numerical values respectively satisfying $0.2 \leq a/(a+b) \leq 0.95$, $0.05 \leq b/(b+c) \leq 0.8$, and $0.4 \leq c/(c+a) \leq 0.95$. In particular, the phosphor composition of the present invention contains a composition represented by a composition formula: $MAlSiN_3$ as a main component of a phosphor host. Therefore, a novel phosphor can be provided, which is capable of being excited with ultraviolet light—near-ultraviolet light—violet light—blue light—green light—yellow light—orange light, in particular, red light in a warm color.

Furthermore, according to a method for producing a phosphor composition of the present invention, a material containing a compound capable of generating an oxide of the above-mentioned element "M" by heating, a silicon compound, an aluminum compound, a compound containing an element forming a luminescent center ion, and carbon is allowed to react in a nitriding gas atmosphere. Therefore, the phosphor composition of the present invention can be produced using an inexpensive material that is easy to handle without using a nitride of alkaline-earth metal or alkaline-earth metal that is unstable chemically, difficult to handle in the atmosphere, and expensive. Thus, a novel nitride phosphor composition having satisfactory material performance can be industrially produced at a low cost.

Furthermore, the light-emitting device of the present invention is configured using, as a light-emitting source, the above-mentioned novel, high-performance, and inexpensive phosphor composition of the present invention that emits light in a warm color, in particular, red light. Therefore, a light-emitting device (LED light source, etc.) can be provided, which has a high red light-emitting component intensity and high performance, and is inexpensive and novel in terms of the material configuration.

Furthermore, according to the present invention, a light-emitting device emitting white light can be provided, which satisfies both a high color rendering property and a high luminous flux. In particular, a light-emitting device such as an LED light source can be provided, which emits white light in a warm color and has a high emission intensity of a red light-emitting component.

The invention claimed is:

1. A phosphor composition comprising a phosphor host having as a main component a composition represented by a composition formula:

$MAlSiN_3$, wherein M in the composition formula is Sr or Sr in combination with at least one element selected from the group consisting of Mg, Ca, Ba, and Zn, a main component of the combination is Sr, the phosphor composition is obtained by replacing a part of the M by $Eu^{2+}$, and a replacement amount is 0.1 atomic % to 30 atomic % with respect to the M, and the phosphor composition has an emission peak in a wavelength range of between 610 nm and 650 nm, and an internal quantum efficiency of the phosphor composition under excited light in a wavelength range of 440 nm to less than 500 nm is at least 70%.

2. The phosphor composition according to claim 1, wherein at least 80 atomic % of the M is Sr.

3. The phosphor composition according to claim 1, wherein the internal quantum efficiency is 90 to 100%.

4. The phosphor composition according to claim 1, wherein an excitation spectrum of the phosphor composition has an excitation peak in a wavelength range shorter than a wavelength of a blue range of 440 nm to less than 500 nm.

5. A light-emitting device configured using, as a light-emitting source, the phosphor composition of claim 1.

6. The light-emitting device according to claim 5, which is selected from the group consisting of a fluorescent lamp, a plasma display panel, an inorganic electroluminescence panel, a field emission display, an electron tube, and a white LED light source.

7. The light-emitting device according to claim 5, using the phosphor composition and a radiation source emitting primary light of 360 nm to less than 560 nm as an emission source, wherein the phosphor composition absorbs the primary light emitted by the radiation source to emit secondary light having a wavelength longer than that of the primary light.

8. The light-emitting device according to claim 7, wherein the radiation source is a photoelectric transducer emitting light having an emission peak in a wavelength range of 440 nm to less than 500 nm.

9. The light-emitting device according to claim 7, wherein the radiation source is an injection type electroluminescence element.

10. The light-emitting device according to claim 7 comprising a white light-emitting element.

* * * * *